(12) United States Patent
Chen et al.

(10) Patent No.: US 12,046,521 B2
(45) Date of Patent: Jul. 23, 2024

(54) IN SITU ELECTRICAL PROPERTIES CHARACTERIZATION SYSTEM TOWARDS SURFACE/INTERFACE ENGINEERED FUNCTIONAL DEVICES

(71) Applicant: National University of Singapore, Singapore (SG)

(72) Inventors: Wei Chen, Singapore (SG); Cheng Han, Singapore (SG)

(73) Assignee: NATIONAL UNIVERSITY OF SINGAPORE, Singapore (SG)

(*) Notice: Subject to any disclaimer, the term of this patent is extended or adjusted under 35 U.S.C. 154(b) by 933 days.

(21) Appl. No.: 16/975,012

(22) PCT Filed: Feb. 26, 2019

(86) PCT No.: PCT/SG2019/050106
§ 371 (c)(1),
(2) Date: Aug. 21, 2020

(87) PCT Pub. No.: WO2019/164454
PCT Pub. Date: Aug. 29, 2019

(65) Prior Publication Data
US 2020/0402865 A1    Dec. 24, 2020

(30) Foreign Application Priority Data
Feb. 26, 2018    (SG) .......................... 10201801527Y

(51) Int. Cl.
*H01L 21/66* (2006.01)
*C23C 14/24* (2006.01)
(Continued)

(52) U.S. Cl.
CPC ............ *H01L 22/14* (2013.01); *C23C 14/243* (2013.01); *C23C 14/52* (2013.01);
(Continued)

(58) Field of Classification Search
CPC ....... H01L 22/14; C23C 14/54; C23C 14/243; C23C 14/52
See application file for complete search history.

(56) References Cited

U.S. PATENT DOCUMENTS 6,278,809 B1    8/2001  Johnson et al.
8,377,518 B2    2/2013  Doolittle et al.
(Continued)

FOREIGN PATENT DOCUMENTS

CN    101846635 A    9/2010
CN    102495237 A    6/2012
(Continued)

OTHER PUBLICATIONS

Abellán G, et al. Noncovalent Functionalization of Black Phosphorus. Angewandte Chemie 128, 14777-14782 (2016).
(Continued)

*Primary Examiner* — Aiden Lee
(74) *Attorney, Agent, or Firm* — Volpe Koenig

(57) ABSTRACT

A system and method for in-situ characterization of functional devices. The system comprises a vacuum chamber; a pump system coupled to the vacuum chamber for evacuation the vacuum chamber to near ultra high vacuum pressures of about $10^{-8}$ mbar or lower; a sample holder for a functional device based on nanostructured materials disposed inside the vacuum chamber and configured to provide electrical connection to the functional device for measuring electrical properties of the functional device; and a source system for exposing a surface/interface of the functional device to a modification species; whereby the system is configured to measure the electrical properties of the functional device in-situ upon the exposure to the modification species.

8 Claims, 20 Drawing Sheets

(51) Int. Cl.
 C23C 14/52 (2006.01)
 H01L 29/06 (2006.01)
 H01L 29/66 (2006.01)
 G02B 21/00 (2006.01)
(52) U.S. Cl.
 CPC .... *H01L 29/0665* (2013.01); *H01L 29/66136* (2013.01); *G02B 21/0016* (2013.01)

(56) References Cited

U.S. PATENT DOCUMENTS

| 2005/0061364 | A1 | 3/2005 | Peumans et al. | |
|---|---|---|---|---|
| 2008/0047487 | A1 | 2/2008 | Doolittle et al. | |
| 2016/0275984 | A1* | 9/2016 | Arisaka | G11B 33/08 |
| 2018/0179666 | A1 | 6/2018 | Kang et al. | |

FOREIGN PATENT DOCUMENTS

| CN | 102983064 A | | 3/2013 | |
|---|---|---|---|---|
| CN | 106637416 A | * | 5/2017 | C30B 23/002 |

OTHER PUBLICATIONS

Allain, A.; Kang, J.; Banerjee, K.; Kis, A. Electrical contacts to two-dimensional semiconductors. Nat. Mater. 2015, 14, 1195-1205.
Allain, A.; Kis, A. Electron and hole mobilities in single-layer WSe2. ACS nano 2014, 8, 7180-7185.
Artacho et al., Linear-Scaling ab-initio Calculations for Large and Complex Systems, Phys. Stat. Sol, (b) 215, 809-817 (1999).
Baugher, B. W.; Churchill, H. O.; Yang, Y.; Jarillo-Herrero, P. Optoelectronic devices based on electrically tunable p-n diodes in a monolayer dichalcogenide. Nat. Nanotechnol. 2014, 9, 262-267.
Brown A, Rundqvist S. Refinement of the crystal structure of black phosphorus. Acta Crystallographica 19, 684-685 (1965).
Brunner et al., X-ray photoelectron study of amorphous phosphorus prepared by plasma chemical transport. Comparison with crystalline polymorphs, J. Phys. Chem. Solids, 1979, 40, 967.
Buscema M, Groenendijk DJ, Steele GA, van der Zant HSJ, Castellanos-Gomez A. Photovoltaic effect in few-layer black phosphorus PN junctions defined by local electrostatic gating. Nature Communications 5, 4651 (2014).
Castro Neto AH, Guinea F, Peres NMR, Novoselov KS, Geim AK. The electronic properties of graphene. Reviews of Modern Physics 81, 109-162 (2009).
Chen et al., "Surface transfer hole doping of epitaxial graphene using MoO3 thin film," Applied Physics Letters 96, 213104 (2010).
Chen JH, Jang C, Adam S, Fuhrer MS, Williams ED, Ishigami M. Charged-impurity scattering in graphene. Nat Phys 4, 377-381 (2008).
Chen W, Chen S, Qi DC, Gao XY, Wee ATS. Surface Transfer p-Type Doping of Epitaxial Graphene. Journal of the American Chemical Society 129, 10418-10422 (2007).
Chen, C.-H.; Wu, C.-L.; Pu, J.; Chiu, M.-H.; Kumar, P.; Takenobu, T.; Li, L.-J. Hole mobility enhancement and p-doping in monolayer WSe2 by gold decoration. 2D Mater. 2014, 1, 034001.
Cheng H, et al. Oxygen induced strong mobility modulation in few-layer black phosphorus. 2D Materials 4, 021007 (2017).
Chu T, Ilatikhameneh H, Klimeck G, Rahman R, Chen Z. Electrically Tunable Bandgaps in Bilayer MoS2. Nano Letters 15, 8000-8007 (2015).
Das S, Demarteau M, Roelofs A. Ambipolar Phosphorene Field Effect Transistor. ACS Nano 8, 11730-11738 (2014).
Doganov et al., Transport properties of pristine few-layer black phosphorus by van der Waals passivation in an inert atmosphere, Nat. Commun., 2015, 6, 6647.
Du Y, Liu H, Deng Y, Ye PD., "Device Perspective for Black Phosphorus Field-Effect Transistors: Contact Resistance, Ambipolar Behavior, and Scaling," ACS Nano 8, 10035-10042 (2014).
Du, "Surface engineered one dimensional and two dimensional nanomaterials for electronic and optoelectronic devices," ScholarBank@NUS Repository, Aug. 2015.

Du, X. Lin, Z. Xu and D. Chu, Recent developments in black phosphorus transistors, J. Mater. Chem. C, 2015, 3, 8760.
Fang H, et al. Degenerate n-Doping of Few-Layer Transition Metal Dichalcogenides by Potassium. Nano Letters 13, 1991-1995 (2013).
Fang, H.; Chuang, S.; Chang, T. C.; Takei, K.; Takahashi, T.; Javey, A. High-performance single layered WSe2 p-FETs with chemically doped contacts. Nano Lett. 2012, 12, 3788-3792.
Favron et al., Photooxidation and quantum confinement effects in exfoliated black phosphorus, Nat. Mater., 2015, 14, 826.
Geim AK, Novoselov KS. The rise of graphene. Nat Mater 6, 183-191 (2007).
Giannozzi et al., Oxygen adsorption on graphite and nanotubes, J. Chem. Phys., 2003, 118, 1003.
Goodman, L. Ley and D. W. Bullett, Valence-band structures of phosphorus allotropes, Phys. Rev. B, 1983, 27, 7440.
Han, C.; Lin, J.; Xiang, D.; Wang, C.; Wang, L.; Chen, W. Improving chemical vapor deposition graphene conductivity using molybdenum trioxide: An in-situ field effect transistor study. Appl. Phys. Lett. 2013, 103, 263117.
Harada, K. Murano, I. Shirotani, T. Takahashi and Y. Maruyama, Electronic structure of black phosphorus studied by X-ray photoelectron spectroscopy, Solid State Commun., 1982, 44, 877.
Huang M, et al. Broadband Black-Phosphorus Photodetectors with High Responsivity. Advanced Materials 28, 3481-3485 (2016).
Huang, J.; Xu, Z.; Yang, Y. Low work function surface formed by solution processed and thermally deposited nanoscale layers of cesium carbonate. Adv. Funct. Mater. 2007, 17, 1966-1973.
Huang, J.-K.; Pu, J.; Hsu, C.-L.; Chiu, M.-H.; Juang, Z.-Y.; Chang, Y.-H.; Chang, W.-H.; Iwasa, Y.; Takenobu, T.; Li, L.-J. Large-area synthesis of highly crystalline WSe2 monolayers and device applications. ACS nano 2013, 8, 923-930.
Hultgren, N. S. Gingrich and B. E. Warren, The Atomic Distribution in Red and Black Phosphorus and the Crystal Structure of Black Phosphorus, J. Chem. Phys., 1935, 3, 351.
Hussain et al., "High-precision tabletop microplotter for flexible on-demand material deposition in printed electronics and device functionalization," Review of Scientific Instruments 92, 125104 (2021).
International Preliminary Report on Patentability for Application No. PCT/SG2019/050106 dated Sep. 3, 2020 (8 pages).
International Search Report and Written Opinion for Application No. PCT/SG2019/050106 dated May 15, 2019 (9 pages).
Island et al., Environmental instability of few-layer black phosphorus. 2D Materials 2, 011002 (2015).
Jo et al., A high-performance WSe2 /h-BN photodetector using a triphenylphosphine (PPh3)-based n-doping technique. Adv. Mater. 2016, 28, 4824-4831.
Kang et al., High-performance transition metal dichalcogenide photodetectors enhanced by self-assembled monolayer doping. Adv. Funct. Mater. 2015, 25, 4219-4227.
Kang, D.-H.; Shim, J.; Jang, S. K.; Jeon, J.; Jeon, M. H.; Yeom, G. Y.; Jung, W.-S.; Jang, Y. H.; Lee, S.; Park, J.-H. Controllable nondegenerate p-type doping of tungsten diselenide by octadecyltrichlorosilane. ACS nano 2015, 9, 1099-1107.
Kim J, et al. Observation of tunable band gap and anisotropic Dirac semimetal state in black phosphorus. Science 349, 723 (2015).
Kim et al., High-mobility and low-power thin-film transistors based on multilayer MoS2 crystals. Nat. Commun. 2012, 3, 1011.
Kleinman et al., Efficacious Form for Model Pseudopotentials, Phys. Rev. Lett., 1982, 48, 1425-1428.
Koenig et al., Electric field effect in ultrathin black phosphorus, Appl. Phys. Lett., 2014, 104, 103106.
Koenig SP, et al. Electron Doping of Ultrathin Black Phosphorus with Cu Adatoms. Nano Letters 16, 2145-2151 (2016).
Laskar et al., "p-type doping of MoS2 thin films using Nb," Applied Physics Letters 104, 092104 (2014).
Li et al., Quantum oscillations in a two-dimensional electron gas in black phosphorus thin films, Nat. Nanotechnol., 2015, 10, 608.
Li et al. Black phosphorus field-effect transistors. Nat Nano 9, 372-377 (2014).
Li L, et al. Direct observation of the layer-dependent electronic structure in phosphorene. Nat Nano 12, 21-25 (2017).

(56) References Cited

OTHER PUBLICATIONS

Li L, et al. Quantum Hall effect in black phosphorus two-dimensional electron system. Nat Nano 11, 593-597 (2016).
Li, G.; Chu, C.; Shrotriya, V.; Huang, J.; Yang, Y. Efficient inverted polymer solar cells. Appl. Phys. Lett. 2006, 88, 253503-253503.
Li, H.; Lu, G.; Wang, Y.; Yin, Z.; Cong, C.; He, Q.; Wang, L.; Ding, F.; Yu, T.; Zhang, H. Mechanical exfoliation and characterization of single- and few-layer nanosheets of WSe2, TaS2, and TaSe2. Small 2013, 9, 1974-1981.
Li, S.; Wang, S.; Tang, D.-M.; Zhao, W.; Xu, H.; Chu, L.; Bando, Y.; Golberg, D.; Eda, G. Halide-assisted atmospheric pressure growth of large WSe2 and WS2 monolayer crystals. Appl. Mater. Today 2015, 1, 60-66.
Lin, "Investigation of electronic and optical properties of molybdenum disulfide modulated by surface functionalization," ScholarBank@NUS Repository, Aug. 2014.
Lin, J. D.; Han, C.; Wang, F.; Wang, R.; Xiang, D.; Qin, S. ;Zhang, X.-A.; Wang, L.; Zhang, H.; Wee, A. T. S. Electron-doping-enhanced trion formation in monolayer molybdenum disulfide functionalized with cesium carbonate. ACS nano 2014, 8, 5323-5329.
Ling X, Wang H, Huang S, Xia F, Dresselhaus MS. The renaissance of black phosphorus. Proceedings of the National Academy of Sciences 112, 4523-4530 (2015).
Liu et al., Phosphorene: An Unexplored 2D Semiconductor with a High Hole Mobility, ACS Nano, 2014, 8, 4033.
Liu H, Du Y, Deng Y, Ye PD. Semiconducting black phosphorus: synthesis, transport properties and electronic applications. Chemical Society Reviews 44, 2732-2743 (2015).
Liu Y, Cai Y, Zhang G, Zhang Y-W, Ang K-W. Al-Doped Black Phosphorus p-n Homojunction Diode for High Performance Photovoltaic. Advanced Functional Materials, 1604638-n/a (2017).
Liu, H.; Han, N.; Zhao, J. Atomistic insight into the oxidation of monolayer transition metal dichalcogenides: from structures to electronic properties. RSC Advances 2015, 5, 17572-17581.
Liu, W.; Kang, J.; Sarkar, D.; Khatami, Y.; Jena, D.; Banerjee, K. Role of metal contacts in designing high-performance monolayer n-type WSe2 field effect transistors. Nano lett. 2013, 13, 1983-1990.
Massicotte, M.; Schmidt, P.; Vialla, F.; Schadler, K. G.; Reserbat-Plantey, A.; Watanabe, K.; Taniguchi, T.; Tielrooij, K. J.; Koppens, F. H. Picosecond photoresponse in van der Waals heterostructures. Nat. Nanotechnol. 2016, 11, 42-46.
Mayorov AS, et al. Micrometer-Scale Ballistic Transport in Encapsulated Graphene at Room Temperature. Nano Letters 11, 2396-2399 (2011).
Monkhorst et al., Special points for Brillouin-zone integrations, Phys. Rev. B, 1976, 13, 5188-5192.
Nishitani et al., An XPS Analysis of Thermally Grown Oxide Film on GaP, Jpn. J. Appl. Phys., 1978, 17, 321.
Novoselov KS, et al. Electric Field Effect in Atomically Thin Carbon Films. Science 306, 666-669 (2004).
Passlack et al., "Low D/sub it/, thermodynamically stable Ga/sub 2/O/sub 3/-GaAs interfaces: fabrication, characterization, and modeling," IEEE Transactions on Electron Devices, vol. 44, No. 2, pp. 214-225, Feb. 1997.
Perdew et al., Generalized Gradient Approximation Made Simple, Phys. Rev. Lett., 1996, 77, 3865-3868.
Perello DJ, Chae SH, Song S, Lee YH. High-performance n-type black phosphorus transistors with type control via thickness and contact-metal engineering. Nature Communications 6, 7809 (2015).
Radisavljevic, B.; Radenovic, A.; Brivio, J.; Giacometti, i. V.; Kis, A. Single-layer MoS2 transistors. Nat. Nanotechnol. 2011, 6, 147-150.
Ross JS, et al. Electrically tunable excitonic light-emitting diodes based on monolayer WSe2 p-n junctions. Nat Nano 9, 268-272 (2014).
Ryder CR, et al. Covalent functionalization and passivation of exfoliated black phosphorus via aryl diazonium chemistry. Nat Chem 8, 597-602 (2016).

Sánchez-Portal et al., Density-Functional Method for Very Large Systems with LCAO Basis Sets, Int. J. Quantum Chem., 1997, 65, 453-461.
Sankey et al., Ab initio multicenter tight-binding model for molecular-dynamics simulations and other applications in covalent systems, Phys. Rev. B, 1989, 40, 3979-3995.
Sankey et al., Molecular-dynamics determination of electronic and vibrational spectra, and equilibrium structures of small Si clusters, Phys. Rev. B, 1990, 41, 12, 750-759.
Song, X.; Hu, J.; Zeng, H. Two-dimensional semiconductors: recent progress and future perspectives. J. Mater. Chem. C 2013, 1, 2952.
Sugai and I. Shirotani, Raman and infrared reflection spectroscopy in black phosphorus, Solid State Commun., 1985, 53, 753.
Suh J, et al. Doping against the Native Propensity of MoS2: Degenerate Hole Doping by Cation Substitution. Nano Letters 14, 6976-6982 (2014).
Tian, H.; Chin, M. L.; Najmaei, S.; Guo, Q.; Xia, F.; Wang, H.; Dubey, M. Optoelectronic devices based on two-dimensional transition metal dichalcogenides. Nano Res. 2016, 9, 1543-1560.
Tosun, M.; Chan, L.; Amani, M.; Roy, T.; Ahn, G. H.; Taheri, P.; Carraro, C.; Ager, J. W.; Maboudian, R.; Javey, A. Air-stable n-doping of WSe2 by anion vacancy formation with mild plasma treatment. ACS Nano 2016, 10, 6853-6860.
Tran V, Soklaski R, Liang Y, Yang L. Layer-controlled band gap and anisotropic excitons in few-layer black phosphorus. Physical Review B 89, 235319 (2014).
Troullier et al., Efficient pseudopotentials for plane-wave calculations, Phys. Rev. B, 1991, 43, 1993-2006.
Utt et al., "Intrinsic Defects, Fluctuations of the Local Shape, and the Photo-Oxidation of Black Phosphorus," ACS Cent. Sci., 2015, 1, 320.
Vaynzof, Y.; Kabra, D.; Chua, L. L.; Friend, R. H. Improved electron injection in poly (9,9'-dioctylfluorene)-co-benzothiodiazole via cesium carbonate by means of coannealing. Appl. Phys. Lett. 2011, 98, 3306.
Wang G, et al. Introduction of Interfacial Charges to Black Phosphorus for a Family of Planar Devices. Nano Letters 16, 6870-6878 (2016).
Wang QH, Kalantar-Zadeh K, Kis A, Coleman JN, Strano MS. Electronics and optoelectronics of two-dimensional transition metal dichalcogenides. Nat Nano 7, 699-712 (2012).
Wang X, et al. Highly anisotropic and robust excitons in monolayer black phosphorus. Nat Nano 10, 517-521 (2015).
Wang, S.; Zhao, W.; Giustiniano, F.; Eda, G., Effect of oxygen and ozone on p-type doping of ultra-thin WSe2 and MoSe2 field effect transistors. Phys. Chem. Chem. Phys. 2016, 18 (6), 4304-4309.
Williams JR, DiCarlo L, Marcus CM. Quantum Hall Effect in a Gate-Controlled p-n Junction of Graphene. Science 317, 638 (2007).
Wood JD, et al. Effective Passivation of Exfoliated Black Phosphorus Transistors against Ambient Degradation. Nano Letters 14, 6964-6970 (2014).
Wu J, et al. Colossal Ultraviolet Photoresponsivity of Few-Layer Black Phosphorus. ACS Nano 9, 8070-8077 (2015).
Wu, C.-I.; Lin, C.-T.; Chen, Y.-H.; Chen, M.-H.; Lu, Y.-J.; Wu, C.-C. Electronic structures and electron-injection mechanisms of cesium-carbonate-incorporated cathode structures for organic light-emitting devices. Appl. Phys. Lett. 2006, 88, 2104.
Xia F, Wang H, Jia Y. Rediscovering black phosphorus as an anisotropic layered material for optoelectronics and electronics. Nature Communications 5, 4458 (2014).
Xia, F.; Wang, H.; Xiao, D.; Dubey, M.; Ramasubramaniam, A. Two-dimensional material nanophotonics. Nat. Photonics 2014, 8, 899-907.
Xiang D, et al. Surface transfer doping induced effective modulation on ambipolar characteristics of few-layer black phosphorus. Nature Communications 6, 6485 (2015).
Xu, Y.; Cheng, C.; Du, S.; Yang, J.; Yu, B.; Luo, J.; Yin, W.; Li, E.; Dong, S.; Ye, P.; Duan, X. Contacts between two- and three-dimensional materials: ohmic, schottky, and p-n heterojunctions. ACS Nano 2016, 10, 4895-4919.
Yuan H, et al. Polarization-sensitive broadband photodetector using a black phosphorus vertical p-n junction. Nat Nano 10, 707-713 (2015).

(56) References Cited

OTHER PUBLICATIONS

Zhang CD, et al. Surface Structures of Black Phosphorus Investigated with Scanning Tunneling Microscopy. The Journal of Physical Chemistry C 113, 18823-18826 (2009).
Zhang S, et al. Extraordinary Photoluminescence and Strong Temperature/Angle-Dependent Raman Responses in Few-Layer Phosphorene. ACS Nano 8, 9590-9596 (2014).
Zhang, W.; Chiu, M. H. ;Chen, C. H.; Chen, W.; Li, L. J.; Wee, A. T., Role of Metal Contacts in High-Performance Phototransistors Based on WSe2 Monolayers, ACS Nano 2014, 8, 8653-8661.
Zhang, X.; Qiao, X. F.; Shi, W.; Wu, J. B.; Jiang, D. S.; Tan, P. H. Phonon and Raman scattering of two-dimensional transition metal dichalcogenides from monolayer, multilayer to bulk material. Chem. Soc. Rev. 2015, 44, 2757-2785.
Zhao, W.; Ghorannevis, Z.; Chu, L.; Toh, M.; Kloc, C.; Tan, P.-H.; Eda, G. Evolution of electronic structure in atomically thin sheets of WS2 and WSe2. ACS nano 2012, 7, 791-797.
Zhou, C.; Zhao, Y.; Raju, S.; Wang, Y.; Lin, Z.; Chan, M.; Chai, Y. Carrier type control of WSe2 field effect transistors by thickness modulation and MoO3 layer doping. Adv. Funct. Mater. 2016.
Ziletti, A. Carvalho, D. K. Campbell, D. F. Coker and A. H. Castro Neto, Oxygen Defects in Phosphorene, Phys. Rev. Lett., 2015, 114, 046801.

\* cited by examiner

IN SITU ELECTRICAL PROPERTIES CHARACTERIZATION SYSTEM TOWARDS SURFACE/INTERFACE ENGINEERED FUNCTIONAL DEVICES

CROSS REFERENCE TO RELATED APPLICATIONS

This application is a national stage filing under 35 U.S.C. § 371 of International Patent Application No.: PCT/SG2019/050106, filed Feb. 26, 2019, which claims priority to Singapore Patent Application No. 10201801527Y, filed Feb. 26, 2018, the entire contents of which are hereby incorporated by reference herein.

FIELD OF INVENTION

The present invention relates broadly to in situ characterization system towards surface/interface engineered functional devices.

BACKGROUND

Any mention and/or discussion of prior art throughout the specification should not be considered, in any way, as an admission that this prior art is well known or forms part of common general knowledge in the field.

A large variety of fast-emerging nanomaterials (e.g. two-dimensional (2D) materials) as well as organic semiconducting thin films have attracted tremendous research and industrial interests, attributed to their unique fundamental properties and versatile device applications. These materials can be configured as electrically measurable devices to evaluate their electronic and optoelectronic characteristics. Owing to the large surface-to-volume ratio, surface and interface generally plays a predominant role in determining the overall properties of nanomaterials and organic thin films. As a result, surface and interface engineering layers have been deposited onto the surface or interface in order to effectively and reliably modulate their intrinsic properties. However, such surface/interface functionalization scheme generally exhibits significant sensitivity to the air exposure. One existing technique for the analysis of the surface/interface functionalization schemes involves the fabrication and functionalization and packaging in a controlled environment, followed by analysis of the packed device using separate analysis systems. Owing to the requirement of packaging of the devices, e.g. several packed devices with different surface/interface functionalization to analyze a trend, such existing techniques are time and cost intensive.

For the practical applications of novel nanomaterials and organic thin film materials, one of the major challenges is to effectively and reliably manipulate their electronic and optoelectronic properties. For example, the carrier type and concentration of semiconducting materials are required to be efficiently controlled to obtain either n- or p-type materials for the construction of PN junctions in logic electronic circuit, light emitting diodes, and light harvesting devices. Recently, a large amount of organic and inorganic species have been deposited onto the surface of these materials and demonstrated to effectively and non-destructively modulate their basic properties and device performance.

On the other hand, detailed optoelectronic characterizations on surface/interface modified devices require high quality incident light beam with focused spot size and sufficiently high power intensity, which is typically be achieved by the fine focusing of laser beam using optical microscopic set up and used on samples outside the controlled environment of device fabrication systems.

Current characterization products from in the market can only partially address the challenges Embodiments of the present invention seek to address at least one of the above problems.

SUMMARY

In accordance with a first aspect of the present invention, there is provided a system for in-situ characterization of functional devices comprising:
  a vacuum chamber;
  a pump system coupled to the vacuum chamber for evacuation the vacuum chamber to near ultra high vacuum pressures of about $10^{-8}$ mbar or lower;
  a sample holder for a functional device based on nano-structured materials disposed inside the vacuum chamber and configured to provide electrical connection to the functional device for measuring electrical properties of the functional device; and
  a source system for exposing a surface/interface of the functional device to a modification species;
  whereby the system is configured to measure the electrical properties of the functional device in-situ upon the exposure to the modification species.

In accordance with a second aspect of the present invention, there is provided a method of in-situ characterization of functional devices comprising the steps of:
  providing a vacuum chamber;
  evacuating the vacuum chamber to near ultra high vacuum pressures of about $10^{-8}$ mbar or lower;
  providing, inside the vacuum chamber, electrical connection to the functional device for measuring electrical properties of the functional device;
  exposing a surface/interface of the functional device to a modification species; and
  measuring the electrical properties of the functional device in-situ upon the exposure to the modification species.

BRIEF DESCRIPTION OF THE DRAWINGS

Embodiments of the invention will be better understood and readily apparent to one of ordinary skill in the art from the following written description, by way of example only, and in conjunction with the drawings, in which:

FIG. 3(a) shows an AFM image of an as-fabricated BP device and the line profile at the edge of the BP flake indicates a multilayer BP crystal of ~4.8 nm (~8 layers).

FIG. 3(b) shows a schematic illustration of the BP device coated by $Cs_2CO_3$.

FIG. 3(c) shows the forward transfer characteristics ($V_g$ from −80 V to 80 V) evolution of a BP FET measured at $V_{sd}$=100 mV in logarithmic scale with increasing $Cs_2CO_3$ thickness from 0 to 1.5 nm, according to an example embodiment.

FIG. 3(d) shows the electron concentration (ne) at $V_g$=30 V and mobility of BP versus $Cs_2CO_3$ thickness, according to an example embodiment.

FIG. 3(e) shows the forward transfer characteristics ($V_g$ from −80 V to 80 V) evolution of a separate BP FET measured at $V_{sd}$=100 mV with respect to the $MoO_3$ thickness from 0 to 0.8 nm, according to an example embodiment.

FIG. 3(f) shows the hole concentration ($n_h$) at $V_g$=−30 V and mobility of BP versus $MoO_3$ thickness, according to an example embodiment.

DETAILED DESCRIPTION

Embodiments of the present invention provide a vacuum system design for the in situ optoelectronic characterizations of nanomaterials or organic thin films based devices. Example embodiments are featured by low noise electrical measurements in near ultra-high vacuum conditions, in situ thermal evaporation of various materials for molecular beam epitaxy (MBE) growth, fine focused light beam illumination etc. A prototype system according to an example embodiment has been established and is described herein, by way of example only, to characterize surface/interface engineered novel functional devices, thereby demonstrating the great feasibility and flexibility of the system design according to example embodiments of the present invention for commercialization towards novel materials based functional electronic and optoelectronic applications.

The features and functions of a system according to example embodiments include the low noise electrical measurements in near ultra-high vacuum (UHV) conditions, in situ thermal evaporation of various materials, fine focusing of light beams for illumination, flexible sample loading and gas introduction etc.

Equipment design and system according to an example embodiment

Figure 1:
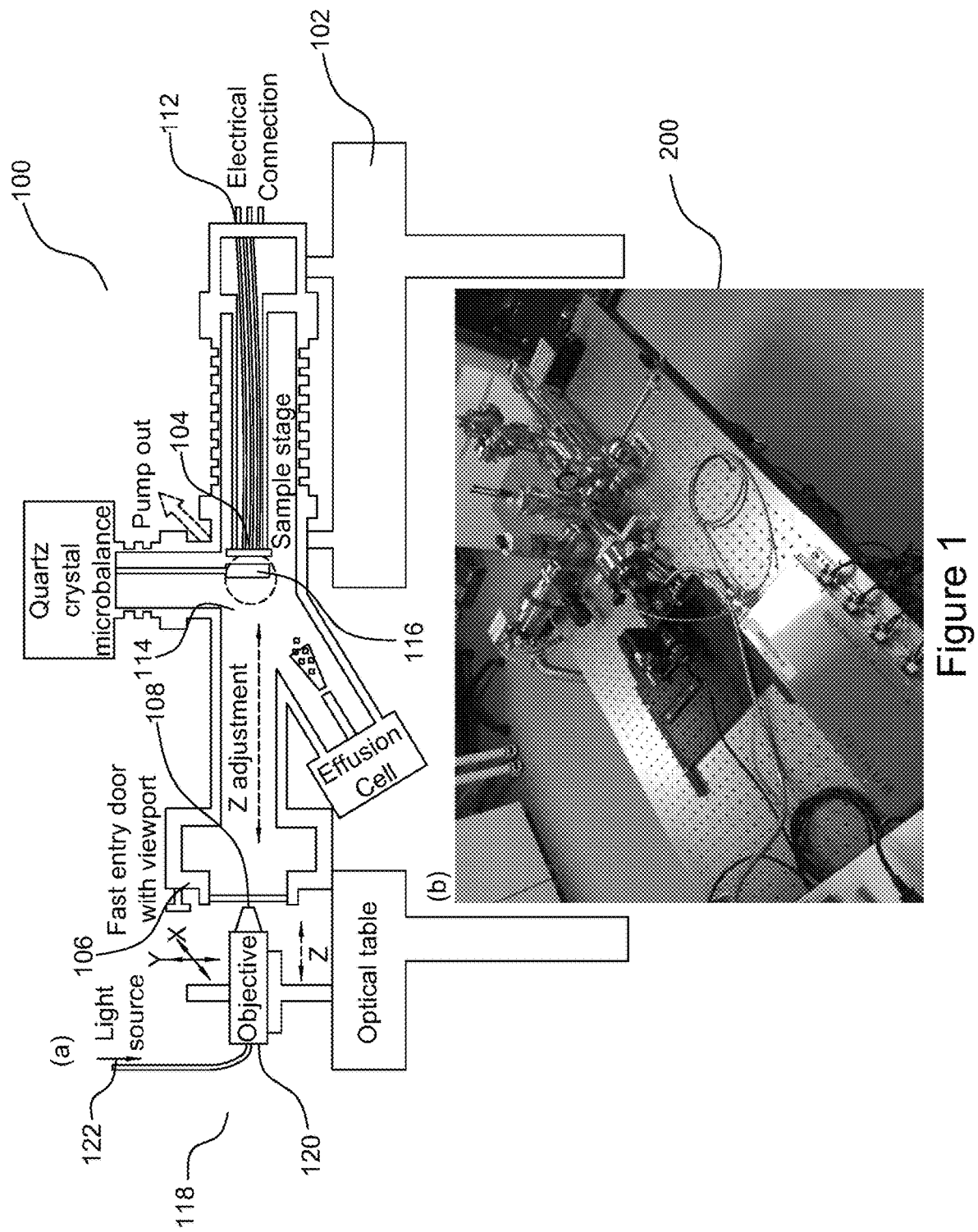
FIG. 1(a) shows a schematic illustration of an in situ vacuum optoelectronic characterization system according to an example embodiment.
FIG. 1(b) shows a photograph of a proto type of an in situ vacuum optoelectronic characterization system according to an example embodiment.

FIG. 1a schematically illustrates the design of the in situ vacuum optoelectronic characterization system 100 according to an example embodiment. The whole system 100 is mounted on a standard optical table 102 to minimize the vibration of each part of the system 100. The sample (not shown) can be easily loaded into the sample stage 104 through the horizontally oriented fast entry door 106 with viewport 108. The sample stage 104 is configured in this example embodiment as a leadless chip carrier (LCC) socket that is electrically connected with Bayonet Neill-Concelman (BNC) feedthrough flange 112 for outside connection to source meters (not shown). Upon the close of fast entry door 106, a two-stage pumping system (not shown) in this example embodiment including a rotary mechanical pump and turbo molecular pump can evacuate the whole chamber 114 to near UHV conditions (~$10^{-8}$ mbar) after several days' pumping.

For the in situ thermal evaporation, the sample stage 104 can be positioned to a deposition position in the vacuum, where a custom designed effusion cell is configured at about 30 degrees relative to the horizontal direction towards the sample stage 104 for thermal evaporation of various materials, as illustrated in FIG. 1a. A quartz crystal microbalance (QCM) 116 can decline in front of the sample stage 104 in the deposition position to precisely monitor the real-time evaporation rate.

Advantageously, the system 100 according to an example embodiment can provide in-situ electrical measurements of the devices during surface/interface functionalization deposition, also referred to hereinafter as "real-time" in-situ measurements.

After deposition, the sample stage 104 can be positioned close to the quartz viewport 108 on the fast entry door 106 for light illumination. A portable optical microscope 118 configured with long working distance objectives e.g. 120 is set up outside the viewport 108 for the fine focusing of laser beams 122. Laser beams e.g. 122 from different light sources can be introduced into the microscope 118 for light illumination on samples in the vacuum. Different gases can be also introduced into the chamber for gas sensing experiments.

Accordingly, using the system 100 according to an example embodiment can advantageously enable the electronic and optoelectronic properties of fabricated devices to be in situ characterized upon the deposition of various modification materials.

Figure 2:
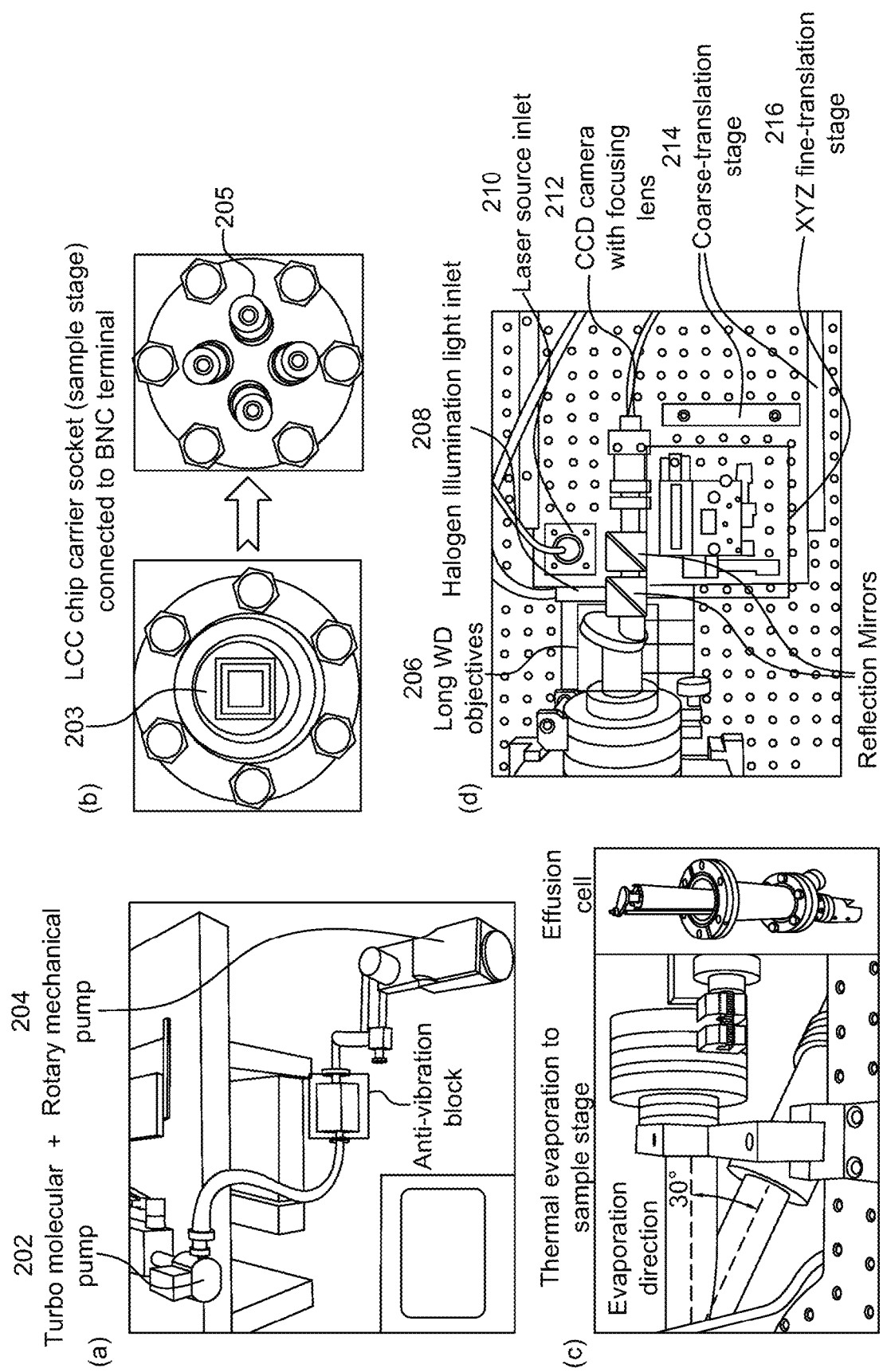
FIG. 2(a) shows a photograph illustrating the two-stage pumping system of the example embodiments shown in FIG. 1(b).
FIG. 2(b) shows a photograph illustrating the electrical connections between sample stage and BNC terminals of the example embodiments shown in FIG. 1(b).
FIG. 2(c) shows a photograph illustrating the thermal evaporation configuration of the example embodiments shown in FIG. 1(b).
FIG. 2(d) shows a photograph illustrating the microscope-based fine focusing setup of the example embodiments shown in FIG. 1(b).

FIG. 1(b) shows a photograph of a prototype system 200 according to an example embodiment, and FIGS. 2(a) to (d) show photographs of the main parts of the system 200 according to an example embodiment. Specifically, FIG. 2(a) is a photograph of the two-stage pumping system with a turbo molecular pump 202 and a rotary mechanical pump 204, FIG. 2(b) shows on the left a photograph (viewed through the viewport of the electrical connections at the sample stage 203 and to the BNC terminals e.g. 205 shown in the photograph on the right, FIG. 2(c) shows on the left a photograph illustrating the overall thermal evaporation configuration and on the right a photograph of the effusion cell 207, and FIG. 2(d) is a photograph illustrating the microscope-based fine focusing setup with long WD objectives 206, Halogen illumination light inlet 208, laser source inlet 210, CCD camera with focusing lens 212, coarse translation stage 214, and XYZ fine translation stage 216.

Features and functions of the prototype system 200 according to an example embodiment:

1). Near ultra-high vacuum conditions

Upon nitrogen ventilation, 12 hours pumping can reach the vacuum level of $8 \times 10^{-8}$ mbar. The ultimate pressure is $4 \times 10^{-8}$ mbar.

2). Low noise electrical measurement

DC current measurement noise level can reach as low as $10^{-13}$ A

3). In situ thermal evaporation of various materials

A large variety of materials can be in situ evaporated, including organic species, metal oxides, metal, and etc.

4). Fine focused light illumination

Fine focused laser spot with a diameter <4 μm for lasers of visible spectrum

5). Easy and flexible sample loading, chamber pumping, and gas introduction

6). Minimized vibration level under fine focusing of light beam

Applications of the in situ vacuum optoelectronic characterization system and method according to example embodiments will now be described, by way of example only, not limitation.

Specifically, in the following, some interesting research works are described obtained from the system and methods according to example embodiment to show the great feasibility and flexibility of such vacuum system design and characterization methods according to example embodiments of the present invention for commercialization towards novel materials based functional electronic and optoelectronic applications.

Example 1: Surface Transfer Doping Induced Effective Modulation on Ambipolar Characteristics of Few-Layer Black Phosphorus Black phosphorus (BP), a fast emerging two-dimensional material, has been configured as field effect transistors, showing a hole-transport dominated ambipolar characteristic. As shown in FIGS. 3(a) to (f), for the first time an effective modulation on ambipolar characteristics of few-layer black phosphorus transistors was demonstrated, through in situ surface functionalization with cesium carbonate ($Cs_2CO_3$) and molybdenum trioxide ($MoO_3$).

Figure 3:
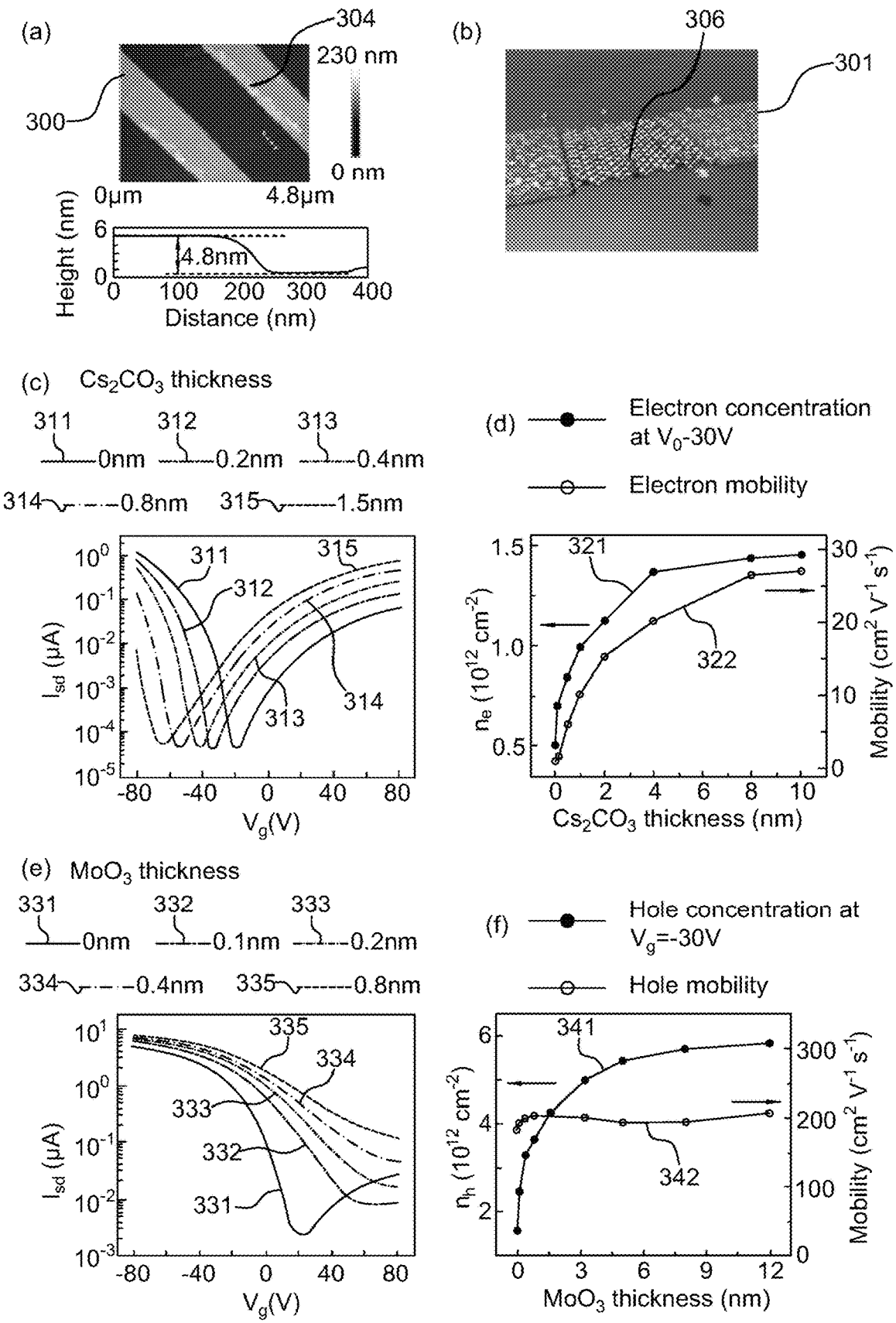
FIG. 3. (a) AFM image of an as-fabricated BP device. The line profile at the edge of the BP flake indicates a multilayer BP crystal of ~4.8 nm (~8 layers). (b) Schematic illustration of BP device coated by $Cs_2CO_3$. (c) Forward transfer characteristics (Vg from −80 V to 80 V) evolution of a BP FET measured at $V_{sd}$=100 mV in logarithmic scale with increasing $Cs_2CO_3$ thickness from 0 to 1.5 nm. (d) Electron concentration (ne) at $V_g$=30 V and mobility of BP versus $Cs_2CO_3$ thickness. (e) Forward transfer characteristics ($V_g$ from −80 V to 80 V) evolution of a separate BP FET measured at $V_{sd}$=100 mV with respect to the $MoO_3$ thickness from 0 to 0.8 nm. (f) Hole concentration (nh) at $V_g$=−30 V and mobility of BP versus $MoO_3$ thickness.

Specifically, FIG. 3(a) shows an AFM image 300 of an as-fabricated BP device 301. The line profile 302 at the edge of the BP flake e.g. 304 indicates a multilayer BP crystal of ~4.8 nm (~8 layers). FIG. 3(b) is a schematic illustration of the BP device 301 coated by $Cs_2CO_3$ e.g. 306. FIG. 3(c) shows the forward transfer characteristics ($V_g$ from −80 V to 80 V) evolution of a BP FET measured at $V_{sd}$=100 mV in logarithmic scale with increasing $Cs_2CO_3$ thickness from 0 to 1.5 nm, see curves 311 to 315. FIG. 3(d) shows the electron concentration ($n_e$) at $V_g$=30 V (curve 321) and mobility (curve 322) of BP versus $Cs_2CO_3$ thickness. FIG. 3(e) shows the forward transfer characteristics ($V_g$ from −80 V to 80 V) evolution of a separate BP FET measured at $V_{sd}$=100 mV with respect to the $MoO_3$ thickness from 0 to 0.8 nm, see curved 331 to 335. FIG. 3(f) shows the hole concentration ($n_h$) at $V_g$=−30 V (curve 341) and mobility (curve 342) of BP versus $MoO_3$ thickness. $Cs_2CO_3$ is found to strongly electron dope black phosphorus. The electron mobility of black phosphorus is significantly enhanced to ~27 $cm^2V^{-1}s^{-1}$ after 10 nm $Cs_2CO_3$ modification (see curve 322), indicating a greatly improved electron transport behavior. In contrast, $MoO_3$ decoration demonstrates a giant hole doping effect on black phosphorus, e. g. increasing its hole concentration at $V_g$=−30 V to ~5.8×10$^{12}$ cm$^{-2}$ (see curve 341).

The findings of the tunable nature of the surface transfer doping scheme confirm black phosphorus as a promising candidate for further complementary logic electronics.

Figure 4:
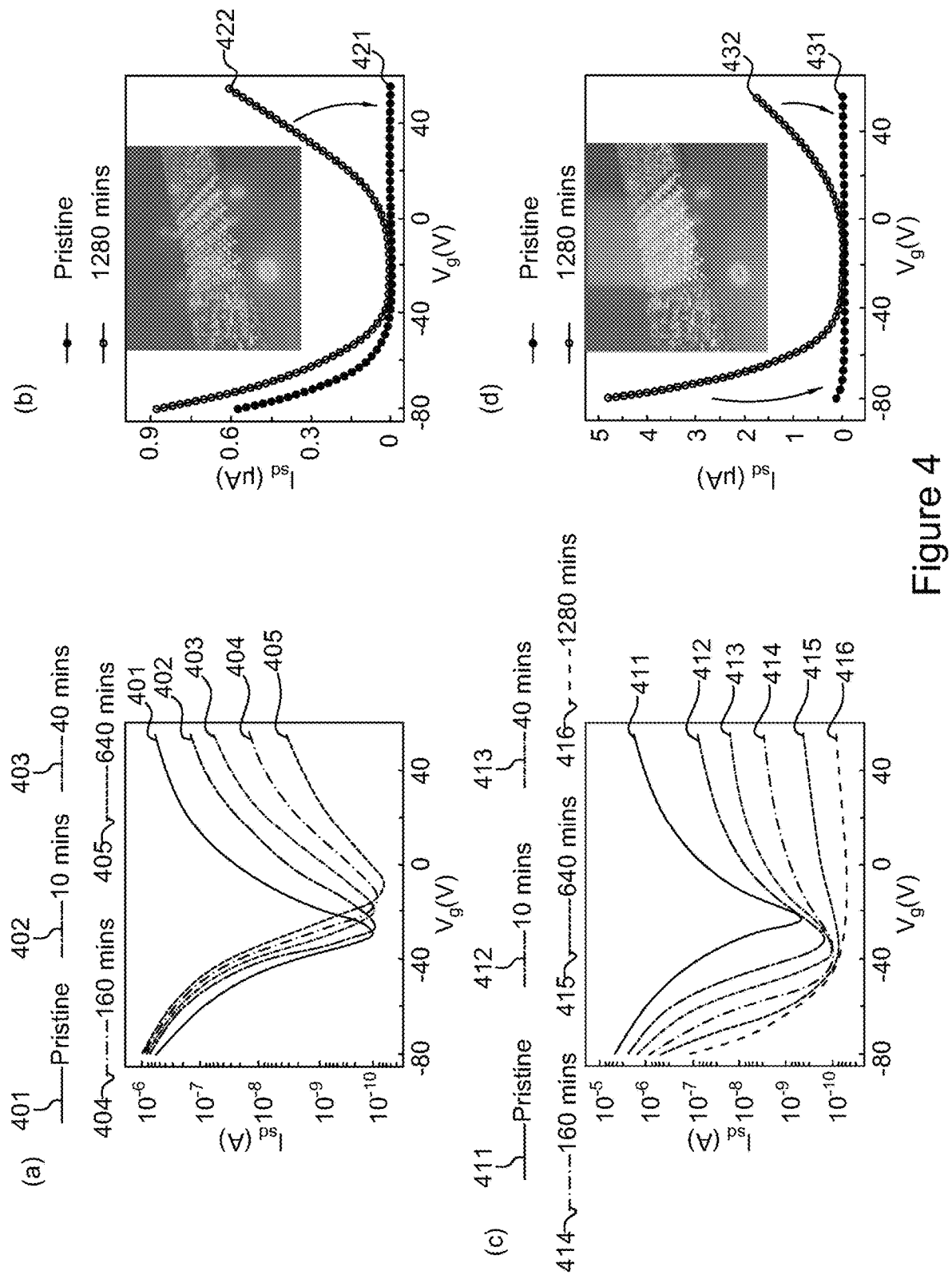
FIG. 4(a) shows the transfer characteristics evolution of a BP FET measured at $V_{sd}$=0.1 V in logarithmic scale as a function of $O_2$ exposure time in dark conditions, according to an example embodiment.
FIG. 4(b) shows a linear plot of the transfer curve after 1280 mins $O_2$ exposure in dark conditions, according to an example embodiment.
FIG. 4(c) shows the transfer characteristics evolution of a BP FET measured at $V_{sd}$=0.1 V in logarithmic scale as a function of $O_2$ exposure time upon light illumination (515 nm laser with the power intensity of ~1.5 $Wcm^{-2}$), according to an example embodiment.
FIG. 4(d) shows a linear plot of the transfer curve after 1280 mins $O_2$ exposure upon light illumination with respect to the pristine BP, according to an example embodiment.

Example 2: Oxygen Induced Strong Mobility Modulation in Few-Layer Black Phosphorus Two-dimensional black phosphorus has been configured as field-effect transistors, showing an intrinsic symmetric ambipolar transport characteristic. In FIG. 4, the strongly modulated ambipolar characteristics of few-layer black phosphorus in oxygen is demonstrated.

Specifically, FIG. 4(a) shows the transfer characteristics evolution of a BP FET measured at $V_{sd}$=0.1 V in logarithmic scale as a function of $O_2$ exposure time (curves 401 to 405) in dark conditions. FIG. 4(c) shows the transfer characteristics evolution of the BP FET measured at $V_{sd}$=0.1 V in logarithmic scale as a function of $O_2$ exposure time (curves 411 to 416) upon light illumination (515 nm laser with the power intensity of ~1.5 $Wcm^{-2}$).

FIG. 4(b) shows a linear plot (curve 421) of the transfer curve after 1280 mins $O_2$ exposure in dark conditions and FIG. 4(d) shows a linear plot (curve 431) of the transfer curve after 1280 mins $O_2$ exposure upon light illumination, as compared to the pristine BP (curves 422, 432).

Pure oxygen exposure in dark conditions can dramatically decrease the electron mobility of black phosphorus without degrading the hole transport (compare curves 421 and 422). It was also found that the transport characteristics can be nearly recovered upon annealing in Argon. This reveals that oxygen molecules are physisorbed on black phosphorus. In contrast, oxygen exposure upon light illumination exhibits a significant attenuation for both electron and hole transport (compare curves 431 and 432), originating from the photo-activated oxidation of black phosphorus, which is corroborated by in situ X-ray photoelectron spectroscopy characterization. The findings clarify the predominant role of oxygen in modulating ambipolar characteristics of black phosphorus, thereby providing deeper insight to the design of black phosphorus based complementary electronics.

It is noted that the results shown in FIG. 4 did not require a fine focusing of the illumination laser used.

Figure 5:
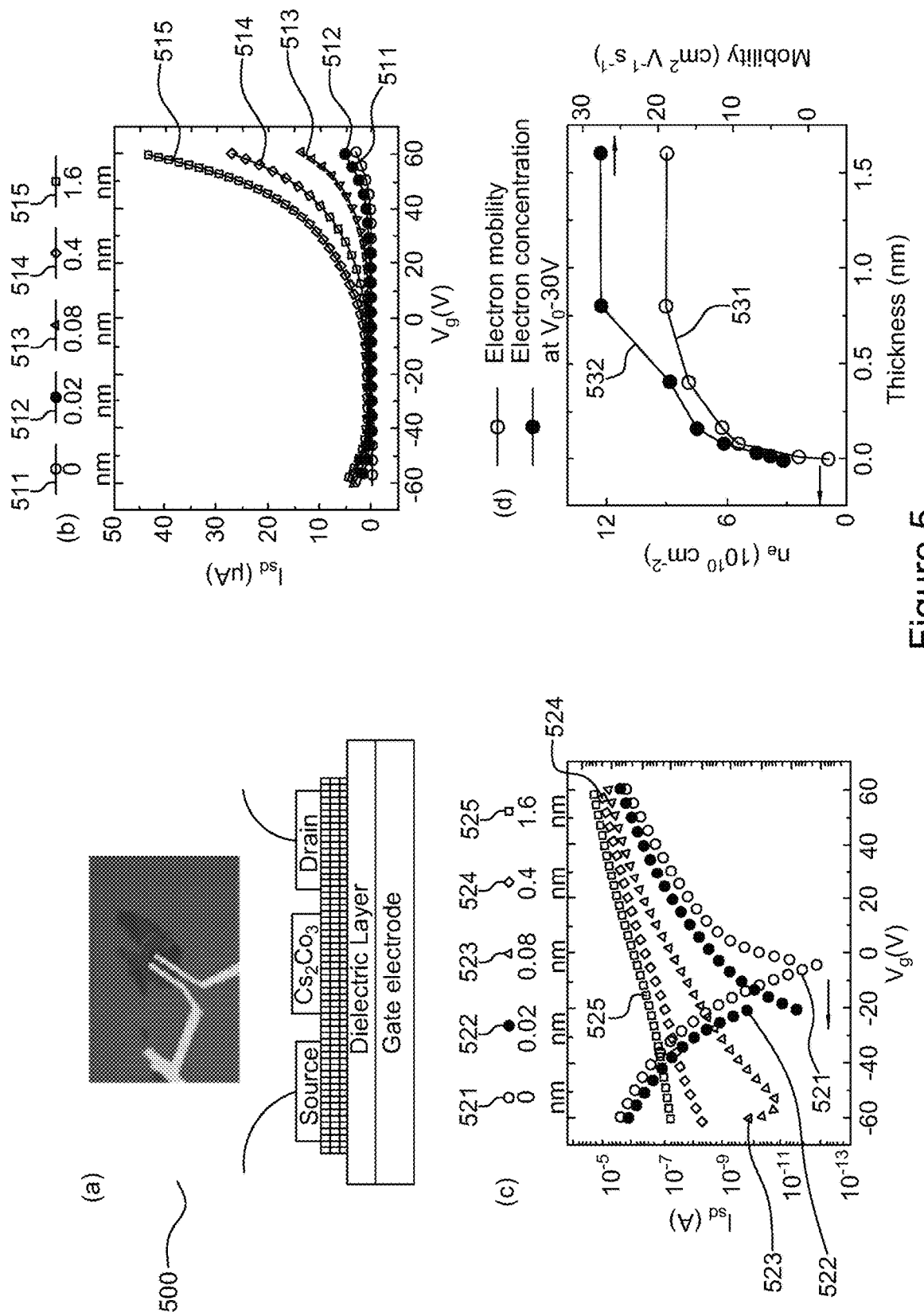
FIG. 5(a) shows a schematic illustration of the $Cs_2CO_3$ modified $WSe_2$ FET, with the optical image of an as-fabricated $WSe_2$ device as in inset, according to an example embodiment.
FIG. 5(b) shows a linear plot of the transfer curves of $WSe_2$ FET with increasing $Cs_2CO_3$ thickness from 0 to 1.6 nm, according to an example embodiment.
FIG. 5(c) shows the forward transfer characteristics ($V_g$ from −60V to 60 V) evolution of a $WSe_2$ FET measured at $V_{sd}$=1V in logarithmic scale as a function of $Cs_2CO_3$ thickness, according to an example embodiment.
FIG. 5(d) shows the electron concentration (ne) at $V_g$=30 V and mobility of $WSe_2$ with respect to $Cs_2CO_3$ thickness, according to an example embodiment.

Example 3: Largely Enhanced Optoelectronic Performance of Tungsten Diselenide Phototransistor Via Surface Functionalization Two-dimensional layered transition metal dichalcogenides (TMDs) have attracted tremendous research interests and efforts for versatile electronics and optical applications, owing to their extraordinary and unique fundamental properties and remarkable prospects of nanoelectronic applications. Unlike molybdenum disulphide (MoS2), the most studied TMD material, which generally exhibits the n-type electrical transport behaviors, tungsten diselenide ($WSe_2$) is featured by tunable transport characteristics and superior optical properties (e.g. higher quantum efficiency). In FIG. 5, the remarkably enhanced device performance of $WSe_2$ phototransistor via surface functionalization of cesium carbonate ($Cs_2CO_3$) is demonstrated using the system and method according to example embodiments.

Specifically, FIG. 5(a) shows a schematic illustration of the $Cs_2CO_3$ modified $WSe_2$ FET 500, with the inset showing the optical image of an as-fabricated $WSe_2$ device. FIG. 5(b) shows a linear plot of the transfer curves of $WSe_2$ FET with increasing $Cs_2CO_3$ thickness from 0 to 1.6 nm (curves 511 to 515). FIG. 5(c) shows the forward transfer characteristics ($V_g$ from −60V to 60 V) evolution of a $WSe_2$ FET measured at $V_{sd}$=1V in logarithmic scale as a function of $Cs_2CO_3$ thickness (curves 521 to 525). FIG. 5(d) show the electron concentration ($n_e$) at $V_g$=30 V (curve 531) and mobility (curve 532) of the $WSe_2$ device with respect to $Cs_2CO_3$ thickness.

The $WSe_2$ device was found to be strongly electron doped after in situ deposition of $Cs_2CO_3$ (see curve 531). The electron mobility of the $WSe_2$ device was significantly enhanced to ~27 $cm^2V^{-1}s^{-1}$ by one order of magnitudes after 1.6 nm $Cs_2CO_3$ modification (see curve 532). Furthermore, the $WSe_2$-based phototransistors present nearly 330-fold increase of photocurrent with the deposition of 1.6 nm $Cs_2CO_3$. The findings confirm $WSe_2$ to be a promising candidate for the electronic and optoelectronic applications.

Example 4: Surface Functionalization of Black Phosphorus Via Potassium Towards Higher Performance Complementary Devices Two-dimensional black phosphorus configured field-effect transistor devices generally show a hole-dominated ambipolar transport characteristic, thereby limiting its applications in complementary electronics. Using the system and methods according to example embodiments, an effective surface functionalization scheme on few-layer black phosphorus was demonstrated, through in situ surface modification with potassium, towards high performance complementary device applications. Potassium exhibits a giant electron doping effect on black phosphorus along with a clear bandgap reduction, which is further corroborated by in situ photoelectron spectroscopy characterizations. The electron mobility of black phosphorus is significantly enhanced to 260 $cm^2V^{-1}s^{-1}$ by over one order of magnitude after 1.6 nm potassium modification, the highest record at room temperature for two-terminal measurements. Using lithography technique, a spatially controlled potassium doping technique is developed to establish high performance complementary devices on a single black phosphorus nanosheet, e. g. the p-n homojunction-based diode achieves a near-unity ideality factor of 1.007 with an on/off ratio of ~$10^4$. The findings coupled with the tunable nature of the in situ modification scheme according to example embodiments advantageously enable black phosphorus as a promising candidate for further complementary electronics.

The use of two-dimensional (2D) layered materials as the building blocks of the next generation nanoelectronic devices, represented by graphene[1, 2] and transition metal dichalcogenides (TMDs)[3], provides the possibilities to extend the scaling limits in conventional silicon (Si)-based complementary metal oxide semiconductor (CMOS) devices. Despite the extremely high charge carrier mobility (>100,000 $cm^2V^{-1}s^{-1}$)[4] and a wealth of fantastic fundamental properties[5], graphene lacks a finite bandgap, thus seriously limiting its applications in logic electronics that require a large current on/off ratio. On the other hand, semiconducting TMD materials possess a sizeable and thickness-dependent bandgap, however they suffer from the low charge carrier mobility[3]. The emergence of 2D layered black phosphorus (BP)[6, 7, 8] exactly fills up the gap between graphene and TMDs owing to its high carrier mobility (up to ~6000 $cm^2V^{-1}s^{-1}$)[9] and moderate direct bandgap (tunable from ~0.3 eV for bulk to ~2 eV for monolayer)[10, 11, 12].

Few-layer black phosphorus flake can be isolated via mechanical exfoliation from bulk layered crystal, where each phosphorus atom is covalently bonded to three neighboring atoms, forming a puckered orthorhombic structure in a unit cell[13, 14, 15]. Such crystalline structure also causes highly anisotropic electronic and optoelectronic characteristics in exfoliated BP flakes[16, 17, 18]. Unlike the direct-to-indirect bandgap transition in most cases of TMDs[3], BP has a direct bandgap for all number layers[10, 11, 12], possessing great potentials for BP-based optoelectronic applications[19, 20]. This intrinsic sizeable bandgap enables ultrathin BP to be configured as field-effect transistor devices with a high current on/off ratio of $10^4$-$10^5$.[6] Arising from the oxygen-induced electron trapping on BP[21] as well as the formed Schottky barrier at metal/BP interfaces[22, 23, 24], BP-based FETs generally shows a hole-dominated ambipolar transport characteristic, where the hole mobility and on-current are orders of magnitudes higher than the electron side, thereby seriously restricting its applications in complementary electronics. In order to achieve BP-based complementary devices with high performance, it is of great significance to largely improve the electron mobility in BP devices and develop controlled nondestructive doping methods to BP.

In conventional semiconductors, substitutional doping by introducing alien atoms into crystal lattice is commonly employed to realize n- or p-type behaviors. However, this is seldom used in 2D material systems due to the introduction of significant defects via this doping process[25, 26]. The charge carrier concentration and type of 2D materials can be tuned by applying an external electrostatic field[27, 28, 29], but the efficiency is limited for the lack of good interfaces between dielectrics and 2D materials in the sophisticated device structures. Attributed to the atomically thin nature of 2D materials, chemical doping based on modifying the surface with a specific adlayer provides a strong and non-volatile doping capability on 2D materials with the ease of device fabrication. Since the first study of chemical doping on black phosphorus FETs via metal oxides ($Cs_2CO_3$ and $MoO_3$)[30], several organic and inorganic species have been utilized on BP surface to either modulate its transport properties or protect BP from degradation in air ambient. Covalent[31] and non-covalent functionalization[32] by coating polymer layers is demonstrated to effectively enhance the stability of BP against oxidization. Very recently, metal adatoms[33, 34] and cross-linked Poly(methyl methacrylate) (PMMA)[35] were spatially coated on a single BP flake to achieve complementary devices, such as logic invertor and p-n homojunction-based diode. Nevertheless, these electron donors did not induce significant n-doping effect on BP, resulting in limited device performance for the lateral homojunction-based devices. Alkali metal potassium (K), one of strongest electron donors, has been used as surface dopant to dramatically modify the electronic properties of graphene[36] and TMDs[37]. For the case of BP, J. Kim et al. recently report a widely tunable bandgap of BP with potassium doping measured by angle-resolved photoelectron spectroscopy (ARPES) due to the giant Stark effect[38]. However, to date, a detailed experimental investigation of how potassium impacts on the device performance of BP-based FETs is still absent. Considering the super chemical reactivity of K in air, it is necessary to undertake in situ characterizations on K-modified BP devices.

Using the system and methods according to example embodiments, a giant electron doping of few-layer BP from FET perspective via the in situ surface functionalization with potassium was demonstrated. K modification is found to remarkably enhance the electron transport of BP, and in particular the electron mobility is increased to 260 $cm^2V^{-1}s^{-1}$ by over one order after 1.6 nm K decoration. In situ photoelectron spectroscopy (PES) characterizations reveal the significant interfacial charge transfer between BP and K doping layer. In addition, a clear bandgap reduction of BP induced by a vertical electrical field from K dopants is extracted from FET measurements, and further corroborated by the in situ PES/ARPES results. By spatially masking the BP channel, high performance complimentary devices are achieved in a single BP flake after K doping, demonstrating an ideal p-n homonjunction-based diode with a near-unity ideality factor of 1.007 and high current on/off of ~$10^4$. The realization of both n- and p-type conduction in a BP channel gives the logic invertor device as well.

Figure 6:
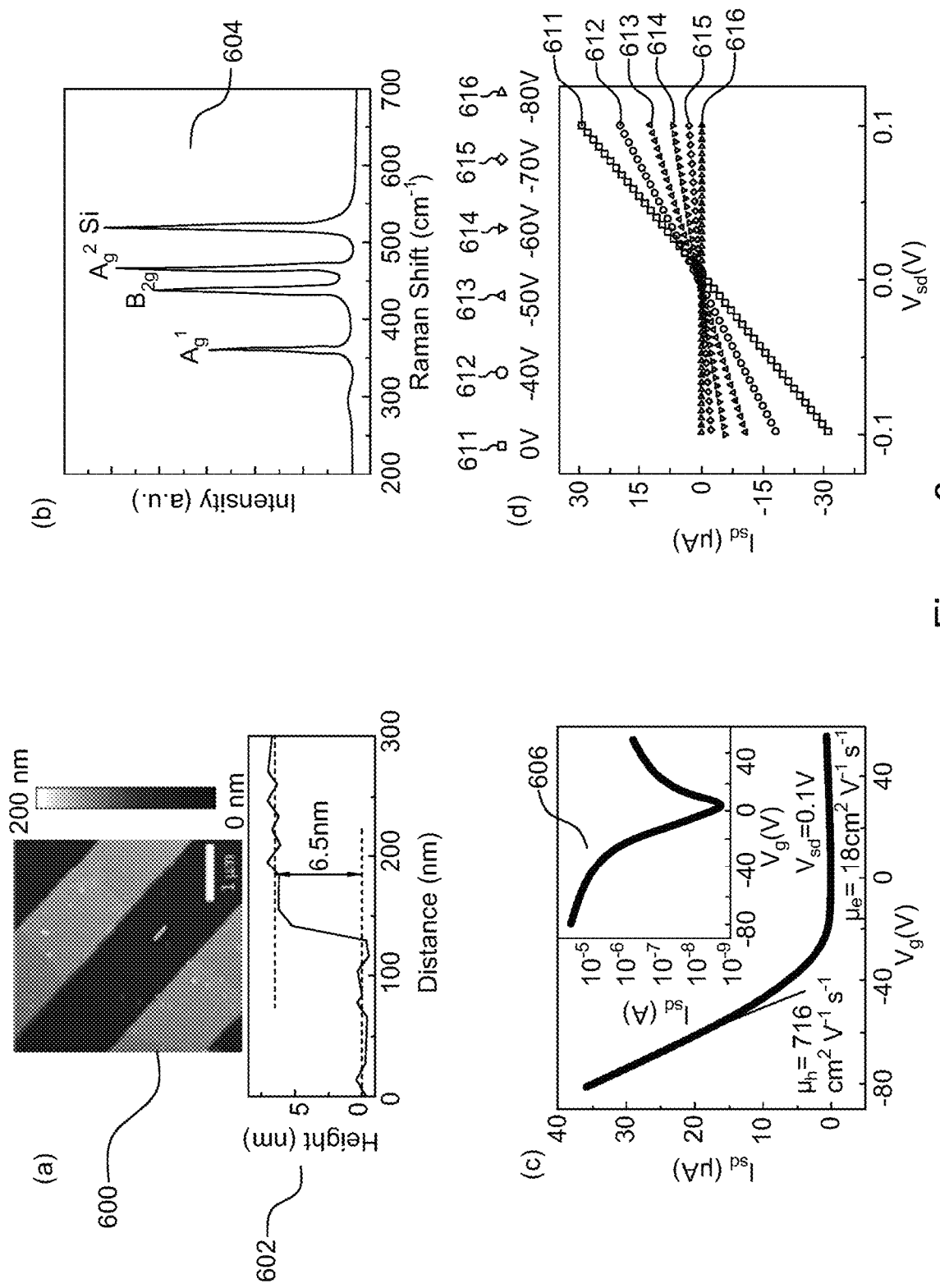
FIG. 6(a) shows an AFM image of an as-fabricated few-layer BP back-gated FET in two-terminal configurations and a line profile suggesting a multilayer BP flake of ~6.5 nm (~12 layers).
FIG. 6(b) shows the Raman spectrum of the exfoliated BP flake on the 300 nm $SiO_2$/Si substrate.
FIG. 6(c) shows the transfer characteristic ($I_{sd}$-$V_g$) of a BP device at $V_{sd}$=0.1 V with the logarithmic plot of the transfer curve as an inset, demonstrating a hole-dominated ambipolar transport characteristic with the hole and electron mobility of 716.0 $cm^2V^{-1}s^{-1}$ and 18 $cm^2V^{-1}s^{-1}$, respectively, according to an example embodiment.
FIG. 6(d) shows the $I_{sd}$-$V_{sd}$ characteristics ($V_{sd}$ from −0.1 V to 0.1 V) of the same device with increasing gate voltages from 0 V to −80 V, according to an example embodiment.

Ultrathin BP flakes were isolated on a heavily p-doped silicon substrate with 300 nm oxides using standard micromechanical exfoliation, and subsequently configured as two-terminal FET devices for electrical measurements, as will be described in more detail below. FIG. 6(a) displays a typical atomic force microscopy (AFM) image 600 of an as-fabricated BP device. The line profile in graph 602 indicates a 6.5 nm-thick BP flake in the FET device, corresponding to ~12 atomic layers considering interlayer distance of 0.53 nm. Raman spectrum 604 of exfoliated few-layer BP (see FIG. 6(b)) exhibits three characteristic peaks nearly located at 364, 438 and 465 $cm^{-1}$, corresponding to three different vibration modes, labeled as $A_g^1$, $B_{2g}$ and $A_g^2$, respectively. The substrate Si peak is also labelled in FIG. 6(b).

All the electrical measurements of the as-made BP devices were conducted in a high vacuum condition (~$10^{-8}$ mbar) in a system according to an example embodiment, due to the environmental instability of BP[39, 40]. FIG. 6(c) shows the typical transfer transport characteristic ($I_{sd}$-$V_g$) of the fabricated BP FETs at $V_{sd}$=0.1. Applying the gate voltage ranging from −80 V to 50 V, the source-drain current increased from OFF to ON state along both negative and positive sweeping direction (inset of FIG. 6(c)), corresponding to the hole and electron transport, respectively. Moreover, the current for negative $V_g$ sweeping increased much faster than the positive side, indicating an obvious hole-dominated ambipolar transport characteristic. The inset logarithmic plot 606 presents a current on/off ratio of ~$10^4$, in good agreement with previous reports[6]. Extrapolating the current onset in the linear region of both hole and electron side, the threshold voltage $V_{th}$ was determined to be ~−38 V for holes and ~23 V for electrons. On the basis of $V_{th}$, The carrier concentration induced by a specific gate voltage $V_g$ can be estimated by the equation:

$$n = -C_i(V_g - V_{th})/e,$$

where $C_i$ denotes the capacitance per unit area between BP and back gate given by $C_i = \varepsilon_0 \varepsilon_r / d$, where $\varepsilon_r$ and d are the dielectric constant and thickness of $SiO_2$, respectively). For example, the electron concentration at $V_g = 25$ V was derived to be $1.3 \times 10^{11}$ cm$^{-2}$. Similarly, extracted from the linear regime of transfer curve, the field-effect mobility of BP was evaluated in two-terminal FET configurations by the formula below:

$$\mu = \frac{L}{WC_i V_{sd}} \frac{dI_{sd}}{dV_g}$$

where $dI_{sd}/dV_g$ represents the slope of the linear region in transfer plot, and L, W are the length and width of conduction channel, respectively. For the device in FIG. 6(c), the hole and electron mobility were estimated to be 716 cm$^2$V$^{-1}$s$^{-1}$ and 18 cm$^2$V$^{-1}$s$^{-1}$, respectively. The source-drain current versus source-drain voltage characteristics of the same device are shown in FIG. 6(d). Excellent linearity with $V_{sd}$ ranging from −0.1 V to 0.1 V under different $V_g$ (curves 611-616) reveals the ohmic contacts between metal electrodes and BP flake.

Figure 7:
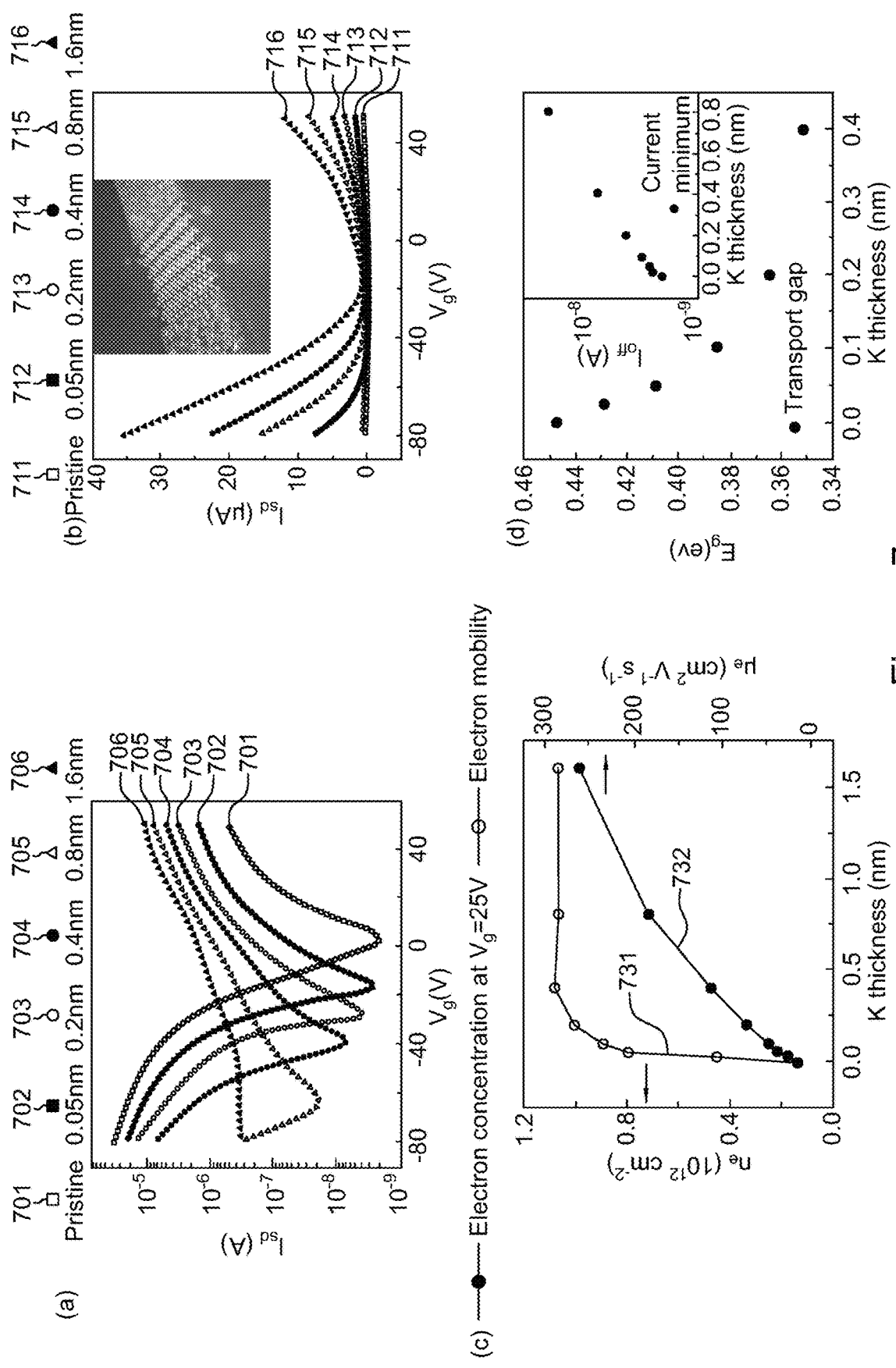
FIG. 7(a) shows the transfer characteristics ($V_g$ from −80 V to 55 V) evolution of a BP FET measured at $V_{sd}$=0.1 V in logarithmic scale with increasing K thickness, according to an example embodiment.
FIG. 7(b) shows the linear plot of the same transfer characteristics with a schematic illustration of BP devices during the deposition of K as an inset, according to an example embodiment.
FIG. 7(c) shows the plot of extracted electron concentration at $V_g$=25 V and mobility as a function of K thickness, according to an example embodiment. The electron mobility of the BP device was significantly enhanced by one order of magnitude to 260 $cm2V^{-1}s^{-1}$ after 1.6 nm K decoration.
FIG. 7(d) shows the estimated bandgap of the few-layer BP with respect to K thickness with and inset showing the current minimum of the transfer curves as a function of K thickness, according to an example embodiment.

In order to investigate the surface functionalization of K on tuning the electronic properties of few-layer BP, K was in situ evaporated onto BP FETs in high vacuum for electrical characterizations according to example embodiments, as will be described in more detail below. FIG. 7(a) demonstrates the typical transfer characteristic evolution in logarithmic scale of BP devices with respect to K thickness (curves 701-706). It is worth noting that the thickness shown in FIG. 7(a) is nominal thickness calibrated by quartz crystal microbalance (QCM), according to an example embodiment. The initial transfer curve of the pristine BP presents a current minimum nearly located at zero gate voltage, indicating a neutral conduction behavior without electrostatic field. With increasing K thickness, the current minimum dramatically shifted towards negative gate voltages, in particular by over 60 V after coating 0.8 nm K, and rapidly exceeds the safe gate voltage compliance (−80V) with further K deposition. This suggests a giant electron doping effect on K-modified BP device, originating from the significant interfacial electron transfer from K dopants to the underlying BP flake. More importantly, the on-current of electron side was increased by over one order of magnitude after 1.6 nm K deposition, revealing a remarkably enhanced electron transport in K-doped BP. As a result, the hole-dominated transfer characteristic of the pristine BP progressively evolved to electron-dominated behavior, and eventually reached the pure n-type transport in the limited $V_g$ range, with the gradual deposition of K (curves 711-716), as shown in FIG. 7(b). The electron concentration ($V_g = 25$ V, curve 731) and mobility (curve 732) of BP were calculated from the method aforementioned and plotted as a function of K thickness in FIG. 7(c). The estimated electron concentration at 25 V $V_g$ sharply increased from $1.3 \times 10^{11}$ cm$^{-2}$ to $1.0 \times 10^{12}$ cm$^{-2}$ after 0.2 nm K decoration, and almost saturated at higher coverage. Intriguingly, K-functionalized BP shows an over one order of magnitude enhancement of electron mobility from 18 cm$^2$V$^{-1}$s$^{-1}$ for the pristine BP to 260 cm$^2$V$^{-1}$s$^{-1}$ for 1.6 nm K decorated device. Although the field-effect mobility extracted from the two-terminal devices is an underestimate of the intrinsic mobility, it still approaches the record values of electron mobility from four-terminal measurements at room temperature in the literature, such as 275 cm$^2$V$^{-1}$s$^{-1}$ for Al-contacted BP FETs[24] and 380 cm$^2$V$^{-1}$s$^{-1}$ for Cu-doped BP on boron nitride[33]. Through the in situ surface modification of K using the system and methods according to example embodiments, the highest ever two-terminal electron mobility of few-layer BP at room temperature was obtained, even if the BP FETs were simply established on $SiO_2$/Si substrate for the most commonly used back-gated configurations. Previous work[21] shows that oxygen molecules in air can either physi- or chemi-sorbed on the BP surface, thus introducing high concentration of electron trapping sites that cannot be fully released even under high vacuum. It is proposed that the n-type doping via K can significantly increase the electron concentration in BP to fill up these trapping sites as well as to effectively screen the trapped charges, thereby greatly enhancing the electron mobility of BP.

In addition to the greatly improved electron transport, K-functionalized BP also demonstrates an obvious bandgap reduction obtained from the transfer measurements in FIG. 7(a). Evaluating the minimum current of the BP device, it was noticed that the off-state gradually increased from $2.0 \times 10^{-9}$ A to $1.9 \times 10^{-8}$ A after the deposition of 0.8 nm K as plotted in inset of FIG. 7(d), and further kept this trend of evolution with higher K thickness. Following the previously reported methodology in bilayer $MoS_2$ FETs[41], the threshold voltages in the ambipolar transfer curves were utilized to extract the size of bandgap. At the threshold voltage of n-branch (labeled as $V_{n-th}$), the Fermi level at the source is aligned to the conduction band of BP; while the Fermi level at the drain moves to align with the valence band as $V_g$ reaches the threshold voltage of p-branch (labeled as $V_{p-th}$). Thus, the bandgap of BP can be simply estimated using the formula below:

$$E_g = e\left(V_{sd} + \frac{V_{n-th} - V_{p-th}}{\beta}\right)$$

where $\beta$ is the band movement factor: $\beta = 1 + C_T/C_{OX}$. $C_T$ and $C_{OX}$ are the interface trap capacitance and oxide capacitance, respectively. Alternatively, close to the device off-state, the subthreshold swing (SS) defined as $dV_g/d(\log I_{sd})$ equals $60 \times \beta$ mV/decade, resulting in the extraction of $\beta$ factor from experimentally measured SS in individual transfer plot. As shown in FIG. 2d, the estimated bandgap of BP apparently decreased from 0.45 eV to 0.35 eV after 0.4 nm K modification. This mainly results from the Stark effect induced by a giant vertical electric field via K doping, as reported in the previous ARPES work[38]. Further deposition of K shifted $V_{p-th}$ beyond the measurable $V_g$ range, making it difficult to estimate the bandgap of BP at higher doping level. However, the tendency for the reduction of BP bandgap with increasing K coverage is clear and continuous.

Figure 8:
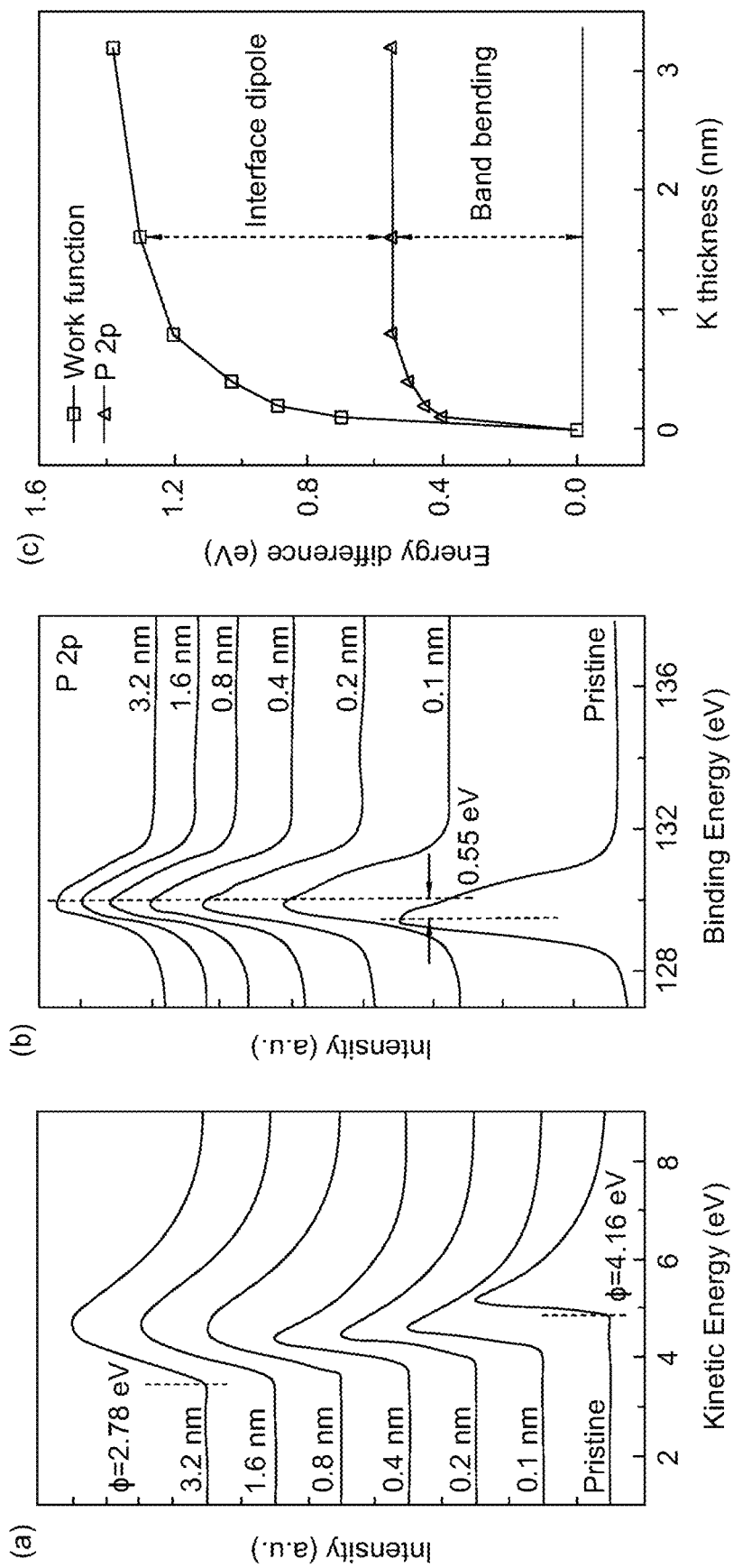
FIG. 8(a) shows the UPS spectra evolution at low kinetic energy region (secondary electron cutoff) during the deposition of K.
FIG. 8(b) shows the XPS P 2p core level spectra of BP as a function of K thickness.
FIG. 8(c) shows the shift of sample work function and P 2p core level versus K thickness.

In situ ultraviolet photoelectron spectroscopy (UPS) and X-ray photoelectron spectroscopy (XPS) characterizations were further implemented on K-modified bulk BP to elucidate the underlying interfacial charge transfer mechanism between K and BP. FIG. 8(a) shows the evolution of UPS spectra at low kinetic energy during the deposition of K on BP. By linearly extrapolating the low kinetic energy onset (secondary electron cutoff), the vacuum level of K-coated BP was measured to extract the work function. After the deposition of 3.2 nm K, the work function largely decreased from 4.16 eV (clean BP) to 2.78 eV, or a downshift of vacuum level by 1.38 eV, originating from the substantial interfacial electron transfer from K to BP. This significant charge transfer was further verified by the XPS core level spectra of P 2p as shown in FIG. 8(b). Pristine BP exhibits a single P 2p peak with the spin-orbit split located at 129.45 eV. Upon the K deposition, the P 2p peak quickly shifted to the higher binding energy, markedly by 0.55 eV to 130 eV after 3.2 nm K decoration. This demonstrates a remarkable downward band bending that suggests the Fermi level of BP moving towards or even above its conduction band minimum (CBM), resulting from the increase of electron concentration in K-doped BP. Similar to the previously reported surface transfer doping of graphene[42, 43], the large work function difference between K and BP results in the significant charge transfer at K/BP interface that leads to the accumulation of excess delocalized electrons in the BP layer, thereby resulting in a significant downward shift of the entire band structure of BP with reference to the Fermi level. The observed vacuum level shift comprises the downward band bending in BP and the interface dipole formed at K/BP interface. This gives rises to a clear interface dipole extracted from the difference between vacuum level shift and band bending as illustrated in FIG. 8(c). On the other hand, the UPS spectra of the valence band in K-modified BP were also measured at low binding energy. With the deposition of K, the CBM of BP originally located above the Fermi level was dragged downward below the Fermi level, as clarified by the corresponding ARPES spectra measured at room temperature. This facilitates the measurable CBM of BP in the UPS spectra, thereby leading to the direct observation of bandgap. Hence, a decrease of BP bandgap was identified versus K thickness.

Figure 9:
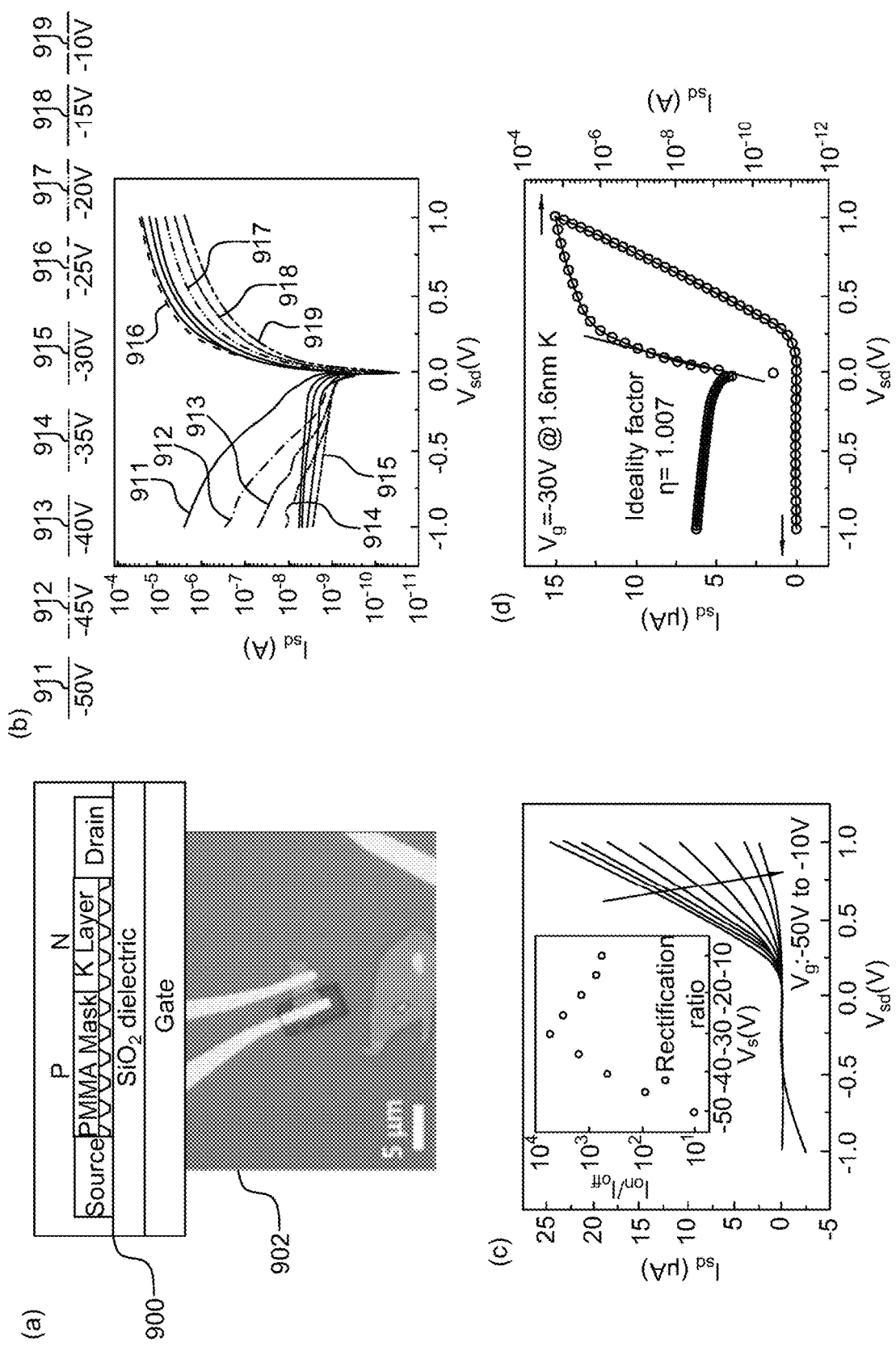
FIG. 9(a) shows a schematic illustration and optical image of an as-fabricated p-n homojunction diode on a single BP flake.
FIG. 9(b) shows the $I_{sd}$-$V_{sd}$ characteristics ($V_{sd}$ from −1 V to 1 V) of a 1.6 nm K-coated BP diode in logarithmic scale upon gate voltages ranging from −50 V to −10 V with a step of 5V, according to an example embodiment. A gate-tunable rectification behavior is identified, corresponding to a diode performance.
FIG. 9(c) shows the linear plot of the rectification characteristic with the plot of calculated rectification ratio with respect to K thickness as an inset, according to an example embodiment.
FIG. 9(d) shows the rectification characteristic of the BP diode at an optimized gate voltage of −30 V in both logarithmic and linear scale, according to an example embodiment. The linear regime in the logarithmic plot indicates a near-unity ideality factor of 1.007, revealing a near-ideal diode performance.

On the basis of the giant n-doping nature of K, a spatially controlled K doping scheme was developed to fabricate p-n diode devices on a single BP flake. Prior to the K doping, half of the BP channel was masked by a photoresist layer using a second e-beam lithography (EBL) process, as will be described in more detail below, while leaving the other half exposed to surface dopants. The schematic illustration 900 and optical microscopy image 902 of the device structure are presented in FIG. 9(a). In order to generate a steep p-n homojunction between the capped and uncapped BP, 1.6 nm K was deposited onto the half-protected device for in situ electrical characterizations. FIGS. 9(b) and (c) exhibit the typical rectification characteristics ($I_{sd}$-$V_{sd}$) of BP diodes under gate voltages ranging from −10 V to −50 V (curves 911-919) with a step of 5 V in logarithmic and linear scale, respectively, according to example embodiments. It was observed that the current at negative bias rapidly dropped with increasing $V_g$ and then reached the minimum at −30 $V_g$; while the positive bias regime shows a much slower current decrease. This yields the remarkable increase of rectification ratio (defined by the ratio of the forward current to the reverse current at the same bias magnitude of 1V) as $V_g$ increased, which further achieves a maximum ratio of ~$10^4$ at $V_g$=−30 V, as plotted in the inset of FIG. 9 (c). Such gate-dependent rectification behavior reveals the tunable potential barrier built up cross the capped/uncapped BP boundary by the modulation of external electrostatic field. Similar to the previously reported BP diodes via surface doping[34, 35], the homojunction on the half-doped BP device experiences the transition from p-p junction, across p-n junction, and finally to n-n junction along with the positive $V_g$ sweeping.

By selecting the gate voltage of −30 V, the I-V output of the BP diode with optimized device performance is shown in FIG. 9(d), according to example embodiments. The reverse current is found to be <3 nA at $V_{sd}$=−1 V, representing the promising characteristics for low-power electronics. At forward bias, the BP diode was promptly switched on and obtains the on-current as high as 15 μA under 1 V $V_{sd}$, a hallmark of diode behavior. Furthermore, the logarithmic plot demonstrates an almost linear regime of current onset with the positive bias even extending to 0.2 V, making the diode characteristics fit for the Schokley model. Regardless of the parasitic resistance in the junction, the relationship between $I_{sd}$ and $V_{sd}$ across an ideal p-n diode can be expressed as the Schokley equation:

$$I_{sd} = I_S\left[\exp\left(\frac{eV_{sd}}{\eta k_B T}\right) - 1\right]$$

where $I_S$ is the saturation current, and η denotes the ideality factor. By linear fitting of the current onset in logarithmic scale, the ideality factor of the BP diode was determined to be 1.007. This near-unity ideality factor combined with the rectification ratio of ~$10^4$ suggests a near-ideal p-n diode established on the half-doped BP flake, arising from the giant built-in potentials across the p-n homojunction.

Figure 10:
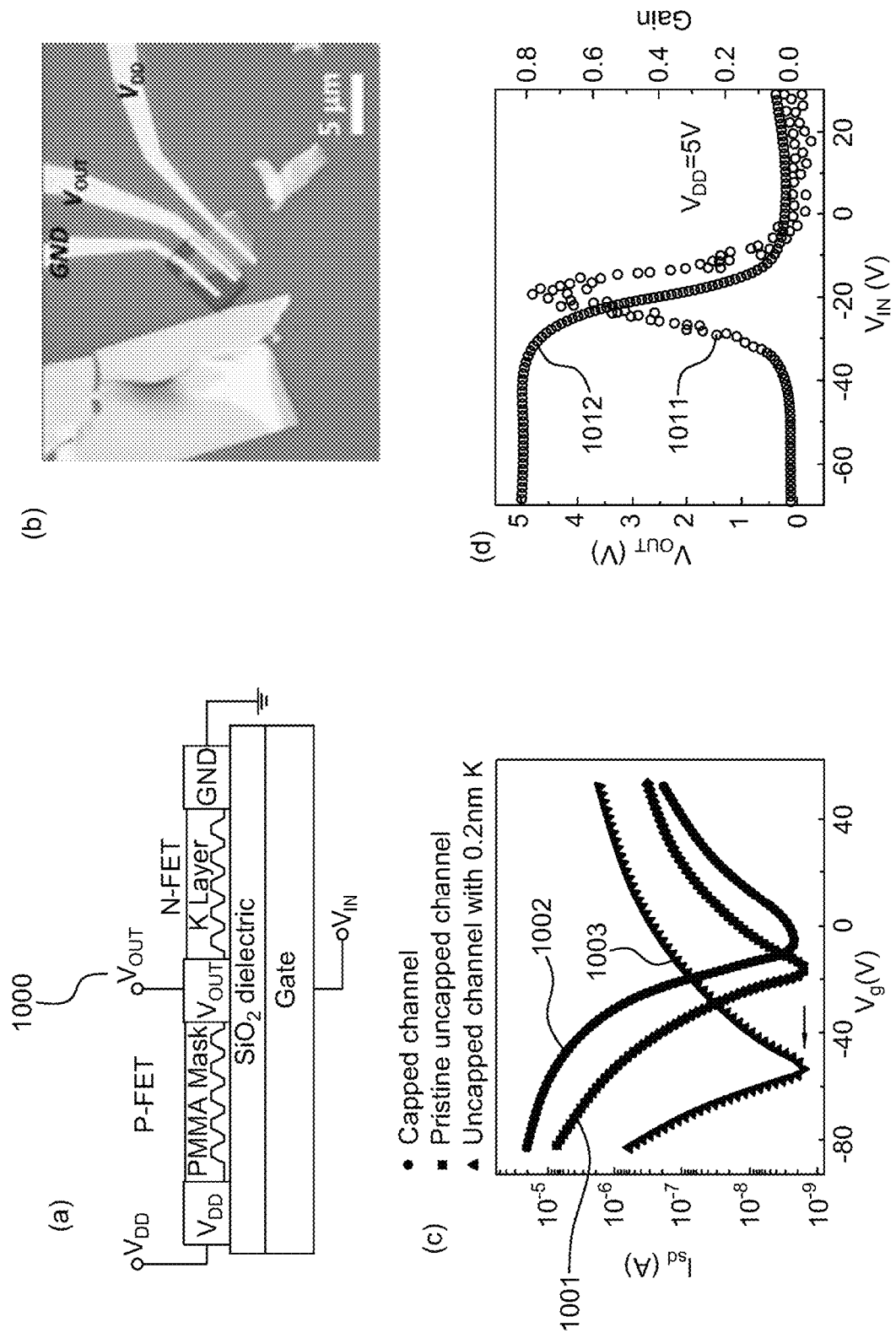
FIG. 10(a) shows a schematic of a device structure for BP-based logic invertors on an individual BP flake.
FIG. 10(b) shows the optical image of an as-made BP invertor with three planar electrodes that serve as $V_{DD}$, $V_{OUT}$ and ground, respectively, according to an example embodiment.
FIG. 10(c) shows the transfer characteristics of capped and uncapped BP channels in the BP invertor, according to an example embodiment. P- and N-FET were realized in the capped BP and uncapped BP with 0.2 nm K, respectively, facilitating the presence of inverted output in the pink-shaded region.
FIG. 10(d) shows the output characteristic and extracted gain of the BP invertor diode as a function of input voltage at VDD=5 V, according to an example embodiment. A highest gain of ~0.8 was obtained near −20 V VIN.

Using the similar method to fabricate the BP diode, the logic invertor device 1000 was also constructed on an individual BP flake via the integration of a K-doped BP FET with a pristine BP FET. FIG. 10(a) schematically shows the device structure with two different BP channels in series. One BP channel was capped by a photoresist mask, labeled as P-FET; while N-FET was realized in the uncapped channel by K doping. The input voltage $V_{IN}$ was applied to the back gate, and the three planar contacts sequentially served as ground GND, output $V_{OUT}$, and power supply $V_{DD}$, respectively, as exhibited in FIG. 10(b). The transfer characteristics of two parallel FETs on a single BP flake are illustrated in FIG. 10(c), according to an example embodiment. Prior to the K deposition, the uncapped FET shows a similar transport behavior (curve 1001) compared to the capped one (curve 1002), owing to the use of identical BP flake in the two FETs. After the deposition of 0.2 nm K, the transfer output of uncapped BP channel (curve 1003) shifted towards the negative $V_g$, accompanied by a highly improved electron transport. This leads to intersection of the n-branch of uncapped channel with the p-branch of capped channel in the pink-shaded region, where the conductance ratio between two channels were suddenly reversed, thus producing an inverted output signal $V_{OUT}$ as increasing input voltage $V_{IN}$. FIG. 10(d) exhibits the output characteristic (curve 1011) and obtained gain (curve 1012) of the BP invertor as a function of $V_{IN}$ at $V_{DD}$=5 V. In the first regime, with $V_{IN}$ between −70 to −40 V, the output voltage was in the "high" state that approaches the supply voltage 5V. When the input voltage increased from −40 to 0 V, the output voltage shows a transition from "high" to "low" state (~0 V) with a steep slope. The gain of the invertor, defined by the slope of output characteristics (G=$dV_{OUT}/dV_{IN}$), follows a Dirac-δ function like behavior with a highest value of ~0.8 occurring at the transection between the subthreshold regions of P-FET and N-FET. As the VIN further increased, the $V_{OUT}$ stayed steadily at the "low" state with near zero value. An ideal logic invertor should have an infinite gain that results from an immediate transition from "high" to "low" state. The low gain of BP invertor is mainly attributed to the utilization of 300 nm $SiO_2$ as gate dielectric in our FETs, which requires a large gate voltage to sufficiently tune the Fermi level of BP, thereby significantly limiting the subthreshold slope in both P-FET and N-FET. It is believed that using a thinner or high-k dielectric, like $HfO_2$ and h-BN, will improve the modulation efficiency of back gate and thus enhance the gain of the BP invertor.

In summary, this example clearly demonstrate a giant electron doping effect on few-layer BP FETs through in situ functionalization of potassium. K can significantly improve the electron transport of BP, resulting in the remarkable increase of electron mobility up to 260 $cm^2V^{-1}s^{-1}$ after the deposition of 1.6 nm K. In situ UPS and XPS measurements confirm the interfacial charge transfer occurring at K/BP interface. The giant vertical electrical field induced by K dopants apparently decreased the bandgap of BP, as extracted by FET measurements. Complementary devices were subsequently established on a single BP flake using a spatially controlled K doping scheme, realizing a near-ideal p-n diode with an ideality factor of 1.007 and rectification ratio of ~$10^4$ and a logic invertor with a highest gain of ~0.8 on the 300 nm $SiO_2$/Si substrate. The results promise a facile approach to dramatically electron dope few-layer BP, and thus effectively tailor its electron properties for the realization of high performance BP-based complementary electronic devices.

Sample Preparation and Device Fabrication in Example 4

Few-layer BP flakes were mechanically exfoliated from bulk BP crystals (Smart Elements) using a scotch tape, and subsequently transferred onto a degenerately p-type doped silicon substrate with 300 nm $SiO_2$ for the FET fabrication. After locating the exfoliated BP flake by a high-resolution optical microscope (Nikon Eclipse LV100D), polymethyl methacrylate (PMMA) photoresist was immediately spin coated on the substrate to protect BP from degradation in air. The conventional e-beam lithography (EBL) technique was subsequently employed to pattern the source and drain electrodes precisely on the BP flake, followed by the thermal evaporation of 5 nm Ti and 60 nm Au as metal contacts. After liftoff in acetone, the as-fabricated devices were wire-bonded onto a lead chip carrier for the FET measurements.

To build up the partially-masked BP devices, a second EBL process was applied on the two-terminal BP channel, followed by the liftoff step. PMMA photoresist also served as the capping layer to prevent half of the BP channel from K doping. The open window was carefully defined at the desired position of BP channel following a precise alignment procedure. The half-capped BP devices were also wire-bonded to a chip carrier before loading to the vacuum chamber.

In situ device characterization according to example embodiments, in example 4

All the as-made BP devices were loaded into a high vacuum system (~$10^{-8}$ mbar) for the in situ electrical characterizations, according to an example embodiment. The device measurements were carried out using an Agilent 2912A source measure unit at room temperature. Potassium sources were in situ evaporated from an alkali metal dispenser (SAES Getter) onto the devices under high vacuum conditions. The nominal thickness of K layers was calibrated by a quartz crystal microbalance (QCM) exactly located in front of the sample stage.

In Situ PES Characterization in Example 4

In situ UPS and XPS measurements on K-modified bulk BP were conducted in an ultrahigh vacuum chamber (~$10^{10}$ mbar) with He I (21.2 eV) and Mg Kα (1,253.6 eV) as excitation sources, respectively. By applying a sample bias of −5V, the sample work function was determined by the secondary electron cutoff at the low kinetic energy region. The Fermi level was calibrated to a sputter-cleaned Au-foil and the experiments were performed at room temperature. The nominal thickness of in situ deposited K layers was estimated by measuring the attenuation of P 2p peak before and after K deposition and further calibrated by QCM.

In situ ARPES measurements were carried out in a ultrahigh vacuum system with a differentially-pumped UVS300 helium discharge lamp (SPECS GmbH) as the light source, which provides monochromatized photon beam with the energy of 21.2 eV (He I), through a toroidal mirror monochromator (SPECS GmbH). Detection was done by a PHOIBOS 150 hemispherical energy analyzer (SPECS, GmbH) equipped with a 3D delay line detector (3D-DLD, SPECS GmbH). The Fermi level was calibrated to Au and the experiments were performed in a chamber of base pressure better than $8\times10^{-10}$ mbar.

Example 5: Oxygen Induced Strong Mobility Modulation in Few-layer Black Phosphorus Two-dimensional black phosphorus configured field-effect transistors generally show a hole-transport-dominated ambipolar characteristic, owing to the severely restricted electron mobility by air ambient. Using the system and methods according to example embodiments the strongly modulated mobility of few-layer black phosphorus in contact with oxygen is demonstrated. Pure oxygen exposure can dramatically decrease the electron mobility of black phosphorus by over three orders of magnitudes without degrading the hole transport. In situ X-ray photoelectron spectroscopy characterization reveals the physisorption nature of oxygen on black phosphorus. Density functional theory calculations identify the unoccupied states of molecular oxygen physisorbed on few-layer black phosphorus, that serves as electron trap but not as hole trap, consistent with the aforementioned mobility modulation. In contrast, oxygen exposure upon light illumination exhibits a significant attenuation for both electron and hole transport, originating from the photoactivated oxidation of black phosphorus, as corroborated by in situ X-ray photoelectron spectroscopy measurements. The findings clarify the predominant role of oxygen in modulating transport properties of black phosphorus, thereby providing deeper insight to the design of black phosphorus based complementary electronics. Black phosphorus (BP), as a fast-emerging two-dimensional (2D) material, stands out from other members in the 2D family such as graphene[41, 42] and transition metal dichalcogenides (TMDs)[3], and attracts substantial research interests attributed to its remarkably unique fundamental properties and versatile device applications[44-6]. Few-layer BP sheet can be exfoliated from layered BP crystals, where each phosphorus atom is covalently bonded to three neighboring atoms to form a puckered orthorhombic structure[47-9]. BP is featured by a thickness-dependent direct band gap, ranging from ~0.3 eV for bulk to ~2 eV for monolayer[410-12], leading to great potential applications of BP based optoelectronic devices. Moreover, highly anisotropic electronic and optoelectronic characteristics also distinguish BP from most of materials in the 2D family[412, 413].

The inherent sizeable band gap enables ultrathin BP to be configured as field-effect transistor (FET) devices, showing an ambipolar transport characteristic with high charge carrier mobility up to ~1000 cm$^2$V$^{-1}$s$^{-1}$ and on/off ratio of ~10$^5$ at room temperature[A14-17]. However, the BP based FETs fabricated in air exhibit significant asymmetry between electron and hole transport, where both electron mobility and concentration are orders of magnitudes lower than the hole side, thus seriously limiting its applications in complementary logic electronics. In order to effectively improve the electron transport of BP devices, several approaches have been utilized such as selection of proper metal contacts[A18, A19] and surface transfer doping[A20] on BP flakes. Recently, R. A. Doganov et. al report greatly enhanced electron transport of pristine few-layer BP channels that are passivated by hexagonal boron nitride in inert atmosphere, compared to the unpassivated BP channel exposed to air[A21]. This surface passivation can lead to the symmetric electron and hole transport behavior of BP, which indicates that air exposure plays a dominant role in decreasing the electron mobility. Nevertheless, the key factors in air to modulate BP transport properties are still unclear and less understood. A comprehensive spectroscopic investigation (e.g. Raman spectroscopy) has been recently implemented to determine the origin of BP degradation in controlled ambient conditions[A22], which reveals the photoinduced oxidation by aqueous oxygen. However, controlled experiments in different ambience have not yet been conducted from FET device perspective. A deeper understanding of how air components (e.g. oxygen) impact on the BP device performance is quite necessary for BP applications in complementary electronics.

Figure 11:
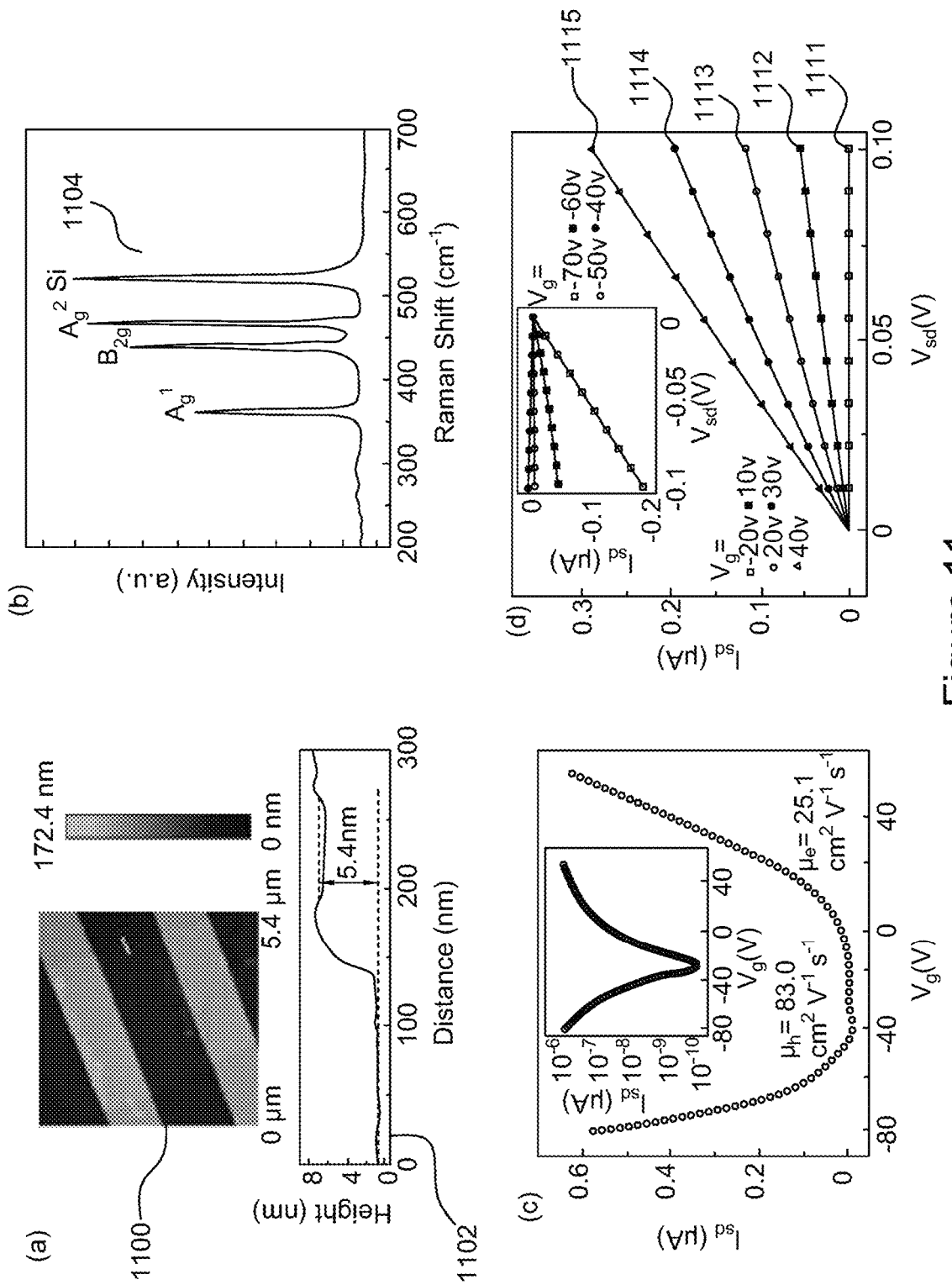
FIG. 11(a) shows an AFM image of an as-made BP back-gated FET device and a line profile indicating a multilayer BP flake of ~5.4 nm (~10 layers).
FIG. 11(b) shows a Raman spectrum of the BP flake used for device fabrication.
FIG. 11(c) shows the transfer characteristics ($I_{sd}$-$V_g$) of a BP FET device at $V_{sd}$=0.1 V with a logarithmic plot of the transfer curve as an inset, according to an example embodiment. The transfer plot demonstrates a symmetric ambipolar transport characteristic with the hole and electron mobility of 83.0 cm$^2$V$^{-1}$s$^{-1}$ and 25.1 cm$^2$V$^{-1}$s$^{-1}$, respectively.
FIG. 11(d) shows $I_{sd}$-$V_{sd}$ characteristics ($V_{sd}$ from 0 V to 0.1 V) of the same device with increasing gate voltages from −20 V to 40 V with $I_{sd}$-$V_{sd}$ plot with $V_{sd}$ from 0 V to −0.1 V as function of $V_g$ from −40 V to −70 V as an inset, according to an example embodiment.

Using the system and methods according to example embodiments it is demonstrated that the oxygen (O$_2$) induce significant mobility modulation in few-layer BP FET devices. Upon O$_2$ exposure, the electron transport of BP devices is dramatically suppressed, exhibiting a decrease of mobility by over three orders of magnitudes; while the hole mobility of BP is nearly retained. The physisorption of O$_2$ on BP is clarified by in situ X-ray photoelectron spectroscopy (XPS) investigation. Density functional theory (DFT) calculations illustrate the unoccupied states of physisorbed O$_2$ on BP, giving rising to the electron trapping in BP channels. On the other hand, O$_2$ exposure under light illumination initiates chemical oxidation of BP, which shows the significant mobility decrease for both electron and hole transport. In situ XPS characterization further confirms the photoinduced oxidation of BP. Ultrathin BP flakes were exfoliated from bulk BP crystals and transferred onto heavily p-doped silicon substrate coated with 300 nm SiO$_2$, and subsequently configured as two-terminal FET devices for controlled experiments in ambient conditions. FIG. 11(a) displays a typical atomic force microscopy (AFM) image 1100 of as-fabricated BP devices. The line profile 1102 reveals the BP flake thickness of ~5.4 nm, which corresponds to ~10 atomic layers considering ~0.53 nm interlayer distance in BP crystal. Raman spectrum 1104 of the exfoliated few-layer BP (FIG. 11(b)) demonstrates the characteristic peaks nearly located at 364, 438 and 465 cm$^{-1}$, corresponding to the three dominant Raman-active vibration modes of BP, labeled as A$_g^1$, B$_{2g}$ and A$_g^2$, respectively[22, 23]. The substrate Si peak is also labelled in FIG. 11(b).

All the electrical characterizations of as-made BP devices were carried out in high vacuum conditions (~10$^{-8}$ mbar) using the system and methods according to example embodiments. FIG. 11(c) exhibits the typical transfer characteristic (I$_{sd}$-V$_g$) of fabricated BP FETs at V$_{sd}$=0.1 V. By applying gate voltage ranging from −80 V to 55 V, the source-drain current increased from OFF to ON state for both negative and positive sweeping, corresponding to the hole and electron transport, respectively. Furthermore, unlike the BP devices usually fabricated in air, the on-current of electron transport reached the same order of magnitude as that of hole transport, revealing a symmetric ambipolar transport characteristic. The key treatment to obtain such transport behavior is a pre-annealing process of the as-fabricated devices in inert Argon (Ar) gas filled glove box at 120° C. for more than 30 mins, which will be described in more detail below. After annealing, BP devices show the more balanced ambipolar behaviors, mainly resulting from the partial desorption of adsorbed air species (e.g. oxygen) on BP surface. Additionally, the inset logarithmic plot shows the current on/off ratio of ~10$^4$, in good agreement with previous reports[A13-16]. Extracted from the linear regime of transfer plot, the field-effect mobility of BP flake can be evaluated via the formula below[14, 20]:

$$\mu = \frac{L}{WC_iV_{sd}} \frac{dI_{sd}}{dV_{sd}} \tag{1}$$

where dI$_{sd}$/dV$_g$ represents the slope of the linear region in transfer characteristic, C$_i$ is the capacitance per unit area between BP and back gate given by C$_i$=ε$_0$ε$_r$/d (ε$_r$ and d are the dielectric constant and thickness of SiO$_2$, respectively), and L, W are the length and width of conduction channel, respectively. For the device in FIG. 11(c), the hole and electron mobility were estimated to be on the same order, approximately 83.0 cm$^2$V$^{-1}$s$^{-1}$ and 25.1 cm$^2$V$^{-1}$s$^{-1}$, respectively. The source-drain current versus source-drain voltage characteristics (I$_{sd}$-V$_{sd}$) of the same device, as shown in FIG. 11(d), possess excellent linearity for V$_{sd}$ sweeping from 0 V to both 0.1 V and −0.1 V at different V$_g$ (curves 1111-1115), revealing good ohmic contacts between BP and metal electrodes.

Figure 12:
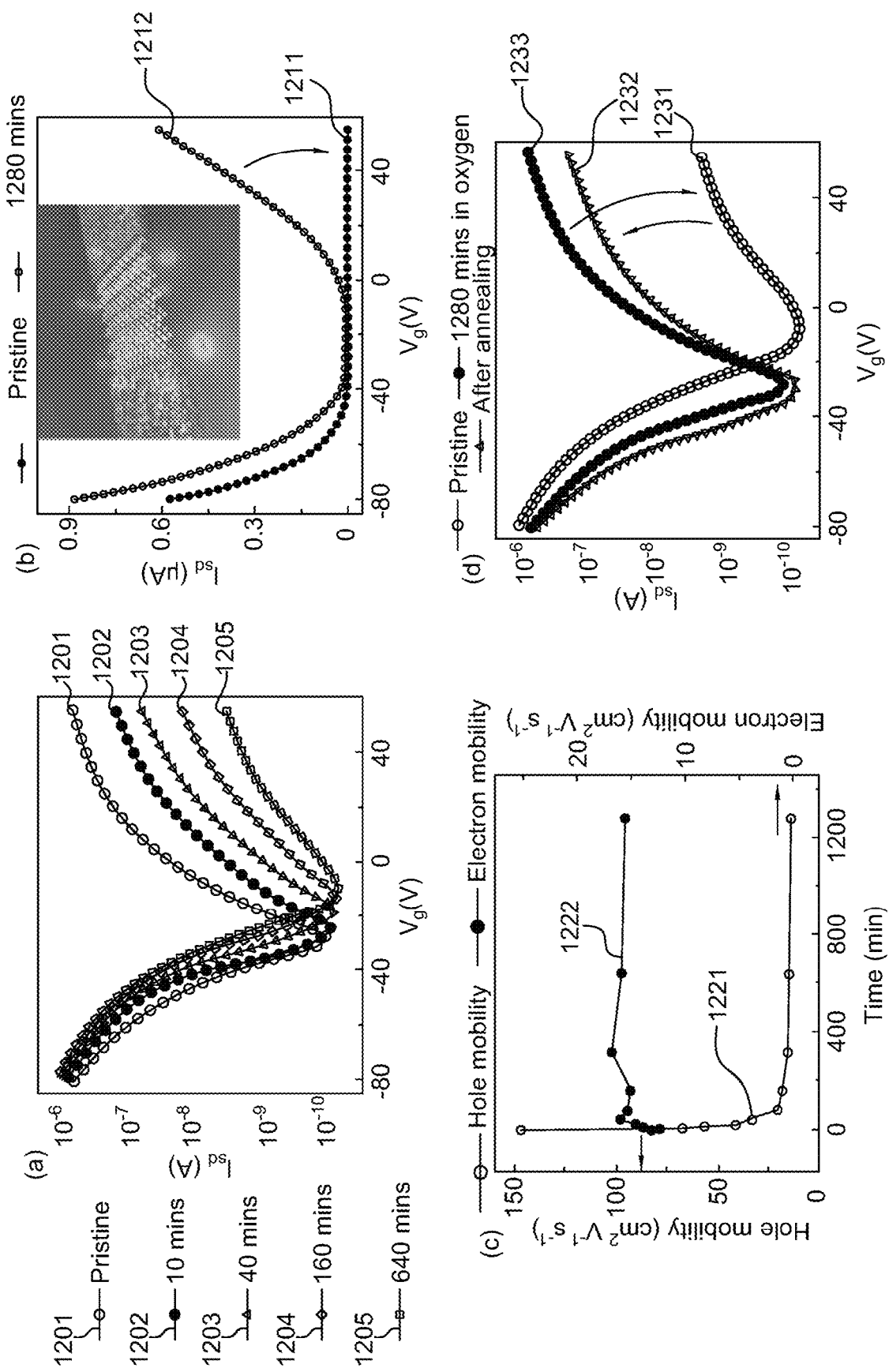
FIG. 12(a) shows the transfer characteristics (Vg from −80 V to 55 V) evolution of a BP FET measured at $V_{sd}$=0.1 V in logarithmic scale with increasing O$_2$ exposure time from 0 to 640 mins, according to an example embodiment.
FIG. 12(b) shows a linear plot of the transfer characteristic upon 1280 mins exposure with respect to the pristine BP, according to an example embodiment.
FIG. 12(c) shows the plot of extracted electron and hole mobility as a function of exposure duration, according to an example embodiment. The electron mobility of the BP device is dramatically decreased from 25.1 cm$^2$V$^-$s$^{-1}$ to 0.09 cm$^2$V$^{-1}$s$^{-1}$; while the hole mobility nearly remained at ~100 cm$^2$V$^{-1}$s$^{-1}$.
FIG. 12(d) shows a logarithmic plot of the transfer curve after annealing compared to pristine and 1280 mins exposed curves, according to an example embodiment.

In order to explore how the adsorbed oxygen influences the transport behavior of BP, fabricated BP FET devices were sequentially exposed to purified oxygen at atmospheric pressure within the chamber according to an example embodiment, and subsequently evacuated to high vacuums condition for electrical characterizations. FIG. 12(a) demonstrates the typical transfer characteristics evolution of BP devices in logarithmic scale with respect to O$_2$ exposure time (curves 1201-1205). The initial transfer curve shows a current minimum nearly located at −27 V. After 640 mins O$_2$ exposure, this minimum gradually shifted along the positive gate voltage to ~−10 V. This suggests a slight p-type doping effect of O$_2$ on BP flake. The carrier concentration of BP induced by a particular V$_g$ in linear region was estimated with respect to the exposure time. More importantly, the on-current of electron transport in BP was dramatically decreased with increasing exposure time, in particular, by almost three orders of magnitudes after 640 mins exposure; while the hole transport was nearly reserved. This giant attenuation of electron transport with non-degraded hole transport is also clearly illustrated in FIG. 12(b), which displays the transfer curve 1211 in linear scale after 1280 mins exposure along with that of the pristine BP (curve 1212). The calculated electron (curve 1221) and hole (curve 1222) mobility of BP were plotted as a function of exposure time in FIG. 12(c). The electron mobility sharply reduced from 25.1 cm$^2$V$^{-1}$s$^{-1}$ to 0.09 cm$^2$V$^{-1}$s$^{-1}$ by over three orders of magnitudes after 1280 mins O$_2$ exposure; while the hole mobility almost remained unchanged at ~100 cm$^2$V$^{-1}$s$^{-1}$. It is worth noting that the slight increase of hole mobility at the beginning of $O_2$ exposure is mainly ascribed to the insufficient back gate voltage that cannot fully drive the BP device to the linear hole transport regime, thereby limiting the extracted hole mobility at initial exposure stage. In addition, as the 1280 minutes $O_2$ exposed device is further annealed in an Ar-filled glove box, it was found that the electron transport of BP was remarkably improved (compare curves 1231 and 1232 in FIG. 12(*d*)), and almost returned to the pristine state (curve 1233) with the electron mobility of 6.2 $cm^2V^{-1}s^{-1}$. This nearly reversible transfer characteristic of BP suggests that $O_2$ molecules were physically adsorbed on BP surface[424, 425].

Figure 13:
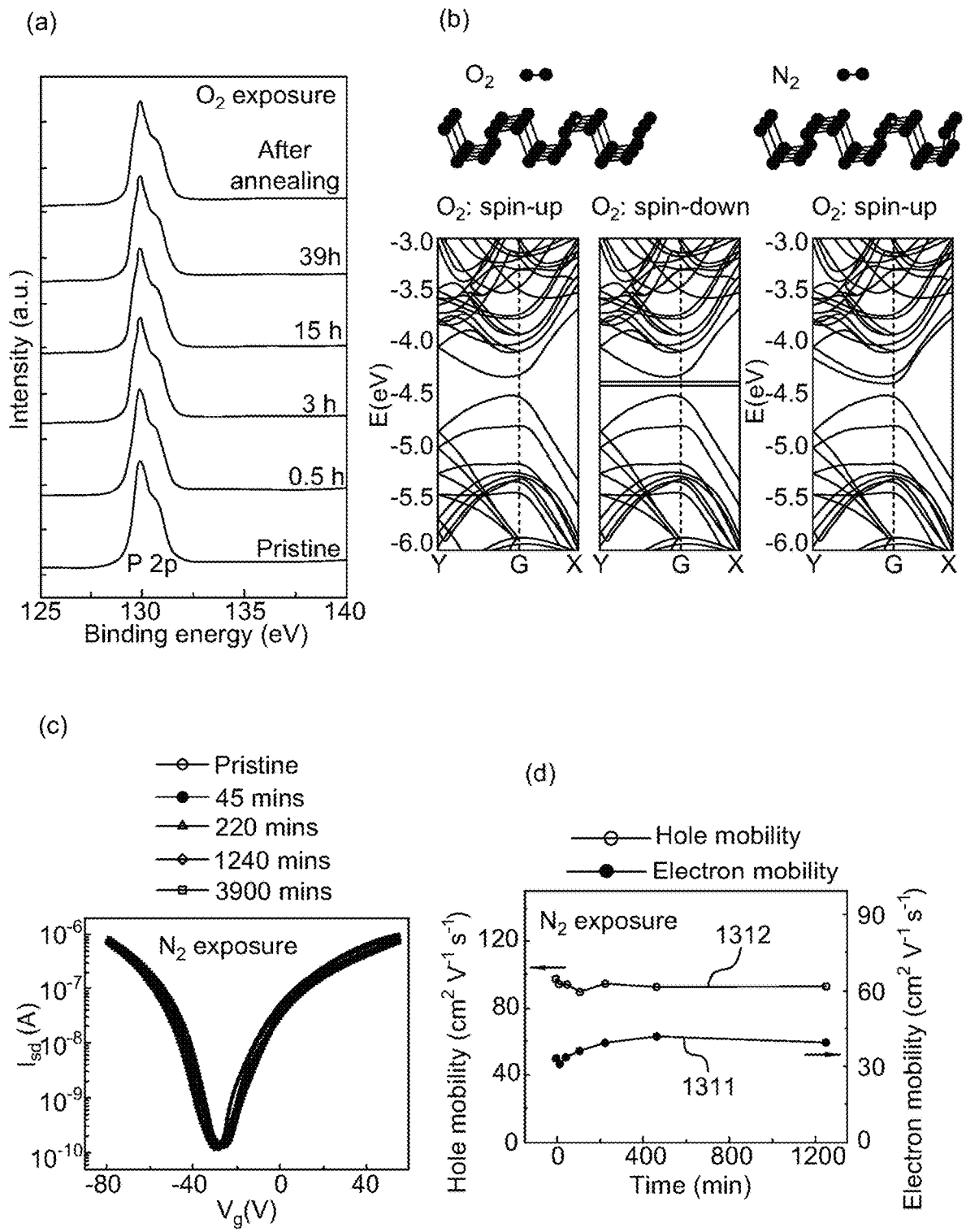
FIG. 13(a) shows the P 2p core level XPS spectra evolution of BP as a function of O$_2$ exposure for physisorption of oxygen on BP time in dark conditions.
FIG. 13(b) shows the DFT calculated band structures of BP with physisorbed oxygen and nitrogen. The coordinates of the physisorbed molecules are illustrated. Calculated band structures for oxygen spin-up and spin-down configurations are shown. As nitrogen is a spin-zero system, the spin-averaged band structure is shown. The shaded area represents the bands of pristine BP.
FIG. 13(c) shows the Logarithmic transfer characteristics evolution (at $V_{sd}$=0.1 V) of a BP device with respect to N2 exposure time, according to an example embodiment.
FIG. 13(d) shows the calculated electron and hole mobility versus exposure time, according to an example embodiment.

In situ X-ray photoelectron spectroscopy characterizations were carried out on $O_2$ exposed bulk BP to further reveal the physisorption nature of oxygen on BP. FIG. 13(*a*) demonstrates the evolution of P 2p core level XPS spectra of bulk BP as a function of $O_2$ exposure time in dark conditions. Pristine BP exhibits a single 2p peak with spin-orbit split located at the binding energy of ~130 eV, consistent with previous XPS measurements[426-28]. During $O_2$ exposure under atmospheric pressure, no obvious change in the evolution of P 2p peak was observed, as well as the appearance of phosphorus oxide related peaks with the binding energy of ~134-135 eV[426, 429, 430]. This clearly excludes the possibility of oxygen chemisorption or oxidation of BP. Having established that the system in cause is physisorbed oxygen, density functional theory was used to investigate its properties. In the optimized geometry, the physisorbed oxygen molecule sits at 2.96 Å from the top ridge of phosphorene. The calculated binding energy is 80 meV, which is in the expected range of energies for physisorption within the PBE approximation. The physisorbed oxygen molecule is most stable in the paramagnetic spin-1 state, just as isolated oxygen. The calculated band structures are illustrated in FIG. 13(*b*). Oxygen molecules have a triplet electronic ground state, while the spin-up occupied state lies below the valence band top, and the spin-down unoccupied state ($\pi^*$) lies in the gap, with the double degeneracy lifted by the crystal field of BP. This is similar to the oxygen adsorption on graphene and carbon nanotubes[31]. The calculated electron affinity of physisorbed oxygen, obtained from the difference between the total energies of the neutral and negatively charged systems, is very close to that of pristine BP with a thickness of four layers. Thus, the physisorbed $O_2$ molecules can serve as electron trapping centers to scatter negative charge carriers during electrical transport, thus resulting in the severely reduced electron mobility. However, as the gap states are unoccupied the scattering of holes is minimal, as found experimentally. In addition, the pristine BP FET showed an evident hysteresis loop in the transfer characteristic via forward and backward gate sweeping, which suggests the presence of intrinsic charge trapping sites in BP. Oxygen exposure induced apparently larger hysteresis, mainly arising from the increased density of trapping sites due to the oxygen adsorption.

As a comparison, BP based FETs were also exposed to nitrogen ($N_2$). In sharp contrast to the $O_2$ case, $N_2$ exposure did not induce any obvious change in transfer curves of BP FETs with increasing exposure time, as shown in FIG. 13(*c*), thereby giving rise to the almost retained electron (curve 1311) and hole (curve 1312) mobility upon $N_2$ exposure (FIG. 13(*d*)). This is easily understood by verifying that the band structure of $N_2$ on BP shows no gap levels (shown in FIG. 13(*b*)), in contrast with oxygen, because the $N_2$ highest occupied and lowest unoccupied molecular orbitals are resonant with the conduction and valence bands, respectively. However, due to the added screening by charge density of the adsorbed molecule, the band gap of the BP is slightly decreased. This result explains the contrast between the cases of nitrogen and oxygen adsorption, and why the later plays a predominant role in attenuating the electron transport of BP devices.

Figure 14:
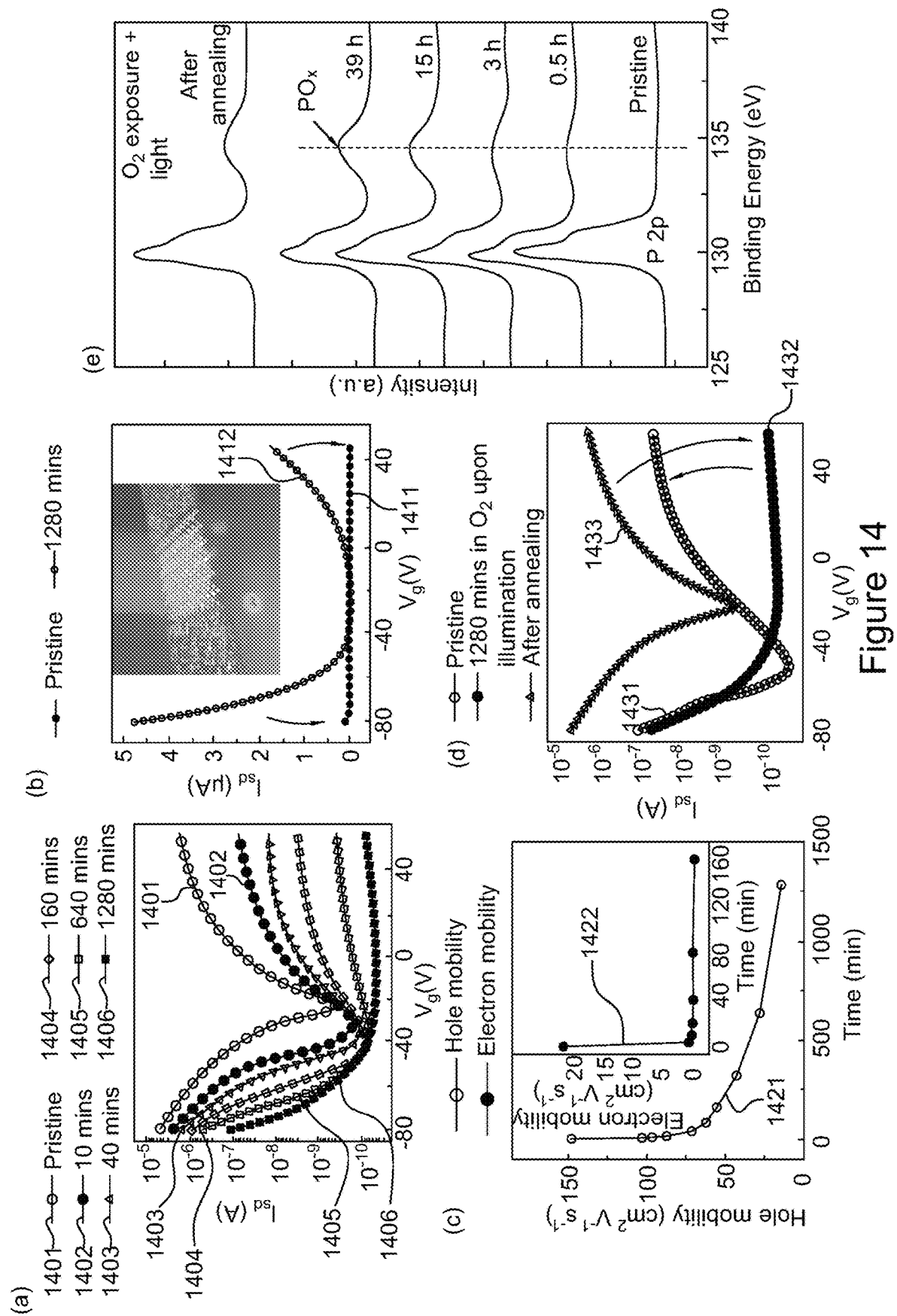
FIG. 14(a) shows the transfer characteristics evolution (at $V_{sd}$=0.1 V) of a BP FET in logarithmic scale as a function of O$_2$ exposure upon the illumination of a 515 nm laser (~1.5 Wcm$^{-2}$), according to an example embodiment.
FIG. 14(b) shows the linear transfer plot of 1280 mins exposure with respect to the pristine BP, according to an example embodiment.
FIG. 14(c) shows the extracted electron and hole mobility versus exposure time, according to an example embodiment.
FIG. 14(d) shows the plot of the transfer curve after annealing in logarithmic scale with respect to pristine and 1280 mins exposed curves, according to an example embodiment.
FIG. 14(e) shows the evolution of P 2p core level XPS spectra of illuminated BP upon O$_2$ exposure.

Inspired by recently proposed photoinduced oxidation of BP in air[22], controlled $O_2$ exposure experiments on BP devices were conducted under visible light illumination, according to example embodiments. Similar to the $O_2$ exposure case without illumination, the typical transfer characteristics evolution (curves 1401-1406) of illuminated BP devices as a function of exposure time is displayed in FIG. 14(*a*). Here, a 515 nm laser light source with a power intensity of ~1.5 $Wcm^{-2}$ was used to irradiate the BP device, according to an example embodiment. The transfer curve of the illuminated BP devices shows a much faster decrease of electron transport current than the $O_2$ exposed devices without illumination (compare e.g. FIG. 12(*a*)), e.g. by four orders upon 640 mins exposure. Surprisingly, the on-current of hole transport was also largely reduced by almost two orders of magnitudes after 1280 mins exposure, in sharp contrast to the intact hole transport in the $O_2$ exposed BP devices without illumination. The transfer curve 1411 in linear scale of 1280 mins exposure was plotted with respect to the pristine BP device (curve 1412) in FIG. 14(*b*), further illustrating the significant suppression for both electron and hole transport. In FIG. 14(*c*), the hole mobility (curve 1421) of the BP device progressively degraded from 147.0 $cm^2V^{-1}s^{-1}$ to 14.5 $cm^2V^{-1}s^{-1}$ by one order of magnitude upon 1280 mins exposure; while the electron mobility (curve 1422) sharply dropped from 21.4 $cm^2V^{-1}s^{-1}$ down to a negligible value of ~0.007 $cm^2V^{-1}s^{-1}$ even under 160 mins exposure. Further annealing process partially improved the electron transport (curve 1431) of BP device thus reaching the electron mobility of ~0.4 $cm^2V^{-1}s^{-1}$, as shown in FIG. 14(*d*) with the curve 1432 of the 1280 minutes exposed, under illumination, BP device and the curve 1433 for the pristine BP device; while the hole transport remained at the same current level. Such irreversible transport behavior differs highly from the previous $O_2$ exposure without illumination case, and most likely originates from the photoinduced oxidation of BP. Moreover, the hysteresis of illuminated BP FET was significantly enlarged after $O_2$ exposure under illumination, demonstrating the strongly increased charge trapping sites in oxidized BP.

The light-induced oxidation mechanism of few-layer BP can be expressed as follows:

$$BP + h\nu \rightarrow BP^* \qquad (2)$$

$$BP^* + O_2 \rightarrow O_2^- + BP + h^+ \rightarrow PO_x \qquad (3)$$

In equation (2), incident visible light with the photon energy exceeding the BP band gap produces excitons and hence photoinduced electron and hole pairs in BP flake. As shown in equation (3), the adsorbed oxygen molecules can trap those photogenerated electrons to form intermediate superoxide anions, $O_2^-$. The $O_2^-$ and remained photogenerated holes can further induce the oxidation of BP and lead to the formation of phosphorus oxide species, labeled as $PO_x$.

The photoinduced oxidation of BP was further confirmed by in situ XPS investigations. In contrast to the P 2p spectra evolution of BP upon $O_2$ exposure without illumination, light illumination in $O_2$ clearly led to the oxidation of BP with a gradual appearance of a phosphorus oxide related peak at the binding energy of ~134.5 eV, as presented in FIG. 14(e). The intensity of such PDX peak progressively increased with the increased $O_2$ exposure and light illumination time. Upon annealing in ultra-high vacuum conditions at 120° C., phosphorus oxide peak nearly remained, revealing the robust and irreversible nature of the photoinduced oxides of BP. The results suggest that it is quite necessary to avoid light irradiation for BP devices kept in air ambient in order to ensure their high quality and stability.

The effect of oxygen on modulating the mobility of few-layer BP was clearly demonstrated using the system and methods according to example embodiments. Oxygen exposure dramatically decreases the electron mobility of BP by over three orders of magnitudes, and meanwhile retains a non-degraded hole transport, which is explained by the fact that the lowest unoccupied states of the paramagnetic $O_2$ molecule lie in the band gap of BP, serving as electron traps, as found by DFT calculations. In contrast, light illumination in oxygen causes the oxidation of BP and significant attenuation for both electron and hole transport in BP FETs. The results reveal the predominant role of oxygen in modulating the transport characteristics of BP, thereby facilitating the design of BP based complementary electronic and optoelectronic devices towards practical applications.

Methods in Example 5

Few-layer BP flakes were mechanically exfoliated from bulk BP crystals (Smart Elements) onto a degeneratively p-type doped silicon substrate with 300 nm $SiO_2$ using a scotch tape in air. After locating the exfoliated BP flake via a high resolution optical microscope (Nikon Eclipse LV100D), polymethyl methacrylate (PMMA) photoresist was immediately spin coated on the substrate to protect BP from degradation in air. The conventional e-beam lithography technique was subsequently utilized to pattern the source and drain electrodes precisely on the BP flake, followed by the thermal evaporation of 5 nm Ti and 80 nm Au as metal contacts. After liftoff in acetone, the as-fabricate devices were wire-bonded onto a lead chip carrier. The bonded devices were loaded into an Argon gas filled glove box ($O_2$ and $H_2O<0.2$ ppm) and subsequently annealed on a hot plate at 120° C. for more than 30 mins. The annealed devices were then loaded into a high vacuum system (~$10^{-8}$ mbar) for electrical measurements, according to example embodiments.

FET characterizations were implemented in a high vacuum chamber using an Agilent 2912A source measure unit at room temperature, according to example embodiments. Highly purified $O_2$ or $N_2$ (>99.99%) gas can be introduced into the vacuum chamber through a carefully pumped gas line system. A 515 nm laser light source with the output power of ~11.8 mW (spot diameter ~0.5 mm) was employed to illuminate the sample through a quartz viewport exactly located on top of BP devices. The annealing process of $O_2$ exposed BP devices was conducted in an Ar filled glove box at 120° C. for more than 30 mins.

AFM scans of as-made devices were performed in a class 1,000 clean room with controlled humidity of ~50% using a Bruker Dimension FastScan microscope in tapping mode. Raman spectroscopy measurements were also conducted in clean room via a backscattering configuration using a 532 nm laser as excitation source.

XPS measurements on $O_2$ exposed bulk BP were carried out in an ultrahigh vacuum chamber ($10^{-10}$ mbar) with Mg Kα (1253.6 eV) as excitation sources. Oxygen exposure was undertaken in a load lock chamber with a quartz viewport, and a 532 nm high-power light emitting diode (LED) source of ~1.7 W was used for light illumination (~1 cm×1 cm spot).

The density functional theory calculations were performed using the SIESTA package[432,433]. The generalized gradient approximation of Perdew, Burke and Ernzerhof is used for the exchange-correlation functional[434]. The electronic core is accounted for by using ab-initio norm-conserving pseudopotentials with the Troullier-Martins parameterization[435] in the Kleinman-Bylander form[436]. The basis sets for the Kohn-Sham states are linear combinations of numerical atomic orbitals (double zeta polarised basis)[437,438]. The charge density is projected on a real-space grid with an equivalent cutoff energy of 250 Ry to calculate the exchange-correlation and Hartree potentials. A supercell containing four-layers of phosphorene was used to model the BP surface. A Monkhorst-Pack[439] scheme with 4×4×1 points is used to sample the Brillouin Zone.

Example 6: Largely Enhanced Optoelectronic Performance of Tungsten Diselenide Phototransistor Via Surface Functionalization Two-dimensional (2D) layered transition metal dichalcogenides (TMDs) have attracted enormous research interests and efforts towards versatile electronic and optical devices, owing to their extraordinary and unique fundamental properties and remarkable prospects of nanoelectronic applications. Among TMDs, tungsten diselenide ($WSe_2$) possesses the tunable ambipolar transport characteristics and superior optical properties, e.g. high quantum efficiency. Using the system and methods according to example embodiments, a significant device performance enhancement of $WSe_2$ phototransistor through surface functionalization with cesium carbonate ($Cs_2CO_3$) is demonstrated. $WSe_2$ was found to be strongly electron doped with $Cs_2CO_3$ modification. The electron mobility of $WSe_2$ was remarkably enhanced by almost one order of magnitude after 1.6 nm $Cs_2CO_3$ decoration. Furthermore, the $WSe_2$ based phototransistors exhibit dramatic photocurrent increase by nearly three orders of magnitude with the deposition of 1.6 nm $Cs_2CO_3$. In situ photoelectron spectroscopy characterization confirms the significant surface charge transfer occurring at the $Cs_2CO_3$/$WSe_2$ interface. The findings coupled with the tunable nature of surface transfer doping scheme ensure $WSe_2$ to be a promising candidate for future 2D materials based optoelectronics.

The graphene [B1] boom sets off rising research interests on two-dimensional (2D) materials, among which the layered 2D transition metal dichalcogenides (TMDs) have been considered as promising building blocks for the next generation nanoscale electronic and optoelectronic devices owing to their abundant and unique properties [B2-8]. Compared with silicon that has been pushed to its scaling limit in modern semiconductor industry, 2D TMDs exhibit high immunity to a short channel effect arising from its van der Waals epitaxial structure, thereby providing the possibility for achieving ultra-scaled transistors in highly integrated circuits [B9]. Unlike graphene with zero bandgap, TMDs possess a sizeable layer-dependent bandgap ranging from 1.2 eV to 1.8 eV, in some cases experiencing a transition from indirect bandgap in the bulk to direct bandgap in monolayer, suggesting their potential applications in both logic electronics and functional optoelectronic devices [B10,B11]. Molybdenum disulphide ($MoS_2$), as the most studied TMD material, mostly exhibits an unipolar n-type transport characteristics due to the pronounced Femi level pinning effect at metal contact/MoS$_2$ interface [B12]. Compared to MoS$_2$, another member in TMD family tungsten diselenide (WSe$_2$) can achieve electron-dominated, ambipolar, and hole-dominated transport behaviors by simply choosing a suitable contact metal [B13,B14] and the number of layers [B15]. Moreover, superior optical properties, such as high quantum efficiency of luminescence, also make WSe$_2$ stands out from TMD family [B16-18].

Surface transfer doping, as a simple and effective doping scheme, has been extensively utilized to manipulate the electronic properties of 2D materials [B19-22] as well as organic semiconductors [B23-26]. Compared to the electrostatic modulation via an external electrical field [B17,B27], surface transfer doping usually provides a stronger non-volatile doping capability with the ease of device fabrication [B19,B21]. Surface transfer doping depends on the interfacial charge transfer without introducing significant defects into the lattice structure of the as-doped materials, thus nearly reserving their fundamental transport properties. Recently, a variety of species has demonstrated excellent surface doping effects on WSe$_2$, thereby effectively modulating its electronic and optoelectronic [B22,B28-34] properties. The field-effect transistor (FET) device performance of WSe$_2$ can be remarkably enhanced by contact doping methods [B28-30]. Moreover, solution processed organic polymers provide an effective doping effect to enhance the optoelectronic performance of WSe$_2$ based photodetectors [B32-34]. However, air ambients as well as solution process induced residues may contaminate the interface between surface dopants and WSe$_2$, thus severely altering the interfacial interaction as well as device performance after surface functionalization. Thus, a more controllable and clean surface doping technique is highly desired for the development of WSe$_2$ based optoelectronics.

Using the system and methods according to example embodiments, an in situ surface modification technique is demonstrated to largely enhance the optoelectronic performance of WSe$_2$ phototransistor, through the deposition of cesium carbonate (Cs$_2$CO$_3$) in vacuum, a strong electron donor that has been widely used in organic electronics [B23-26]. Cs$_2$CO$_3$ was found to significantly n-type dope WSe$_2$. The electron mobility of WSe$_2$ was largely increased by nearly one order of magnitude with 1.6 nm Cs$_2$CO$_3$ coating, revealing a highly improved electron transport in WSe$_2$ channel. More importantly, the photodetecting behaviors of WSe$_2$ were also dramatically enhanced after Cs$_2$CO$_3$ modification, e.g. photoresponsivity and external quantum efficiency (EQE) of WSe$_2$ were increased by nearly three orders of magnitudes to ~575 AW$^{-1}$ and ~1500% after 1.6 nm Cs$_2$CO$_3$ decoration. In situ ultraviolet photoelectron spectroscopy (UPS) and X-ray photoelectron spectroscopy (XPS) characterization further reveal the interfacial charge transfer between Cs$_2$CO$_3$ and WSe$_2$.

Characterizations of WSe$_2$ FET devices in example 6.

Figure 15:
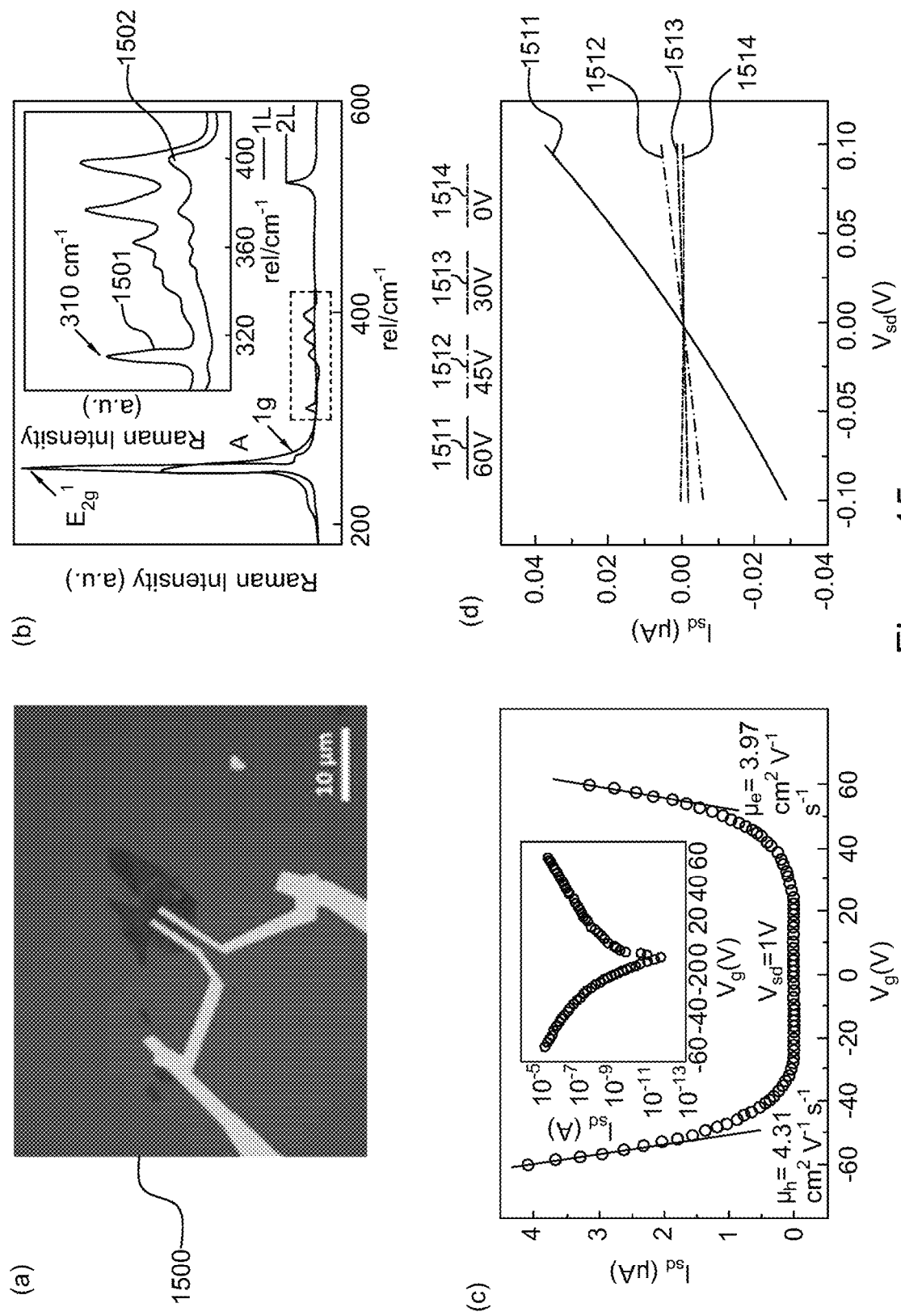
FIG. 15(a) shows an optical microscope image of an as-fabricated Back-gated WSe$_2$ field effect transistor.
FIG. 15(b) shows Raman spectra of the exfoliated WSe$_2$ flakes with magnified spectra in the box as an inset. $^1$B2g Raman mode emerges at 310 cm−1, indicating the bilayer nature of WSe$_2$ in the fabricated device.
FIG. 15(c) shows the transfer characteristics ($I_{sd}$-$V_g$) of the same device with $V_{sd}$=1 V with the logarithmic plot of the transfer curve as an inset, according to an example embodiment. $\mu_h$ and $\mu_e$ are the hole and electron mobility, respectively.
FIG. 15(d) shows the Isd–Vsd characteristics of a WSe$_2$ FET as a function of different gate voltages from 0 to 60 V, according to an example embodiment.

FIG. 15(a) displays the optical microscopy image 1500 of an as-made WSe$_2$ FET device on highly p-doped silicon substrate with 300 nm SiO$_2$, where 20 nm Ti/50 nm Au was deposited as metal contacts. Raman spectroscopy of exfoliated WSe$_2$ was implemented to estimate the layer number of the WSe$_2$ flakes as shown in FIG. 15(b). As revealed by previous studies [B35], $^1B_{2g}$ Raman mode at 310 cm$^{-1}$ does not exist in monolayer WSe$_2$ and only appears in multilayer and bulk WSe$_2$, which indicates the presence of additional interlayer interaction. For the E$^1_{2g}$ and A$_{1g}$ mode, the bilayer WSe$_2$ (curve 1501) exhibit the highest peak intensity, while the monolayer (curve 1502) presents the second highest intensity. Based on the Raman spectra shown in FIG. 15(b), the bilayer nature of WSe$_2$ flake was determined in the fabricated two-terminal back-gated FET devices.

FIG. 15(c) demonstrates the typical transfer characteristic (I$_{sd}$-V$_g$) of the as-fabricated WSe$_2$ FET devices in high vacuum conditions (10$^{-8}$ mbar). By applying the gate voltage ranging from −60 V to 60 V. The source-drain current under 1 V bias increased along both negative and positive sweeping directions, corresponding to the hole and electron transport, respectively. This indicates a typical ambipolar transport behavior. The inset logarithmic plot shows the I$_{on}$/I$_{off}$ ratio as large as ~10$^7$, in good agreement with previous reports [B36,B37]. The threshold voltage V$_{th}$ of the ambipolar device was determined to be ~42 V for holes and ~−47 V for electrons, extracted from the linear extrapolation of current onset in the linear region of hole and electron side, respectively (FIG. 15(c)). On the basis of the transfer plot, the carrier concentration induced by a gate voltage V$_g$ in the linear region was estimated by the formula below:

$$n = -\frac{C_i(V_g - V_{th})}{e} \tag{4}$$

where C$_i$ is the capacitance per unit area between WSe$_2$ and back gate given by C$_i$=ε$_0$ε$_r$/d, and ε$_r$, d are the dielectric constant and thickness of SiO$_2$, respectively. Similarly, the field-effect mobility of WSe$_2$ flake can be evaluated via the equation:

$$\mu = \frac{L}{WC_iV_{sd}} \frac{dI_{sd}}{dV_g} \tag{5}$$

where dI$_{sd}$/dV$_g$ represents the maximum slope extracted from the linear region of transfer characteristic, L and W are the length and width of conduction channel, respectively. For the device illustrated in FIG. 15(c), the hole and electron mobility were calculated to be 4.31 and 3.97 cm$^2$V$^{-1}$s$^{-1}$, respectively. The source-drain current versus source-drain voltage (I$_{sd}$-V$_{sd}$) characteristics of the same device under different gate voltages (curves 1511-1514) are shown in FIG. 15(d). Excellent linearity with V$_{sd}$ ranging from −100 mW to 100 mV suggests the good contact between metal electrodes and WSe$_2$ flake.

In situ vacuum optoelectronic characterization system according to an example embodiment, used in example 6

In order to explore the surface functionalization of Cs$_2$CO$_3$ on tuning the electronic and optoelectronic properties of WSe$_2$, Cs$_2$CO$_3$ was thermally evaporated onto the fabricated devices for in situ characterizations in an in situ high vacuum optoelectronic characterization system, as described above with reference to FIGS. 1 and 2. All measurements were performed in a high vacuum condition (~10$^{-8}$ mbar). The device can be easily loaded onto the sample stage through a flexible fast entry door. After several hours' pumping, the sample was pulled back to a particular position for in situ deposition, where a thermal effusion cell was equipped to evaporate Cs$_2$CO$_3$. A quartz crystal microbalance (QCM) can be placed in front of the sample stage to precisely monitor the deposition rate. After the surface modification, the sample was pushed towards the quartz viewport for light illumination. An optical microscopy setup configured with long working distance objectives was utilized for the fine focusing of incident laser beams outside the vacuum. Electrical measurements, in situ surface modification via thermal evaporation, and fine focused light illumination are advantageously incorporated in a single high vacuum system according to example embodiments for air-eliminated interfacial investigations on functional devices under well-controlled environment.

Figure 16:
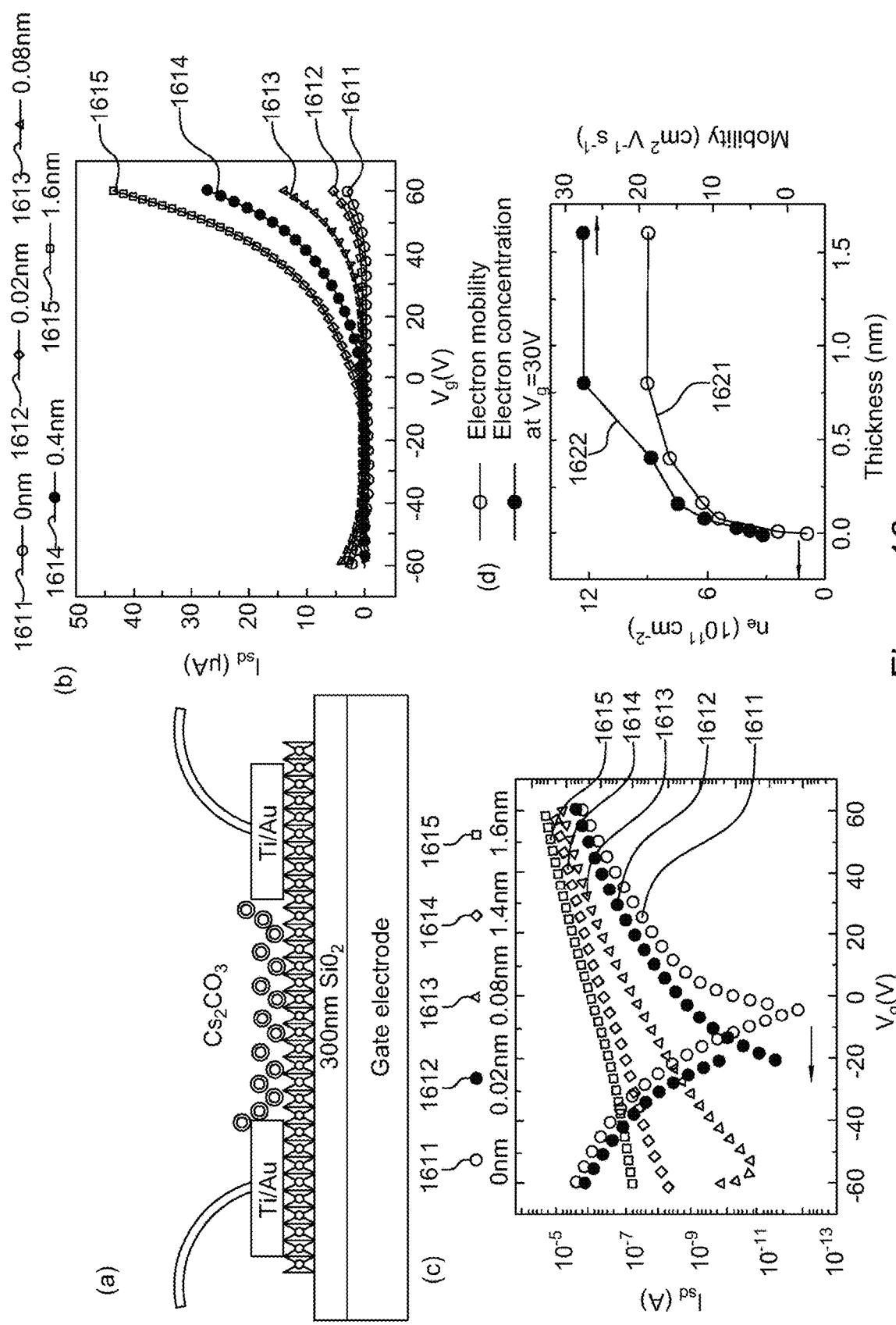
FIG. 16(a) shows a schematic illustration of the Cs$_2$CO$_3$-modified WSe$_2$ FET, according to an example embodiment.
FIG. 16(b) shows forward transfer characteristics ($V_g$ from −60 V to 60 V) evolution of a WSe$_2$ FET measured at $V_{sd}$=1 V in linear scale with increasing Cs$_2$CO$_3$ thickness from 0 to 1.6 nm, according to an example embodiment.
FIG. 16(c) shows forward transfer characteristics ($V_g$ from −60 V to 60 V) evolution of a WSe$_2$ FET measured at $V_{sd}$=1 V logarithmic scale with increasing Cs$_2$CO$_3$ thickness from 0 to 1.6 nm, according to an example embodiment.
FIG. 16(d) shows the electron concentration ($n_e$) at $V_g$=50 V and mobility of WSe$_2$ versus Cs$_2$CO$_3$ thickness, according to an example embodiment. The electron mobility is remarkably increased by almost one order of magnitude with 1.6 nm Cs$_2$CO$_3$.

Surface transfer electron doping on WSe$_2$ devices by Cs$_2$CO$_3$ in example 6 Cs$_2$CO$_3$, as an efficient n-type doping material, has been widely utilized in organic electronics [B23-26] as well as 2D materials [B19-21] owing to its remarkable electron-donating property. FIGS. 16(b) and (c) demonstrate the typical forward transfer characteristics evolution (V$_g$ from −60 V to 60 V) of WSe$_2$ FETs 1600 (FIG. 16(a)) as a function of nominal Cs$_2$CO$_3$ thickness in linear and logarithmic scale, respectively. The pristine WSe$_2$ FET device presents a balanced ambipolar characteristic with a current minimum nearly located at −4 V, curve 1611. With the gradual deposition of Cs$_2$CO$_3$, the current minimum progressively moved to the negative gate voltage, reaching ~−60 V at 0.08 nm Cs$_2$CO$_3$ and rapidly exceeding the gate voltage compliance with further deposition, see curved 1612-1615. This indicates a significant n-type doping effect on Cs$_2$CO$_3$-modified WSe$_2$ FET, originating from the interfacial electron transfer from Cs$_2$CO$_3$ to WSe$_2$ due to their large work function difference. The greatly improved electron transport after doping mainly results from the following aspects: (1) reduced effective Schottky barrier between metal contacts and WSe$_2$ due to increased tunneling probability by narrowing the barrier; (2) increased electron concentration by electron transfer from Cs$_2$CO$_3$ to WSe$_2$; (3) enhanced electron mobility after Cs$_2$CO$_3$ modification. The calculated electron concentration, curve 1621, (V$_g$=50 V) and mobility, curve 1622, are plotted with respect to Cs$_2$CO$_3$ thickness in FIG. 16(d). The estimated electron concentration of WSe$_2$ at 50 V V$_g$ clearly increased from 9.6×10$^9$ cm$^{-2}$ to 9×10$^{10}$ cm$^{-2}$ with the gradual deposition of Cs$_2$CO$_3$. Unexpectedly, the Cs$_2$CO$_3$-modified WSe$_2$ device present almost one order of magnitude enhancement of electron mobility from 3.9 cm$^2$V$^{-1}$s$^{-1}$ to 27 cm$^2$V$^{-1}$s$^{-1}$ after 1.6 nm Cs$_2$CO$_3$ decoration, indicating a remarkably improved electron transport in the WSe$_2$ channel. It has been reported that the adsorbed oxygen atoms can induce high concentration of charge (electron) trapping sites in WSe$_2$ with chalcogen vacancies, hence limiting the mobility of undoped WSe$_2$ [B20,B38]. The n-type doping can effectively increase the electron concentration to fill these trapping sites as well as to effectively screen the trapped charges, resulting in the greatly enhanced electron mobility [B20]. Alternatively, the narrowing of Schottky barrier induced by the electron doping facilitates the electron transport in WSe$_2$, thus approaching to its intrinsic transport properties. The results reveal that Cs$_2$CO$_3$ can serve as an effective n-type surface dopant to largely improve the electron transport in WSe$_2$ devices.

Figure 17:
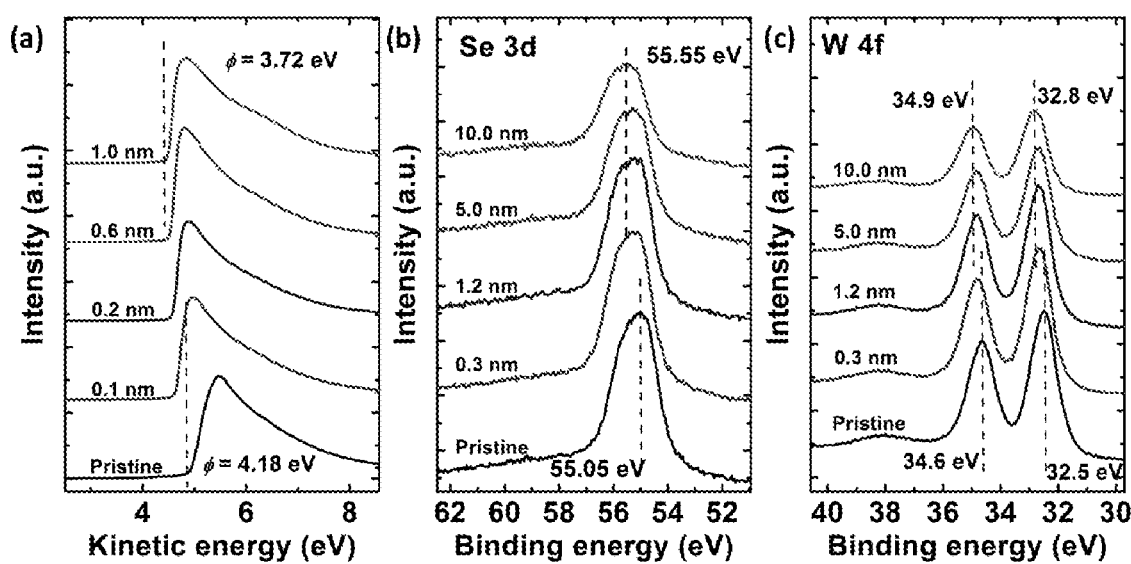
FIG. 17(a) shows UPS spectra evolution at lower kinetic energy region with increasing Cs$_2$CO$_3$ coverage.
FIG. 17(b) shows the XPS core level spectra of Se 3d5/2 as a function of Cs$_2$CO$_3$ thickness. The peaks largely shifted to the higher binding energy region, revealing the significant downward band bending
FIG. 17(c) shows W 4f5/2 and 4f7/2 as a function of Cs$_2$CO$_3$ thickness. The peaks largely shifted to the higher binding energy region, revealing the significant downward band bending.

To shed light on the interfacial charge transfer mechanism between Cs$_2$CO$_3$ and WSe$_2$, in situ UPS and XPS characterizations were carried out on Cs$_2$CO$_3$-modified bulk WSe$_2$. The evolution of the UPS spectra at the low kinetic energy region with respect to Cs$_2$CO$_3$ thickness is exhibited in FIG. 17(a). By linearly extrapolating the low kinetic energy onset in UPS spectra, the work function of natural bulk WSe$_2$ was measured to be 4.18 eV. After 1 nm Cs$_2$CO$_3$ deposition, the work function sharply decreased to 3.72 eV, originating from substantial interfacial electron transfer from Cs$_2$CO$_3$ to WSe$_2$. This significant charge transfer was also confirmed by the XPS core level spectra. FIGS. 17(b) and (c) show the Se 3d and W 4f core levels, respectively, evolved with the deposition of Cs$_2$CO$_3$. After 10 nm Cs$_2$CO$_3$ deposition, Se 3d and W 4f core level largely shifted to the higher binding energy by 0.5 eV and 0.3 eV, respectively. This reveals the significant downwards band bending in Cs$_2$CO$_3$-modified WSe$_2$, resulting from the increase of electron concentration thus making the Fermi level move closer to the conduction band of WSe$_2$.

Cs$_2$CO$_3$-functionalized WSe$_2$ phototransistors in example 6

Figure 18:
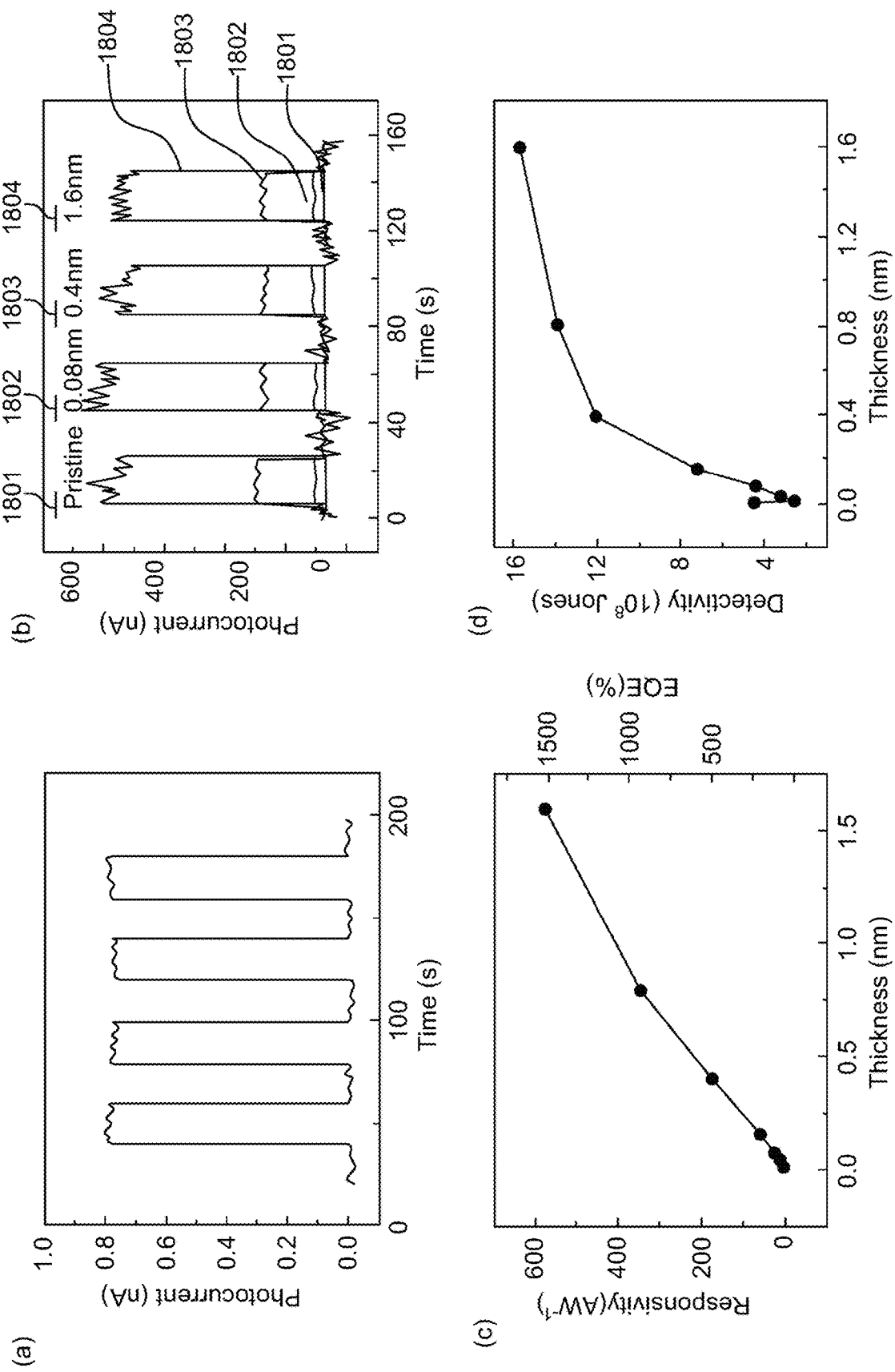
FIG. 18(a) shows the time-dependent photoresponse for WSe$_2$ phototransistor before and after Cs$_2$CO$_3$ surface functionalization, specifically the time dependence of photocurrent measured at $V_{sd}$=1 V and $V_g$=0 V upon illumination of a 473 nm laser source with the power of 450 μW (spot diameter 2 mm) for pristine WSe$_2$ phototransistor, according to an example embodiment.
FIG. 18(b) shows the time dependence of photocurrent measured at $V_{sd}$=1 V and $V_g$=0 V upon illumination of a 473 nm laser source with the power of 450 μW (spot diameter 2 mm) for Cs$_2$CO$_3$-modified WSe$_2$ phototransistor, according to an example embodiment.
FIG. 18(c) shows the Calculated photoresponsivity and EQE as a function of Cs$_2$CO$_3$ thickness, according to an example embodiment.
FIG. 18(d) shows the calculated detectivity as a function of Cs$_2$CO$_3$ thickness, according to an example embodiment.
Figure 19:
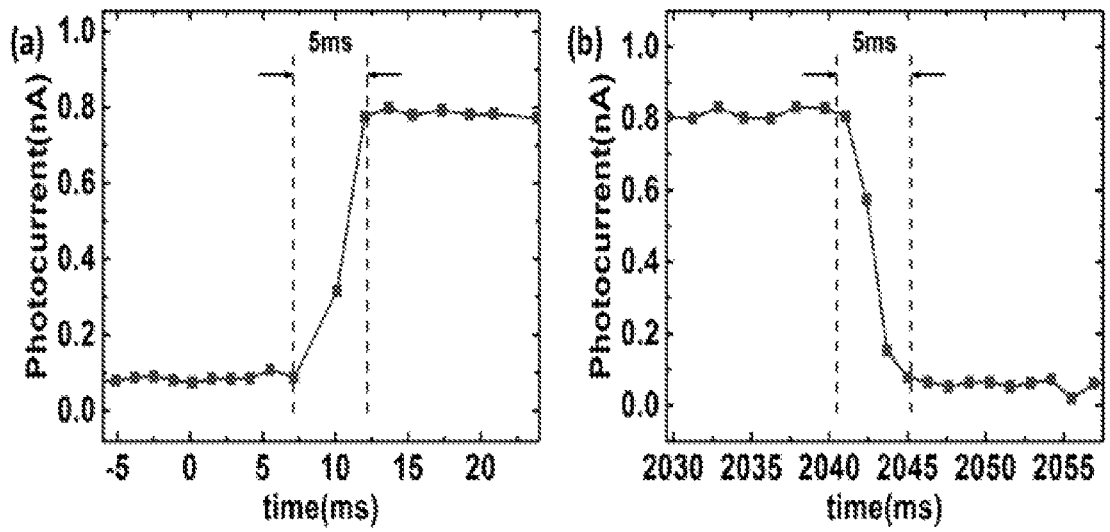
FIG. 19 shows the photoresponse time of WSe$_2$ phototransistor at $V_{sd}$=1 V and $V_g$=0 V, according to an example embodiment. The rising and decaying time is around 5 ms, exhibiting a fast photoresponse of WSe$_2$ device. After Cs$_2$CO$_3$ modification, this response time did not significantly change.
Figure 20:
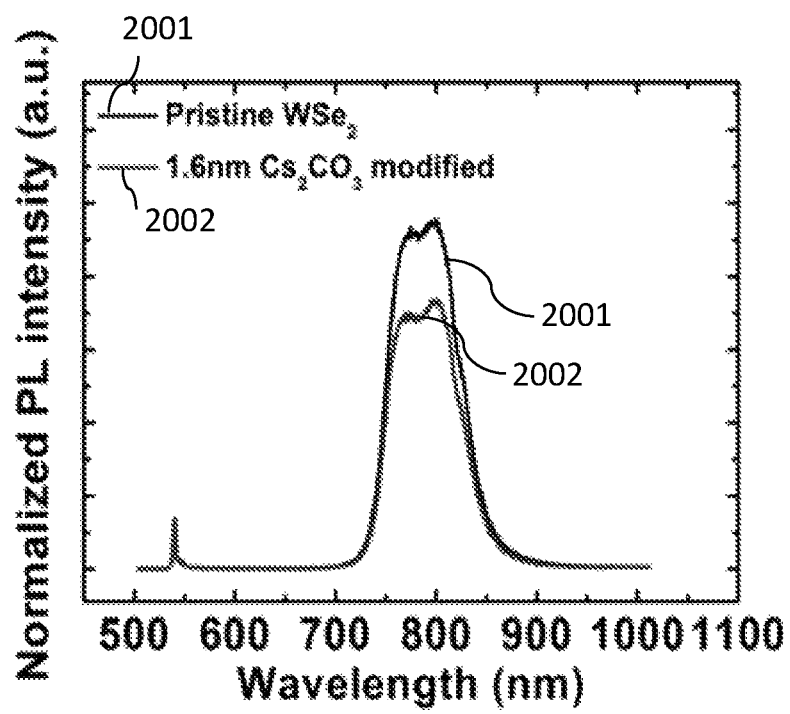
FIG. 20 shows the Photoluminescence (PL) measurements of Cs$_2$CO$_3$-modified WSe$_2$. After 1.6 nm Cs$_2$CO$_3$ modification, the intensity of WSe$_2$ PL spectrum clearly decreased, revealing the decrease of recombination probability of photo-induced electron-hole pairs.

Atomically thin TMDs with thickness-tunable bandgap have been predicted as promising candidates for the next generation optoelectronics. Using the system and methods according to example embodiment, the photodetecting performances of WSe$_2$ phototransistors functionalized by Cs$_2$CO$_3$ has been further investigated, which demonstrates a significant enhancement of device performance such as photo-responsivity and external quantum efficiency. In situ photoresponse measurements according to example embodiments were implemented under the illumination of a 473 nm laser with the light power of 455 µW (spot diameter 2 mm) immediately after the deposition of Cs$_2$CO$_3$ layers in high vacuum conditions. FIG. 18(a) exhibits the time-dependent photoresponse characteristics of pristine WSe$_2$ phototransistor at V$_{sd}$=1 V and V$_g$=0 V (nearly off state). The pristine WSe$_2$ device shows reproducible photocurrent of ~0.8 nA, while the photoresponse time is less than 5 ms (see FIG. 19). With the gradual deposition of Cs$_2$CO$_3$, the photocurrent was dramatically increased as shown in curves 1801-1804 in FIG. 18(b), e. g. by nearly three orders of magnitude from 0.8 nA to 0.5 µA after 1.6 nm Cs$_2$CO$_3$ decoration. Such great photoresponse enhancement is proposed to arise from two different effects: (1) reduction of effective Schottky barrier after doping improves the photodetecting performance of the WSe$_2$ FET devices; (2) surface modification decreases the recombination probability of photo-activated charge carriers. At zero gate voltage, the WSe$_2$ transistor is nearly in off state, and a non-negligible Schottky barrier exists between metal contact and WSe$_2$ flake. Upon the illumination on WSe$_2$ device with source-drain bias, the photo-generated charge carriers in the WSe$_2$ channel could undergo a thermally assisted tunneling process passing through the Schottky barrier to the metal electrode, which contributes to the photocurrent. After the Cs$_2$CO$_3$ modification, the Fermi level was dragged upwards to the conduction band of WSe$_2$, which narrows the energy barrier thus reducing the contact resistance. This significantly facilitates the transport of the photo-induced charge carriers penetrating the barrier to be collected by metal contacts, leading to the great photocurrent enhancement. Furthermore, the second effect was corroborated by the photoluminescence (PL) characterizations on Cs$_2$CO$_3$-doped WSe$_2$ flake (see curves 2001 and 2002 in FIG. 20). The PL intensity showed a clear decrease after the Cs$_2$CO$_3$ coating, which suggests the reduced recombination probability of photo-induced electron-hole pairs, hence contributing to the giant increase of photocurrent.

The photoresponsivity (R) and external quantum efficiency (EQE), as two critical parameters of phototransistor performance, were calculated and plotted as a function of dopant thickness in FIG. 18(c). R is defined as the photocurrent generated by per unit power of incident light on the effective area of a phototransistor; while EQE is the number of carriers circulating a phototransistor per absorbed photon and per unit time:

$$R = I_{ph}/PS \quad (6)$$

$$EQE = hcR/e\lambda \quad (7)$$

Where I$_{ph}$ is the photocurrent induced by the incident light, S is the effective area under illumination, P is the light intensity and λ is the wavelength of incident light, and h, c and e represent the Plank constant, velocity of light and the charge of electron respectively. After depositing 1.6 nm $Cs_2CO_3$, the responsivity of $WSe_2$ device was increased from 0.92 to 575 $AW^{-1}$; while the corresponding EQE was improved from 2.41% to 1500%, which demonstrates an outstanding performance enhancement for surface-functionalized $WSe_2$ phototransistors. Specific detectivity (D*) is another essential parameter to evaluate the quality of phototransistors, which is a measure of detector sensitivity and determines how weak the light signal could be identified from the noise environment. The shot noise from the dark current is assumed to be the major contributor to the total noise and the specific detectivity can be given by:

$$D^* = RA^{1/2}/(2qI_d)^{1/2} \quad (8)$$

where R is the photoresponsivity, A is the area of the detector, q is the unit of charge, and $I_d$ is the dark current. As shown in FIG. 18(d), the detectivity D* firstly shows a slight decrease from $4.45 \times 10^8$ Jones to $2.5 \times 10^8$ Jones at 0.01 nm $Cs_2CO_3$. This is mainly attributed to the sharp increase of dark current at the initial doping stage. With further $Cs_2CO_3$ deposition, the detectivity exhibits a gradual enhancement from $2.5 \times 10^8$ Jones to $1.57 \times 10^9$ Jones due to the comparable increase of photocurrent to that of dark current.

Using the system and methods according to example embodiments, a significant performance enhancement of $WSe_2$ phototransistors was clearly demonstrated, through in situ surface functionalization with $Cs_2CO_3$ overlayers. The electron mobility of $WSe_2$ was found to be remarkably enhanced by almost one order of magnitude after 1.6 nm $Cs_2CO_3$ modification. For the photodetecting performance of $Cs_2CO_3$-functionalized $WSe_2$ phototransistors, the photoresponsivity and EQE was dramatically increased by almost three orders with 1.6 nm $Cs_2CO_3$ decoration. The results promise a simple and controllable method to significantly electron dope $WSe_2$, thus effectively tailoring the electronic and optoelectronic properties of $WSe_2$ to realize the high performance $WSe_2$ based functional optoelectronic devices.

Sample preparation and device fabrication in example 6.

$WSe_2$ flakes were mechanically exfoliated from bulk $WSe_2$ crystals (hq-graphene) using a scotch tape and transferred onto degenerately p-type doped silicon wafers coated with 300 nm $SiO_2$. Exactly after locating the exfoliated $WSe_2$ flake by using high-resolution microscope (Nikon Eclipse LV100D), photoresist PMMA was immediately spin coated onto the sample to protect the flake from being degraded in the air ambient. The source and drain electrodes were precisely patterned on the flake using the conventional e-beam lithography technique, followed by thermal evaporation of Ti (20 nm) and Au (50 nm) as the metal contacts. After liftoff, the as-made devices were wire bonded onto a leaded chip carrier (LCC) and loaded in the custom-designed vacuum system (~$10^{-8}$ mbar) for in situ electrical measurements.

In situ device characterization according to example embodiments, used in example 6.

FET characterizations were carried out using an Agilent 2912A source measure unit at room temperature. $Cs_2CO_3$ was evaporated in situ from a Knudsen cell onto the devices in a high vacuum chamber. The nominal thickness of $Cs_2CO_3$ layers was calibrated by a quartz crystal microbalance exactly located in front of the sample stage. In situ photoresponse measurements according to example embodiments were also conducted right after the deposition of the surface modification layers under high vacuum condition. The sample was illuminated by a 473-nm laser with power of 455 μW (spot diameter 2.0 mm).

In situ UPS and XPS characterization in example 6.

In situ UPS and XPS measurements on $Cs_2CO_3$-coated bulk $WSe_2$ were carried out in an ultrahigh vacuum system ($10^{-10}$ mbar) with He I (21.2 eV) and Mg Kα (1,253.6 eV) as excitation sources, respectively. By applying a sample bias of 5 V, the sample work function was determined by the secondary electron cutoff at the low kinetic energy region. The nominal thickness of in situ deposited $Cs_2CO_3$ layers was calibrated by quartz crystal microbalance and further confirmed by atomic force microscope.

Figure 21:
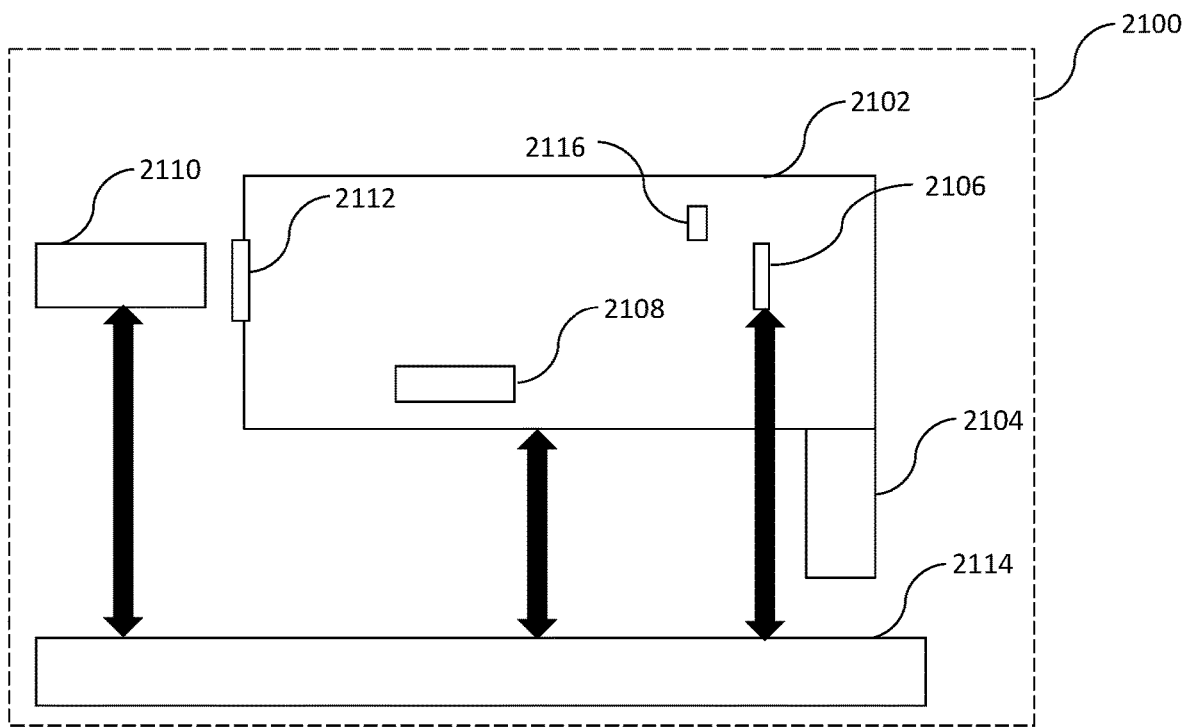
FIG. 21 shows a schematic diagram illustrating a system for in-situ characterization of functional devices, according to an example embodiment.

FIG. 21 shows a schematic diagram illustrating a system 2100 for in-situ characterization of functional devices, according to an example embodiment. The system 2100 comprises a vacuum chamber 2102; a pump system 2104 coupled to the vacuum chamber 2102 for evacuation the vacuum chamber 2102 to near ultra high vacuum pressures of about $10^{-8}$ mbar or lower; a sample holder 2106 for a functional device based on nanostructured materials disposed inside the vacuum chamber 2102 and configured to provide electrical connection to the functional device for measuring electrical properties of the functional device; and a source system 2108 for exposing a surface/interface of the functional device to a modification species; whereby the system 2100 is configured to measure the electrical properties of the functional device in-situ upon the exposure to the modification species.

The system 2100 may comprise an optical microscope system 2110 external to the vacuum chamber 2102 and configured to illuminate the surface/interface of the functional device when disposed on the sample holder 2106 in the vacuum chamber 2102, whereby the system 2100 is configured to measure optoelectrical properties of the functional device in-situ upon the illumination.

The vacuum chamber 2102 may comprise a view port 2112, and the microscope system 2110 is configured to illuminate the surface/interface of the functional device when disposed on the sample holder 2106 in the vacuum chamber 2102 through the view port 2112.

The sample holder 2106 may be moveable to position the functional device in a fine focus position for the illumination of the surface/interface of the functional device.

The system may comprise a vibration reduction or elimination mechanism 2114 coupled to the vacuum chamber 2102, the optical microscope system 2110 and the sample holder 2106.

The source system 2108 may comprise one or more of an evaporation cell for evaporating various materials inside the vacuum chamber and a gas-inlet for introducing various gases into the vacuum chamber.

The evaporation cell may be configured to direct the evaporated material towards the surface/interface of the functional device when the sample holder 2106 is in a deposition position.

The evaporation cell may be configured to direct the evaporated material towards the surface/interface of the functional device when the sample holder 2106 is in a deposition position at a non-zero angle relative to an optical axis of the microscope system 2110.

The system 2100 may comprise an evaporation rate measurement mechanism 2116 disposed inside the vacuum chamber 2102 to monitor the evaporation rate of the evaporation cell.

The evaporation cell may comprise a molecular beam epitaxy, MBE, source.

Figure 22:
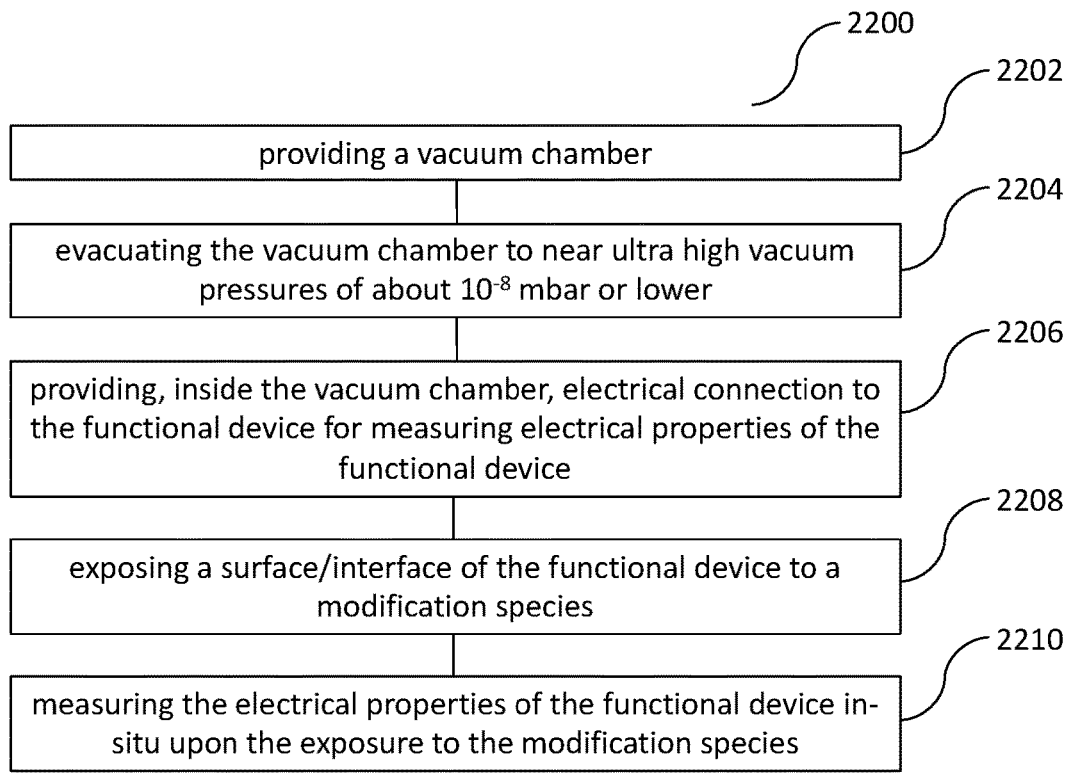
FIG. 22 shows a flow chart illustrating a method of in-situ characterization of functional devices, according to an example embodiment.

FIG. 22 shows a flow chart 2200 illustrating a method of in-situ characterization of functional devices, according to an example embodiment. At step 2202, a vacuum chamber is provided. At step 2204, the vacuum chamber is evacuated to near ultra high vacuum pressures of about $10^{-8}$ mbar or lower. At step 2206, electrical connection is provided, inside the vacuum chamber, to the functional device for measuring electrical properties of the functional device. At step 2208, exposing a surface/interface of the functional device is exposed to a modification species. At step 2210, the electrical properties of the functional device are measured in-situ upon the exposure to the modification species.

The method may comprise providing an optical microscope system external to the vacuum chamber and illuminate the surface/interface of the functional device when disposed inside the vacuum chamber, and measuring optoelectrical properties of the functional device in-situ upon the illumination.

The method may comprise illuminating the surface/interface of the functional device when disposed in the vacuum chamber through a view port.

The method may comprise moving the functional device in the vacuum chamber to position the functional device in a fine focus position for the illumination of the surface/interface of the functional device.

The method may comprise coupling a vibration reduction or elimination mechanism to the vacuum chamber, the optical microscope system and the functional device.

The method may comprise using one or more of an evaporation cell for evaporating various materials inside the vacuum chamber and a gas-inlet for introducing various gases into the vacuum chamber.

The method may comprise configuring the evaporation cell to direct the evaporated material towards the surface/interface of the functional device when the functional device is in a deposition position.

The method may comprise configuring the evaporation cell to direct the evaporated material towards the surface/interface of the functional device when the functional device is in a deposition position at a non-zero angle relative to an optical axis of the microscope system.

The method may comprise monitoring the evaporation rate of the evaporation cell.

The evaporation cell may comprise a molecular beam epitaxy, MBE, source.

In summary, systems and methods according to example embodiments for in situ vacuum optoelectronic characterization of surface/interface engineered functional devices have been described.

Embodiments of the present invention can have one or more of the following features and associated benefits/advantages:

| Feature | Benefit/Advantage |
|---|---|
| Low noise electrical measurements in near ultra-high vacuum conditions | Near ultra-high vacuum conditions (~$10^{-8}$ mbar) are rarely achieved in current commercial vacuum electrical measurement system, especially for such easy sample loading and pumping configurations. In our system, the UHV condition is achieved for the thermal evaporation for MBE growth, as well as the low noise electrical measurements on devices. |
| In situ thermal evaporation of various materials | Combination of the electrical transport measurements with molecule beam epitaxy (MBE) technique, which is a unique feature that is not found in current commercial vacuum electrical characterization systems. In situ evaporation of materials onto devices in the vacuum can ensure a clean interface between materials and underlying devices, thus eliminating the influence of air molecules during this process. |
| Fine focusing of light beams for illumination | Incorporating the fine focused light beam into an in situ characterization system, with features such as linear movement of sample stage and use of long working distance objectives, preferably taking the vibration level of the whole system into account. Such fine focusing of light beam can not only remarkably enhance the power intensity of incident light, but also confine the light beam to a tiny spot for selective illumination on particular areas. |

Embodiments of the present invention advantageously integrates vacuum electrical measurements with in situ MBE deposition. Embodiments of the present invention can provide a relatively low production cost and straightforward assembly procedure for incorporating various functions in a single vacuum system, compared to existing characterization systems.

The above description of illustrated embodiments of the systems and methods is not intended to be exhaustive or to limit the systems and methods to the precise forms disclosed. While specific embodiments of, and examples for, the systems components and methods are described herein for illustrative purposes, various equivalent modifications are possible within the scope of the systems, components and methods, as those skilled in the relevant art will recognize. The teachings of the systems and methods provided herein can be applied to other processing systems and methods, not only for the systems and methods described above.

The elements and acts of the various embodiments described above can be combined to provide further embodiments. These and other changes can be made to the systems and methods in light of the above detailed description.

In general, in the following claims, the terms used should not be construed to limit the systems and methods to the specific embodiments disclosed in the specification and the claims, but should be construed to include all processing systems that operate under the claims. Accordingly, the systems and methods are not limited by the disclosure, but instead the scope of the systems and methods is to be determined entirely by the claims.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

REFERENCES

1. Novoselov K S, et al. Electric Field Effect in Atomically Thin Carbon Films. *Science* 306, 666-669 (2004).

2. Geim A K, Novoselov K S. The rise of graphene. *Nat Mater* 6, 183-191 (2007).
3. Wang Q H, Kalantar-Zadeh K, Kis A, Coleman J N, Strano M S. Electronics and optoelectronics of two-dimensional transition metal dichalcogenides. *Nat Nano* 7, 699-712 (2012).
4. Mayorov A S, et al. Micrometer-Scale Ballistic Transport in Encapsulated Graphene at Room Temperature. *Nano Letters* 11, 2396-2399 (2011).
5. Castro Neto A H, Guinea F, Peres N M R, Novoselov K S, Geim A K. The electronic properties of graphene. *Reviews of Modern Physics* 81, 109-162 (2009).
6. Li L, et al. Black phosphorus field-effect transistors. *Nat Nano* 9, 372-377 (2014).
7. Ling X, Wang H, Huang S, Xia F, Dresselhaus M S. The renaissance of black phosphorus. *Proceedings of the National Academy of Sciences* 112, 4523-4530 (2015).
8. Liu H, Du Y, Deng Y, Ye P D. Semiconducting black phosphorus: synthesis, transport properties and electronic applications. *Chemical Society Reviews* 44, 2732-2743 (2015).
9. Li L, et al. Quantum Hall effect in black phosphorus two-dimensional electron system. *Nat Nano* 11, 593-597 (2016).
10. Tran V, Soklaski R, Liang Y, Yang L. Layer-controlled band gap and anisotropic excitons in few-layer black phosphorus. *Physical Review B* 89, 235319 (2014).
11. Li L, et al. Direct observation of the layer-dependent electronic structure in phosphorene. *Nat Nano* 12, 21-25 (2017).
12. Zhang S, et al. Extraordinary Photoluminescence and Strong Temperature/Angle-Dependent Raman Responses in Few-Layer Phosphorene. *ACS Nano* 8, 9590-9596 (2014).
13. The Atomic Distribution in Red and Black Phosphorus and the Crystal Structure of Black Phosphorus. *The Journal of Chemical Physics* 3, 351-355 (1935).
14. Brown A, Rundqvist S. Refinement of the crystal structure of black phosphorus. *Acta Crystallographica* 19, 684-685 (1965).
15. Zhang C D, et al. Surface Structures of Black Phosphorus Investigated with Scanning Tunneling Microscopy. *The Journal of Physical Chemistry C* 113, 18823-18826 (2009).
16. Xia F, Wang H, Jia Y. Rediscovering black phosphorus as an anisotropic layered material for optoelectronics and electronics. *Nature Communications* 5, 4458 (2014).
17. Wang X, et al. Highly anisotropic and robust excitons in monolayer black phosphorus. *Nat Nano* 10, 517-521 (2015).
18. Wu J, et al. Colossal Ultraviolet Photoresponsivity of Few-Layer Black Phosphorus. *ACS Nano* 9, 8070-8077 (2015).
19. Yuan H, et al. Polarization-sensitive broadband photodetector using a black phosphorus vertical p-n junction. *Nat Nano* 10, 707-713 (2015).
20. Huang M, et al. Broadband Black-Phosphorus Photodetectors with High Responsivity. *Advanced Materials* 28, 3481-3485 (2016).
21. Cheng H, et al. Oxygen induced strong mobility modulation in few-layer black phosphorus. *2D Materials* 4, 021007 (2017).
22. Du Y, Liu H, Deng Y, Ye P D. Device Perspective for Black Phosphorus Field-Effect Transistors: Contact Resistance, Ambipolar Behavior, and Scaling. *ACS Nano* 8, 10035-10042 (2014).
23. Das S, Demarteau M, Roelofs A. Ambipolar Phosphorene Field Effect Transistor. *ACS Nano* 8, 11730-11738 (2014).
24. Perello D J, Chae S H, Song S, Lee Y H. High-performance n-type black phosphorus transistors with type control via thickness and contact-metal engineering. *Nature Communications* 6, 7809 (2015).
25. Suh J, et al. Doping against the Native Propensity of MoS2: Degenerate Hole Doping by Cation Substitution. *Nano Letters* 14, 6976-6982 (2014).
26. p-type doping of MoS2 thin films using Nb. *Applied Physics Letters* 104, 092104 (2014).
27. Williams J R, DiCarlo L, Marcus C M. Quantum Hall Effect in a Gate-Controlled <em>p-n</em> Junction of Graphene. *Science* 317, 638 (2007).
28. Ross J S, et al. Electrically tunable excitonic light-emitting diodes based on monolayer $WSe_2$ p-n junctions. *Nat Nano* 9, 268-272 (2014).
29. Buscema M, Groenendijk D J, Steele G A, van der Zant H S J, Castellanos-Gomez A. Photovoltaic effect in few-layer black phosphorus PN junctions defined by local electrostatic gating. *Nature Communications* 5, 4651 (2014).
30. Xiang D, et al. Surface transfer doping induced effective modulation on ambipolar characteristics of few-layer black phosphorus. *Nature Communications* 6, 6485 (2015).
31. Ryder C R, et al. Covalent functionalization and passivation of exfoliated black phosphorus via aryl diazonium chemistry. *Nat Chem* 8, 597-602 (2016).
32. Abelian G, et al. Noncovalent Functionalization of Black Phosphorus. *Angewandte Chemie* 128, 14777-14782 (2016).
33. Koenig S P, et al. Electron Doping of Ultrathin Black Phosphorus with Cu Adatoms. *Nano Letters* 16, 2145-2151 (2016).
34. Liu Y, Cai Y, Zhang G, Zhang Y-W, Ang K-W. Al-Doped Black Phosphorus p-n Homojunction Diode for High Performance Photovoltaic. *Advanced Functional Materials*, 1604638-n/a (2017).
35. Wang G, et al. Introduction of Interfacial Charges to Black Phosphorus for a Family of Planar Devices. *Nano Letters* 16, 6870-6878 (2016).
36. Chen J H, Jang C, Adam S, Fuhrer M S, Williams E D, Ishigami M. Charged-impurity scattering in graphene. *Nat Phys* 4, 377-381 (2008).
37. Fang H, et al. Degenerate n-Doping of Few-Layer Transition Metal Dichalcogenides by Potassium. *Nano Letters* 13, 1991-1995 (2013).
38. Kim J, et al. Observation of tunable band gap and anisotropic Dirac semimetal state in black phosphorus. *Science* 349, 723 (2015).
39. Joshua O I, Gary A S, Herre SJvdZ, Andres C-G. Environmental instability of few-layer black phosphorus. *2D Materials* 2, 011002 (2015).
40. Wood J D, et al. Effective Passivation of Exfoliated Black Phosphorus Transistors against Ambient Degradation. *Nano Letters* 14, 6964-6970 (2014).
41. Chu T, Ilatikhameneh H, Klimeck G, Rahman R, Chen Z. Electrically Tunable Bandgaps in Bilayer MoS2. *Nano Letters* 15, 8000-8007 (2015).
42. Surface transfer hole doping of epitaxial graphene using MoO3 thin film. *Applied Physics Letters* 96, 213104 (2010).

43. Chen W, Chen S, Qi D C, Gao X Y, Wee A T S. Surface Transfer p-Type Doping of Epitaxial Graphene. *Journal of the American Chemical Society* 129, 10418-10422 (2007).

A1 K. S. Novoselov, A. K. Geim, S. V. Morozov, D. Jiang, Y. Zhang, S. V. Dubonos, I. V. Grigorieva and A. A. Firsov, Science, 2004, 306, 666.

A2 A. K. Geim and K. S. Novoselov, Nat. Mater., 2007, 6, 183.

A3 Q. H. Wang, K. Kalantar-Zadeh, A. Kis, J. N. Coleman and M. S. Strano, Nat. Nanotechnol., 2012, 7, 699.

A4 X. Ling, H. Wang, S. Huang, F. Xia and M. S. Dresselhaus, Proc. Natl. Acad. Sci., 2015, 112, 4523.

A5 H. Liu, Y. Du, Y. Deng and P. D. Ye, Chem. Soc. Rev., 2015, 44, 2732.

A6 H. Du, X. Lin, Z. Xu and D. Chu, J. Mater. Chem. C, 2015, 3, 8760.

A7 R. Hultgren, N. S. Gingrich and B. E. Warren, J. Chem. Phys., 1935, 3, 351.

A8 A. Brown and S. Rundqvist, Acta Crystallogr., 1965, 19, 684.

A9 C. D. Zhang, J. C. Lian, W. Yi, Y. H. Jiang, L. W. Liu, H. Hu, W. D. Xiao, S. X. Du, L. L. Sun and H. J. Gao, J. Phys. Chem. C, 2009, 113, 18823.

A10 V. Tran, R. Soklaski, Y. Liang and L. Yang, Phys. Rev. B, 2014, 89, 235319.

A11 S. Zhang, J. Yang, R. Xu, F. Wang, W. Li, M. Ghufran, Y.-W. Zhang, Z. Yu, G. Zhang, Q. Qin and Y. Lu, ACS Nano, 2014, 8, 9590.

A12 X. Wang, A. M. Jones, K. L. Seyler, V. Tran, Y. Jia, H. Zhao, H. Wang, L. Yang, X. Xu and F. Xia, Nat. Nanotechnol., 2015, 10, 517.

A13 F. Xia, H. Wang and Y. Jia, Nat. Commun., 2014, 5, 4458.

A14 L. Li, Y. Yu, G. J. Ye, Q. Ge, X. Ou, H. Wu, D. Feng, X. H. Chen and Y. Zhang, Nat. Nanotechnol., 2014, 9, 372.

A15 H. Liu, A. T. Neal, Z. Zhu, Z. Luo, X. Xu, D. Tomanek and P. D. Ye, ACS Nano, 2014, 8, 4033.

A16 S. P. Koenig, R. A. Doganov, H. Schmidt, A. H. Castro Neto and B. Özyilmaz, Appl. Phys. Lett., 2014, 104, 103106.

A17 L. Li, G. J. Ye, V. Tran, R. Fei, G. Chen, H. Wang, J. Wang, K. Watanabe, T. Taniguchi, L. Yang, X. H. Chen and Y. Zhang, Nat. Nanotechnol., 2015, 10, 608.

A18 Y. Du, H. Liu, Y. Deng and P. D. Ye, ACS Nano, 2014, 8, 10035.

A19 S. Das, M. Demarteau and A. Roelofs, ACS Nano, 2014, 8, 11730.

A20 D. Xiang, C. Han, J. Wu, S. Zhong, Y. Liu, J. Lin, X.-A. Zhang, W. Ping Hu, B. Özyilmaz, A. H. C. Neto, A. T. S. Wee and W. Chen, Nat. Commun., 2015, 6, 6485.

A21 R. A. Doganov, E. C. T. O/'Farrell, S. P. Koenig, Y. Yeo, A. Ziletti, A. Carvalho, D. K. Campbell, D. F. Coker, K. Watanabe, T. Taniguchi, A. H. C. Neto and B. Ozyilmaz, Nat. Commun., 2015, 6, 6647.

A22 A. Favron, E. Gaufres, F. Fossard, A.-L. Phaneuf-Lheureux, N. Y. W. Tang, P. L. Levesque, A. Loiseau, R. Leonelli, S. Francoeur and R. Martel, Nat. Mater., 2015, 14, 826.

A23 S. Sugai and I. Shirotani, Solid State Commun., 1985, 53, 753.

A24 K. L. Utt, P. Rivero, M. Mehboudi, E. O. Harriss, M. F. Borunda, A. A. Pacheco SanJuan and S. Barraza-Lopez, ACS Cent. Sci., 2015, 1, 320.

A25 A. Ziletti, A. Carvalho, D. K. Campbell, D. F. Coker and A. H. Castro Neto, Phys. Rev. Lett., 2015, 114, 046801.

A26 J. D. Wood, S. A. Wells, D. Jariwala, K.-S. Chen, E. Cho, V. K. Sangwan, X. Liu, L. J. Lauhon, T. J. Marks and M. C. Hersam, Nano Lett., 2014, 14, 6964.

A27 N. B. Goodman, L. Ley and D. W. Bullett, Phys. Rev. B, 1983, 27, 7440.

A28 Y. Harada, K. Murano, I. Shirotani, T. Takahashi and Y. Maruyama, Solid State Commun., 1982, 44, 877.

A29 J. Brunner, M. Thüler, S. Veprek and R. Wild, J. Phys. Chem. Solids, 1979, 40, 967.

A30 N. Ryusuke, I. Hiroshi, M. Yusuke and N. Shogo, Jpn. J. Appl. Phys., 1978, 17, 321.

A31 P. Giannozzi, R. Car and G. Scoles, J. Chem. Phys., 2003, 118, 1003.

A32 D. Sánchez-Portal, P. Ordejon, E. Artacho and J. M. Soler, Int. J. Quantum Chem., 1997, 65, 453-461.

A33 E. Artacho, D. Sánchez-Portal, P. Ordejon, A. Garcia and J. M. Soler, Phys. Stat. Solidi, 1999, 215, 809-817.

A34 J. Perdew, K. Burke and M. Ernzerhof, Phys. Rev. Lett., 1996, 77, 3865-3868.

A35 N. Troullier and J. Martins, Phys. Rev. B, 1991, 43, 1993-2006.

A36 L. Kleinman and D. Bylander, Phys. Rev. Lett., 1982, 48, 1425-1428.

A37 O. Sankey and D. Niklewski, Phys. Rev. B, 1989, 40, 3979-3995.

A38 O. Sankey, D. Niklewski, D. Drabold and J. Dow, Phys. Rev. B, 1990, 41, 750-759.

A39 H. Monkhorst and J. Pack, Phys. Rev. B, 1976, 13, 5188-5192.

[B1] Geim, A. K.; Novoselov, K. S. The rise of graphene. *Nat. Mater.* 2007, 6, 183-191.

[B2] Tian, H.; Chin, M. L.; Najmaei, S.; Guo, Q.; Xia, F.; Wang, H.; Dubey, M. Optoelectronic devices based on two-dimensional transition metal dichalcogenides. *Nano Res.* 2016, 9, 1543-1560.

[B3] Xu, Y.; Cheng, C.; Du, S.; Yang, J.; Yu, B.; Luo, J.; Yin, W.; Li, E.; Dong, S.; Ye, P.; Duan, X. Contacts between two- and three-dimensional materials: ohmic, schottky, and p-n heterojunctions. *ACS Nano* 2016, 10, 4895-4919.

[B4] Song, X.; Hu, J.; Zeng, H. Two-dimensional semiconductors: recent progress and future perspectives. *J. Mater. Chem. C* 2013, 1, 2952.

[B5] Zhang, X.; Qiao, X. F.; Shi, W.; Wu, J. B.; Jiang, D. S.; Tan, P. H. Phonon and Raman scattering of two-dimensional transition metal dichalcogenides from monolayer, multilayer to bulk material. *Chem. Soc. Rev.* 2015, 44, 2757-2785.

[B6] Allain, A.; Kang, J.; Banerjee, K.; Kis, A. Electrical contacts to two-dimensional semiconductors. *Nat. Mater.* 2015, 14, 1195-1205.

[B7] Wang, Q. H.; Kalantar-Zadeh, K.; Kis, A.; Coleman, J. N.; Strano, M. S. Electronics and optoelectronics of two-dimensional transition metal dichalcogenides. *Nat. Nanotechnol.* 2012, 7, 699-712.

[B8] Xia, F.; Wang, H.; Xiao, D.; Dubey, M.; Ramasubramaniam, A. Two-dimensional material nanophotonics. *Nat. Photonics* 2014, 8, 899-907.

[B9] Kim, S.; Konar, A.; Hwang, W. S.; Lee, J. H.; Lee, J.; Yang, J.; Jung, C.; Kim, H.; Yoo, J. B.; Choi, J. Y.; Jin, Y. W.; Lee, S. Y.; Jena, D.; Choi, W.; Kim, K. High-mobility and low-power thin-film transistors based on multilayer $MoS_2$ crystals. *Nat. Commun.* 2012, 3, 1011.

[B10] Allain, A.; Kis, A. Electron and hole mobilities in single-layer $WSe_2$. *ACS nano* 2014, 8, 7180-7185.

[B11] Zhao, W.; Ghorannevis, Z.; Chu, L.; Toh, M.; Kloc, C.; Tan, P.-H.; Eda, G. Evolution of electronic structure in atomically thin sheets of WS$_2$ and WSe$_2$. *ACS nano* 2012, 7, 791-797.

[B12] Radisavljevic, B.; Radenovic, A.; Brivio, J.; Giacometti, i. V.; Kis, A. Single-layer MoS$_2$ transistors. *Nat. Nanotechnol.* 2011, 6, 147-150.

[B13] Liu, W.; Kang, J.; Sarkar, D.; Khatami, Y.; Jena, D.; Banerjee, K. Role of metal contacts in designing high-performance monolayer n-type WSe$_2$ field effect transistors. *Nano lett.* 2013, 13, 1983-1990.

[B14] Zhang, W.; Chiu, M. H.;Chen, C. H.; Chen, W.; Li, L. J.; Wee, A. T. Role of metal contacts in high-performance phototransistors based on WSe$_2$ monolayers. *ACS Nano* 2014, 8, 8653-8661.

[B15] Zhou, C.; Zhao, Y.; Raju, S.; Wang, Y.; Lin, Z.; Chan, M.; Chai, Y. Carrier type control of WSe$_2$ field effect transistors by thickness modulation and MoO$_3$ layer doping. *Adv. Funct. Mater.* 2016.

[B16] Massicotte, M.; Schmidt, P.; Vialla, F.; Schadler, K. G.; Reserbat-Plantey, A.; Watanabe, K.; Taniguchi, T.; Tielrooij, K. J.; Koppens, F. H. Picosecond photoresponse in van der Waals heterostructures. *Nat. Nanotechnol.* 2016, 11, 42-46.

[B17] Baugher, B. W.; Churchill, H. O.; Yang, Y.; Jarillo-Herrero, P. Optoelectronic devices based on electrically tunable p-n diodes in a monolayer dichalcogenide. *Nat. Nanotechnol.* 2014, 9, 262-267.

[B18] Zhao, W.; Ghorannevis, Z.; Chu, L.; Toh, M.; Kloc, C.; Tan, P.-H.; Eda, G. Evolution of electronic structure in atomically thin sheets of WS$_2$ and WSe$_2$. *ACS nano* 2012, 7, 791-797.

[B19] Lin, J. D.; Han, C.; Wang, F.; Wang, R.; Xiang, D.; Qin, S.; Zhang, X.-A.; Wang, L.; Zhang, H.; Wee, A. T. S. Electron-doping-enhanced trion formation in monolayer molybdenum disulfide functionalized with cesium carbonate. *ACS nano* 2014, 8, 5323-5329.

[B20] Xiang, D.; Han, C.; Wu, J.; Zhong, S.; Liu, Y.; Lin, J.; Zhang, X. A.; Ping Hu, W.; Ozyilmaz, B.; Neto, A. H.; Wee, A. T.; Chen, W. Surface transfer doping induced effective modulation on ambipolar characteristics of few-layer black phosphorus. *Nat. Commun.* 2015, 6, 6485.

[B21] Han, C.; Lin, J.; Xiang, D.; Wang, C.; Wang, L.; Chen, W. Improving chemical vapor deposition graphene conductivity using molybdenum trioxide: An in-situ field effect transistor study. *Appl. Phys. Lett.* 2013, 103, 263117.

[B22] Wang, S.; Zhao, W.; Giustiniano, F.; Eda, G., Effect of oxygen and ozone on p-type doping of ultra-thin WSe$_2$ and MoSe$_2$ field effect transistors. *Phys. Chem. Chem. Phys.* 2016, 18 (6), 4304-4309.

[B23] Li, G.; Chu, C.; Shrotriya, V.; Huang, J.; Yang, Y. Efficient inverted polymer solar cells. *Appl. Phys. Lett.* 2006, 88, 253503-253503.

[B24] Wu, C.-I.; Lin, C.-T.; Chen, Y.-H.; Chen, M.-H.; Lu, Y.-J.; Wu, C.-C. Electronic structures and electron-injection mechanisms of cesium-carbonate-incorporated cathode structures for organic light-emitting devices. *Appl. Phys. Lett.* 2006, 88, 2104.

[B25] Huang, J.; Xu, Z.; Yang, Y. Low work function surface formed by solution processed and thermally deposited nanoscale layers of cesium carbonate. *Adv. Funct. Mater.* 2007, 17, 1966-1973.

[B26] Vaynzof, Y.; Kabra, D.; Chua, L. L.; Friend, R. H. Improved electron injection in poly (9,9'-dioctylfluorene)-co-benzothiodiazole via cesium carbonate by means of coannealing. *Appl. Phys. Lett.* 2011, 98, 3306.

[B7] Ross, J. S.; Klement, P.; Jones, A. M.; Ghimire, N. J.; Yan, J.; Mandrus, D. G.; Taniguchi, T.; Watanabe, K.; Kitamura, K.; Yao, W.; Cobden, D. H.; Xu, X. Electrically tunable excitonic light-emitting diodes based on monolayer WSe$_2$ p-n junctions. *Nat. Nanotechnol.* 2014, 9, 268-272.

[B28] Tosun, M.; Chan, L.; Amani, M.; Roy, T.; Ahn, G. H.; Taheri, P.; Carraro, C.; Ager, J. W.; Maboudian, R.; Javey, A. Air-stable n-doping of WSe$_2$ by anion vacancy formation with mild plasma treatment. *ACS Nano* 2016, 10, 6853-6860.

[B29] Fang, H.; Tosun, M.; Seol, G.; Chang, T. C.; Takei, K.; Guo, J.; Javey, A. Degenerate n-doping of few-layer transition metal dichalcogenides by potassium. *Nano Lett.* 2013, 13, 1991-1995.

[B30] Fang, H.; Chuang, S.; Chang, T. C.; Takei, K.; Takahashi, T.; Javey, A. High-performance single layered WSe$_2$ p-FETs with chemically doped contacts. *Nano Lett.* 2012, 12, 3788-3792.

[B31] Chen, C.-H.; Wu, C.-L.; Pu, J.; Chiu, M.-H.; Kumar, P.; Takenobu, T.; Li, L.-J. Hole mobility enhancement and p-doping in monolayer WSe2 by gold decoration. *2D Mater.* 2014, 1, 034001.

[B32] Jo, S. H.; Kang, D. H.; Shim, J.; Jeon, J.; Jeon, M. H.; Yoo, G.; Kim, J.; Lee, J.; Yeom, G. Y.; Lee, S.; Yu, H. Y.; Choi, C.; Park, J. H. A high-performance WSe$_2$/h-BN photodetector using a triphenylphosphine (PPh3)-based n-doping technique. *Adv. Mater.* 2016, 28, 4824-4831.

[B33] Kang, D.-H.; Shim, J.; Jang, S. K.; Jeon, J.; Jeon, M. H.; Yeom, G. Y.; Jung, W.-S.; Jang, Y. H.; Lee, S.; Park, J.-H. Controllable nondegenerate p-type doping of tungsten diselenide by octadecyltrichlorosilane. *ACS nano* 2015, 9, 1099-1107.

[B34] Kang, D.-H.; Kim, M.-S.; Shim, J.; Jeon, J.; Park, H.-Y.; Jung, W.-S.; Yu, H.-Y.; Pang, C.-H.; Lee, S.; Park, J.-H. High-performance transition metal dichalcogenide photodetectors enhanced by self-assembled monolayer doping. *Adv. Funct. Mater.* 2015, 25, 4219-4227.

[B35] Li, H.; Lu, G.; Wang, Y.; Yin, Z.; Cong, C.; He, Q.; Wang, L.; Ding, F.; Yu, T.; Zhang, H. Mechanical exfoliation and characterization of single- and few-layer nanosheets of WSe$_2$, TaS$_2$, and TaSe$_2$. *Small* 2013, 9, 1974-1981.

[B36] Huang, J.-K.; Pu, J.; Hsu, C.-L.; Chiu, M.-H.; Juang, Z.-Y.; Chang, Y.-H.; Chang, W.-H.; Iwasa, Y.; Takenobu, T.; Li, L.-J. Large-area synthesis of highly crystalline WSe$_2$ monolayers and device applications. *ACS nano* 2013, 8, 923-930.

[B37] Li, S.; Wang, S.; Tang, D.-M.; Zhao, W.; Xu, H.; Chu, L.; Bando, Y.; Golberg, D.; Eda, G. Halide-assisted atmospheric pressure growth of large WSe$_2$ and WS$_2$ monolayer crystals. *Appl. Mater. Today* 2015, 1, 60-66.

[B38] Liu, H.; Han, N.; Zhao, J. Atomistic insight into the oxidation of monolayer transition metal dichalcogenides: from structures to electronic properties. *RSC Advances* 2015, 5, 17572-17581.

We claim:

1. A system for in-situ characterization of functional devices comprising:
    a vacuum chamber;
    a pump system coupled to the vacuum chamber for evacuation the vacuum chamber to near ultra high vacuum pressures of about $10^{-8}$ mbar or lower;
    a sample holder for a functional device based on nanostructured materials disposed inside the vacuum chamber and configured to provide electrical connection to the functional device for measuring electrical properties of the functional device;

a source system for exposing a surface/interface of the functional device to a modification species;

whereby the system is configured to measure the electrical properties of the functional device in-situ upon the exposure to the modification species; and an optical microscope system external to the vacuum chamber and configured to illuminate the surface/interface of the functional device when disposed on the sample holder in the vacuum chamber;

wherein the sample holder is moveable to position the functional device for the illumination of the surface/interface of the functional device by the optical microscope system for measuring the optoelectrical properties of the functional device without the functional device leaving the vacuum chamber.

2. The system of claim 1, wherein the vacuum chamber comprises a view port, and the optical microscope system is configured to illuminate the surface/interface of the functional device when disposed on the sample holder in the vacuum chamber through the view port.

3. The system of claim 1, comprising a support structure configured to reduce or eliminate vibration coupled to the vacuum chamber, the optical microscope system and the sample holder.

4. The system of claim 1, wherein the source system comprises one or more of an evaporation cell for evaporating various materials inside the vacuum chamber and a gas-inlet for introducing various gases into the vacuum chamber.

5. The system of claim 4, wherein the evaporation cell is configured to direct the evaporated material towards the surface/interface of the functional device when the sample holder is in a deposition position.

6. The system of claim 5, wherein the deposition position is at a non-zero angle relative to an optical axis of the optical microscope system.

7. The system of claim 4, comprising an instrument configured to measure evaporation rate disposed inside the vacuum chamber to monitor the evaporation rate of the evaporation cell.

8. The system of claim 4, wherein the evaporation cell comprises a molecular beam epitaxy (MBE) source.

* * * * *